United States Patent
Ramasubramanian et al.

(10) Patent No.: US 12,045,541 B2
(45) Date of Patent: Jul. 23, 2024

(54) POWER MANAGEMENT AND DISTRIBUTED AUDIO PROCESSING TECHNIQUES FOR PLAYBACK DEVICES

(71) Applicant: Sonos, Inc., Santa Barbara, CA (US)

(72) Inventors: Rajasekaran Ramasubramanian, Ojai, CA (US); James M. Dolan, Chatham, MA (US); Allen Antony, Woburn, MA (US); Benjamin A. Tober, Somerville, MA (US); Mark S. Viscusi, Wrentham, MA (US)

(73) Assignee: Sonos, Inc., Santa Barbara, CA (US)

( * ) Notice: Subject to any disclaimer, the term of this patent is extended or adjusted under 35 U.S.C. 154(b) by 170 days.

(21) Appl. No.: 17/667,061

(22) Filed: Feb. 8, 2022

(65) Prior Publication Data
US 2022/0164162 A1 May 26, 2022

Related U.S. Application Data

(63) Continuation of application No. PCT/US2020/045465, filed on Aug. 7, 2020.
(Continued)

(51) Int. Cl.
*G06F 3/16* (2006.01)
*G06F 1/3287* (2019.01)
(Continued)

(52) U.S. Cl.
CPC ............ *G06F 3/165* (2013.01); *G06F 1/3287* (2013.01); *G06F 3/162* (2013.01); *G10L 15/22* (2013.01); *H03F 3/183* (2013.01); *H04L 12/12* (2013.01); *H04R 1/08* (2013.01); *H04R 1/1025* (2013.01); *H04R 1/1041* (2013.01); *H04R 3/12* (2013.01);
(Continued)

(58) Field of Classification Search
CPC ...... G06F 3/165; G06F 1/3293; G06F 1/3287; G06F 3/162; G06F 3/167; H03F 3/183; H03F 2200/03; G10L 15/22; G10L 2015/223; H04L 12/12; H04R 1/08; H04R 1/1025; H04R 1/1041; H04R 2201/01; H04R 2420/01; H04R 2420/05; H03R 3/12
See application file for complete search history.

(56) References Cited

U.S. PATENT DOCUMENTS 5,440,644 A  8/1995 Farinelli et al.
5,761,320 A  6/1998 Farinelli et al.
(Continued)

FOREIGN PATENT DOCUMENTS

| EP | 1389853 A1 | 2/2004 |
|---|---|---|
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.
(Continued)

*Primary Examiner* — Carolyn R Edwards
*Assistant Examiner* — Kuassi A Ganmavo
(74) *Attorney, Agent, or Firm* — Finch & Maloney PLLC

(57) ABSTRACT

Aspects of the present disclosure relate to power management techniques for reducing the power consumption of playback devices. Additionally, aspects of the present disclosure related to distributed processing techniques for processing audio across two or more processors.

21 Claims, 18 Drawing Sheets

Related U.S. Application Data

(60) Provisional application No. 62/884,966, filed on Aug. 9, 2019.

(51) Int. Cl.
*G10L 15/22* (2006.01)
*H03F 3/183* (2006.01)
*H04L 12/12* (2006.01)
*H04R 1/08* (2006.01)
*H04R 1/10* (2006.01)
*H04R 3/12* (2006.01)

(52) U.S. Cl.
CPC .... *G10L 2015/223* (2013.01); *H03F 2200/03* (2013.01); *H04R 2201/028* (2013.01); *H04R 2420/01* (2013.01); *H04R 2420/05* (2013.01); *H04R 2420/07* (2013.01)

(56) References Cited

U.S. PATENT DOCUMENTS

| | | |
|---|---|---|
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,483,853 B1 | 7/2013 | Lambourne |
| 8,942,252 B2 | 1/2015 | Balassanian et al. |
| 9,898,250 B1 | 2/2018 | Williams et al. |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty, Jr. |
| 2004/0024478 A1 | 2/2004 | Hans et al. |
| 2005/0117633 A1 | 6/2005 | Schmidt |
| 2007/0142944 A1 | 6/2007 | Goldberg et al. |
| 2008/0247344 A1* | 10/2008 | Bahl ............... H04W 74/085 370/310 |
| 2009/0070119 A1* | 3/2009 | Yoo ................ G10L 19/16 704/500 |
| 2009/0249103 A1* | 10/2009 | Jeyaseelan ........ G06F 1/3203 713/300 |
| 2011/0124375 A1* | 5/2011 | Stuivenwold ..... G06F 1/3293 455/574 |
| 2012/0245718 A1 | 9/2012 | Condit et al. |
| 2013/0128793 A1* | 5/2013 | Bahl ................ H04W 52/0209 370/311 |
| 2013/0131852 A1 | 5/2013 | Conroy et al. |
| 2013/0331970 A1 | 12/2013 | Beckhardt et al. |
| 2014/0192692 A1* | 7/2014 | Stark ............... H04B 1/406 370/311 |
| 2014/0201411 A1* | 7/2014 | Kumar .............. G06F 9/4418 710/262 |
| 2015/0074528 A1* | 3/2015 | Sakalowsky ....... G06F 3/04842 715/716 |
| 2015/0156717 A1* | 6/2015 | Narasimha ........ H04W 52/0209 370/311 |
| 2015/0163743 A1* | 6/2015 | Narasimha ........ H04W 52/0254 370/311 |
| 2016/0006778 A1* | 1/2016 | Beckhardt ........ H04L 12/18 370/328 |
| 2016/0119864 A1 | 4/2016 | Choi et al. |
| 2016/0174191 A1* | 6/2016 | Singh ............... H04W 60/005 370/329 |
| 2016/0277858 A1 | 9/2016 | Gelter |
| 2018/0088901 A1* | 3/2018 | Drinkwater ....... H04N 21/4394 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
*Sonos, Inc. v. D&M Holdings* (No. 14-1330-RGA), DI 219, Claim Construction Opinion (Jan. 12, 2017) (24 pages).
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
International Searching Authority, International Search Report and Written Opinion dated Nov. 16, 2020, issued in connection with International Application No. PCT/US2020/045465, filed on Aug. 7, 2020, 11 pages.
European Patent Office, European EPC Article 94.3 and Communication pursuant to Rule 164(2)(b) mailed on Mar. 21, 2024, issued in connection with European Application No. 20761932.1, 11 pages.

* cited by examiner

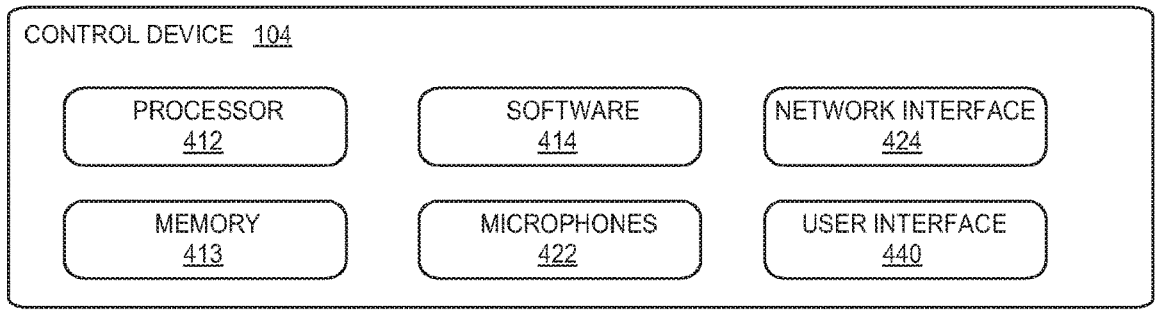
Figure 4A
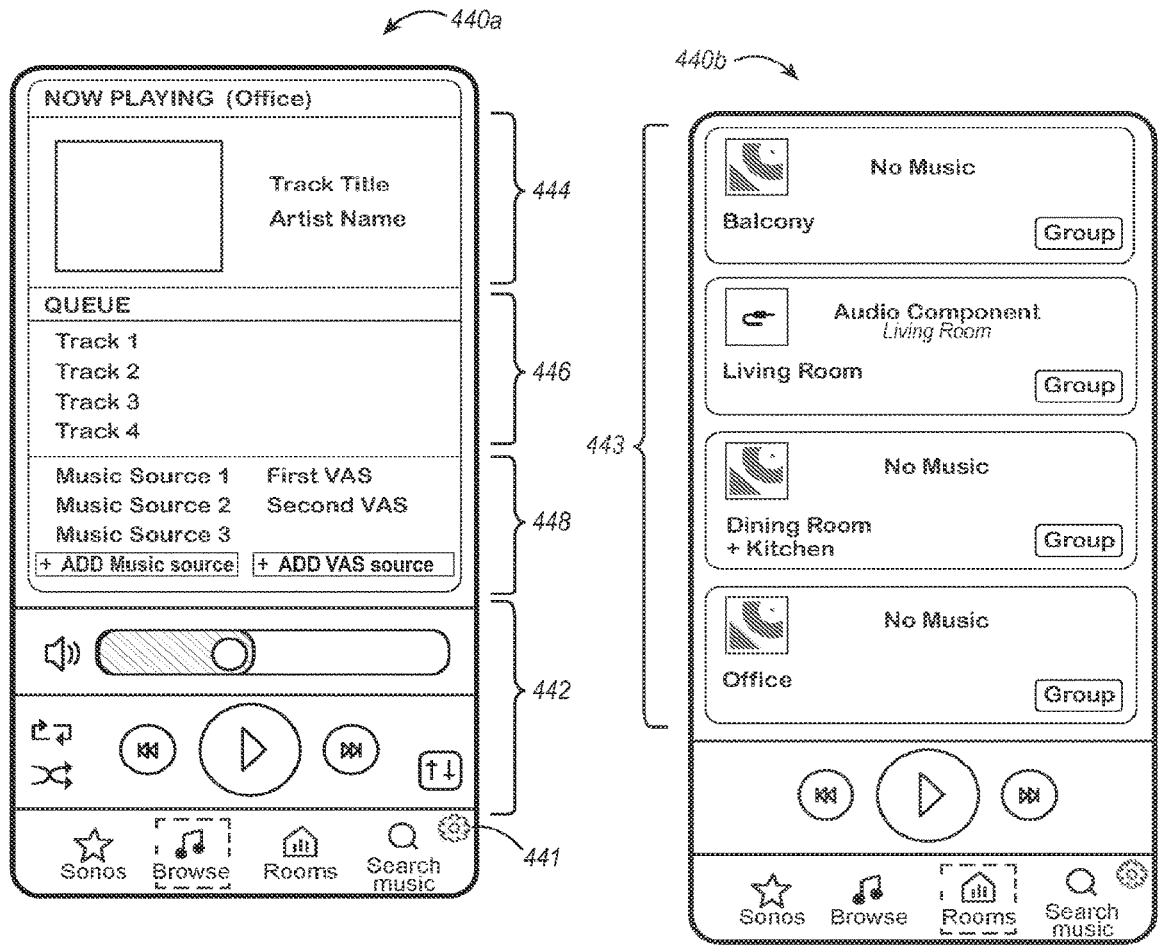
Figure 4B
Figure 4C

POWER MANAGEMENT AND DISTRIBUTED AUDIO PROCESSING TECHNIQUES FOR PLAYBACK DEVICES

CROSS REFERENCE TO RELATED APPLICATIONS

This application claims priority under 35 U.S.C. § 120 as a continuation of PCT Application No. PCT/US2020/045465, filed Aug. 7, 2020, titled "Power Management and Distributed Audio Processing Techniques for Playback Devices," which claims priority to U.S. Provisional Patent Application No. 62/884,966, filed on Aug. 9, 2019, titled "Distributed Processing Architecture for Playback Devices," each of which is hereby incorporated herein by reference in its entirety.

TECHNICAL FIELD

The present technology relates to consumer goods and, more particularly, to methods, systems, products, features, services, and other elements directed to media playback systems or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The SONOS Wireless HiFi System enables people to experience music from many sources via one or more networked playback devices. Through a software control application installed on a smartphone, tablet, or computer, one can play what he or she wants in any room that has a networked playback device. Additionally, using a controller, for example, different songs can be streamed to each room that has a playback device, rooms can be grouped together for synchronous playback, or the same song can be heard in all rooms synchronously.

Given the ever-growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings.

FIG. 4A is a functional block diagram of an example controller device in accordance with aspects of the disclosure.

FIGS. 4B and 4C are controller interfaces in accordance with aspects of the disclosure.

Figure 1A:
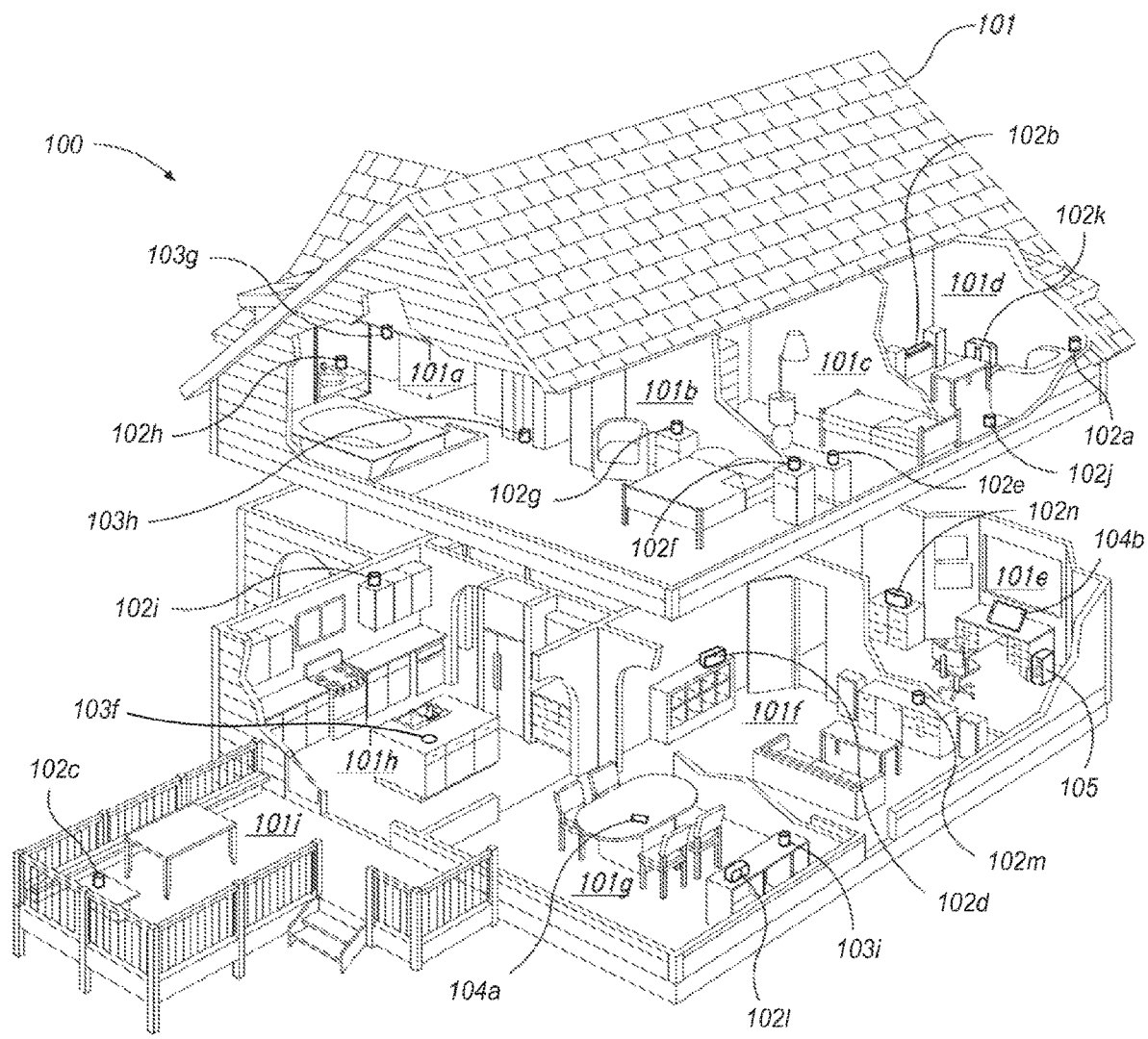
FIG. 1A is a partial cutaway view of an environment having a media playback system configured in accordance with aspects of the disclosed technology.

The drawings are for purposes of illustrating example embodiments, but it should be understood that the inventions are not limited to the arrangements and instrumentality shown in the drawings. In the drawings, identical reference numbers identify at least generally similar elements. To facilitate the discussion of any particular element, the most significant digit or digits of any reference number refers to the Figure in which that element is first introduced. For example, element 103a is first introduced and discussed with reference to FIG. 1A.

DETAILED DESCRIPTION

I. Overview

Consumers typically expect battery powered devices to have a long runtime before the battery needs to be recharged. Consumers generally have different runtime expectations for different types of battery powered devices. For example, consumers may expect general-purpose computing devices (e.g., a laptop, a smartphone, or a tablet) to have a shorter runtime between 8-10 hours and expect more specialized devices (e.g., a wireless game controller, a pair of wireless headphones, a wireless keyboard, or a digital camera) to have a longer runtime of at least 20 hours.

The differences in runtimes between portable general-purpose computing devices and more specialized devices results, at least in part, from different processing architectures. For example, general-purpose computing devices typically execute a general-purpose operating system (GPOS), such as WINDOWS, MACOS, ANDROID, IOS, or LINUX, that generally necessitates a power-hungry processor. For example, a GPOS may necessitate use of a more complex processor that supports memory virtualization. By employing a GPOS, these general-purpose computing devices can be programed to perform a variety of sophisticated operations. In contrast, specialized devices typically do not support such sophisticated operations enabled by a GPOS. For example, a pair of conventional wireless headphones that only wirelessly communicate via BLUETOOTH with a smartphone that directly provides the audio content for playback does not need to: (1) wirelessly communicate with remote servers over a more sophisticated wireless network such as a WIFI network; and/or (2) perform one or more authentication operations to successfully obtain access to media content on the remote servers. As a result, these specialized devices can typically employ a special-purpose operating system (SPOS) that is capable of being executed by simpler processors that consume less power.

As consumer demand for additional functionality in specialized devices grows, the conventional processing architecture for such specialized devices is insufficient. In particular, the additional functionality consumers desire may require a shift from only using an SPOS to using a GPOS. One challenge in designing a specialized device with such enhanced functionality is that the shift from an SPOS to a GPOS may require the use of more power-hungry processors. As a result, the long battery life consumers expect in such specialized devices may no longer be easily achievable. For example, consumers may expect a wireless headphone that only plays back audio received over BLUETOOTH to have a runtime between 20 and 25 hours. While such a long runtime is easily achievable by employing an SPOS executed on a simple processor, the runtime may be substantially reduced (e.g., to only 5 and 8 hours) when the architecture is replaced with more complex processors executing a GPOS to enable more complex features (e.g., audio streaming over WIFI from a music streaming service provider). While such a short runtime may be perfectly acceptable to consumers for general-purpose computing devices, such a short runtime is intolerable to consumers in a specialized device.

Accordingly, aspects of the present disclosure relate to a distributed processing architecture for specialized devices (and/or systems employing one or more specialized devices) that integrates a more sophisticated processor capable of executing a GPOS without significantly increasing power consumption. In some embodiments, the distributed processing architecture includes a low-power processor that executes an SPOS and a high-power processor that executes a GPOS. In these embodiments, the low-power processor may perform the basic operations of the device such as obtaining information from one or more input devices (e.g., capacitive touch sensors, buttons, etc.), providing output signals to one or more components (e.g., amplifiers, etc.), and controlling the power state of other components (including the high-power processor). The high-power processor may be invoked by the low-power processor only for high complexity tasks that could not be easily performed (or not performed at all) on an SPOS executed by the low-power processor, such as authenticating with a remote server over WIFI to obtain access to media files. Accordingly, the low-power processor can put the high-power processor into a low-power state (including completely turning the high-power processor off) during periods where no higher complexity tasks are being performed. Thus, the high-power processor executing the GPOS may, in at least some respects, function as a co-processor to the low-power processor executing the SPOS. As a result, the architecture enables a specialized device to implement more complex features that require a GPOS without substantially reducing battery life relative to less capable specialized devices in the same market segment.

The architecture described herein stands in contrast to conventional multi-processor architectures where a high-power processor executing a GPOS handles the low-level tasks of the device (including power state control of other devices) while specific tasks that can be more efficiently handled by specialized hardware are offloaded to a specialized co-processor. For example, a conventional device may employ a high-power processor executing a GPOS that offloads some math intensive tasks to a digital signal processor (DSP) that is better suited to handle such tasks efficiently. With such an architecture, the high-power processor still needs to remain powered even when the device is only performing tasks suited for the DSP to, for example, perform background tasks (e.g., controlling user interface components, providing obtained information to the DSP, etc.). As a result, the high-power processor still consumes a considerable amount of power even when the device is only performing tasks particularly suited for the DSP.

The distributed architectures described herein may be advantageously employed in any of a variety of specialized devices. For example, the distributed architecture may be implemented in a playback device. The playback device may comprise one or more amplifiers configured to drive one or more speakers. The one or more speakers may be integrated with the playback device (e.g., to form an all-in-one smart speaker) or separate from the playback device (e.g., to form a smart amplifier). The playback device may further comprise one or more network interface components to facilitate communication over one or more wireless networks. For example, the one or more network interface components may be capable of wirelessly communicating with a first computing device over a first wireless network (e.g., cellular network and/or a wireless local area network (WLAN)) and wirelessly communicating (e.g., simultaneously wirelessly communicating) with a second computing device over another network, such as a BLUETOOTH network (e.g., a BLUETOOTH CLASSIC network, a BLUETOOTH LOW ENERGY (BLE) network, etc.). The playback device may further comprise a plurality of processing components configured to execute instructions that cause the playback device to perform various operations. The plurality of processing components may comprise low-power processor(s) and high-power processor(s) that are constructed differently from the low-power processor(s). Additionally, the low-power processor(s) may execute a different operating system than the high-power processor(s). For example, the high-power processor(s) may be configured to support virtual memory (e.g., an abstraction of the available storage resources) and execute an operating system that may at least partially employ virtualized memory, such as a GPOS. In contrast, the low-power processor(s) may not be configured to support virtual memory and execute an operating system that does not require virtual memory support, such as a Real-Time Operating System (RTOS) or other SPOS.

In some embodiments, a subset of the operations to be performed by the plurality of processing components may only be practically implemented on processor(s) executing a GPOS, such as managing authentication with a remote server to obtain access to audio content, while the remainder of the operations may be practically implemented on processor(s) executing either a GPOS or an SPOS, such as reading sensor or playing back audio stored in a local memory. Given that a processor that is suitable for a GPOS (e.g., supports virtual memory) consumes more power than a processor that is not suitable for a GPOS (e.g., does not support virtual memory), the high-power processor(s) executing a GPOS may only be invoked (e.g., by the low-power processor(s)) for those operations not suitable for execution on the low-power processor(s) and otherwise kept in a low-power state (e.g., including being completely powered off). Thus, the high-power processor(s) may, in at least some respects (and/or situations), function as co-processor(s) to the low-power processor(s). By architecting a playback device such that the high-power processor(s) are only required for certain complex tasks, the high-power processor(s) may be completely turned off (or otherwise in a low-power state) without interfering with other aspects of the operation of the playback device. For example, the high-power processor(s) may be entirely turned off without impacting less complex operations such as playing back locally stored audio (e.g., stored in a buffer).

It should be appreciated that the particular way in which operations are distributed between the low and high-power processors in additions to the particular triggers that cause the processor(s) to change between various power states may vary based on the particular implementation. In some embodiments, the playback device may be configured to stream audio content over the Internet. In these embodiments, the operations involving communicating with a remote server to obtain the audio content may not be practical to implement on the low-power processor(s) executing an SPOS. In contrast, the operations involving playback of the downloaded audio content may be suitable for execution on the low-power processor(s). Accordingly, in some embodiments, the low-power processor(s) may keep the high-power processor(s) in a low-power state until audio content from a remote server is needed. Once audio content from a remote server is needed, the low-power processor(s) may wake-up the high-power processor(s) such that the high-power processor(s) can obtain the audio content from the remote server (e.g., by communicating over the Internet). Once the high-power processor(s) has obtained the audio content, the high-power processor(s) may make the audio content available to the low-power processor(s). For example, the high-power processor(s) may transmit the audio content to the low-power processor(s) via a communication bus, such as a serial peripheral interface (SPI) bus. Alternatively (or additionally), the high-power processor(s) may store the audio content in a shared memory that is accessible by the low-power processor(s). Once the audio content is accessible to the low-power processor(s), the low power processor(s) may cause the playback device to play back the audio content.

Additionally, in some embodiments, the low-power processor(s) may cause the high-power processor(s) to return to a low-power state once the low-power processor(s) has access to the audio content given that the high-power processor(s) may not be required to playback the retrieved audio content. In these embodiments, the low-power processor(s) may playback the retrieved audio content and, while playing back the retrieved audio content, monitor how much of the retrieved audio content has yet to be played back (e.g., how much time is left before playback of the retrieved audio content is exhausted). When the retrieved audio content is nearly exhausted, the low-power processor(s) may wake-up the high-power processor(s) from the low-power state such that the high-power processor(s) may obtain additional audio content from a remote server to continue uninterrupted audio playback.

In some embodiments, the playback device may be configured to provide voice assistant service (VAS) functionality over WIFI. In these embodiments, the operations involving communicating with a remote server to provide a voice input and obtain a response may not be practical to implemented on the low-power processor(s) executing an SPOS. In contrast, the operations involving pre-processing of the voice input to remove noise (e.g., remove echoes, remove background chatter, etc.) and/or detecting a wake-word (e.g., an activation word) may be suitable for execution on the low-power processor(s) executing the SPOS. Accordingly, in some embodiments, the low-power processor(s) may perform one or more operations to detect the utterance of a wake-word, remove noise from the voice input, and make the de-noised voice input accessible to the high-power processor(s). In turn, the high-power processor(s) may transmit the de-noised voice input to a remote server and obtain a response from the remote server.

In an embodiment, the playback device includes amplifiers for driving speakers and a network interface that facilitates communications with a first remote device via a first communication link, and with a second remote device via a second communication link. The playback device includes a first processor(s) and a second processor(s) with different constructions. The first processor(s) implements multiple power states such as an awake state and a sleep state. In this embodiment, audio content is received by the second processor(s) from the second remote device via the second communication link for playback via the speakers. An indication is received from the network interface as to whether the first communication link can be established between the playback device and the first remote device. When the first communication link can be established, the first processor(s) is transitioned to the awake state to facilitate receiving audio content via the first communication link for playback via the one or more speakers. When the first communication link cannot be established, the first processor(s) is transitioned to the sleep state to lower playback device power consumption.

In another embodiment, a playback device includes amplifiers for driving speakers and a network interface that facilitates communications with a first remote device via a first communication link. The playback device includes a first processor(s) and a second processor(s) with different constructions. In this embodiment, audio information that includes audio content is received by the first processor(s) and from the first remote device. The first processor(s) generates metadata associated with the first audio content. The first processor(s) communicates the audio content and the metadata to the second processor(s). The second processor(s) processes the audio content according to the metadata data and communicates the processed audio content to the amplifiers for playback.

It should be appreciated that the distributed processing architectures and/or the power management techniques described herein may be advantageously employed in specialized devices separate and apart from playback devices. For example, the distributed processing architectures described herein may be employed in any Internet of Things (IoT) device. An IoT device may be, for example, a device designed to perform one or more specific tasks (e.g., making coffee, reheating food, locking a door, providing power to another device, playing music) based on information received via a network (e.g., a wide area network (WAN) such as the Internet). Examples of such IoT devices include: a smart thermostat, a smart doorbell, a smart lock (e.g., a smart door lock), a smart outlet, a smart light, a smart camera, a smart kitchen appliance (e.g., a smart oven, a smart coffee maker, a smart microwave), and a smart speaker (including the network accessible and/or voice-enabled playback devices described above).

Further, the distributed processing architectures and/or the power management techniques described herein may be readily applied to a network of two or more devices (e.g., playback devices). For example, a first playback device that has consistent access to one or more external power sources (e.g., a stationary playback device plugged into a wall outlet, such as a soundbar) may house a high-power processor executing a GPOS (e.g., an application processor) and a second playback device that is power-constrained (e.g., does not have consistent access to an external power source, such as a battery-powered playback device) may house the low-power processor executing an SPOS. The first and second playback devices may be connected to a common communication network, such as a BLUETOOTH network (e.g., a BLUETOOTH LOW ENERGY (BLE) network and/or a BLUETOOTH CLASSIC network) or other personal area network (PAN). In this example, the second playback device may off-load tasks that are unsuitable for execution by the low-power processor executing the SPOS to the high-power processor of the first playback device (e.g., via the common communication network). Thus, the second playback device may (e.g., when connected to a common network with the first playback device) support complex functions while still having a low power consumption (e.g., and a long run-time on battery power).

While some embodiments described herein may refer to functions performed by given actors, such as "users" and/or other entities, it should be understood that this description is for purposes of explanation only. The claims should not be interpreted to require action by any such example actor unless explicitly required by the language of the claims themselves.

II. Example Operating Environment

Figure 1B:
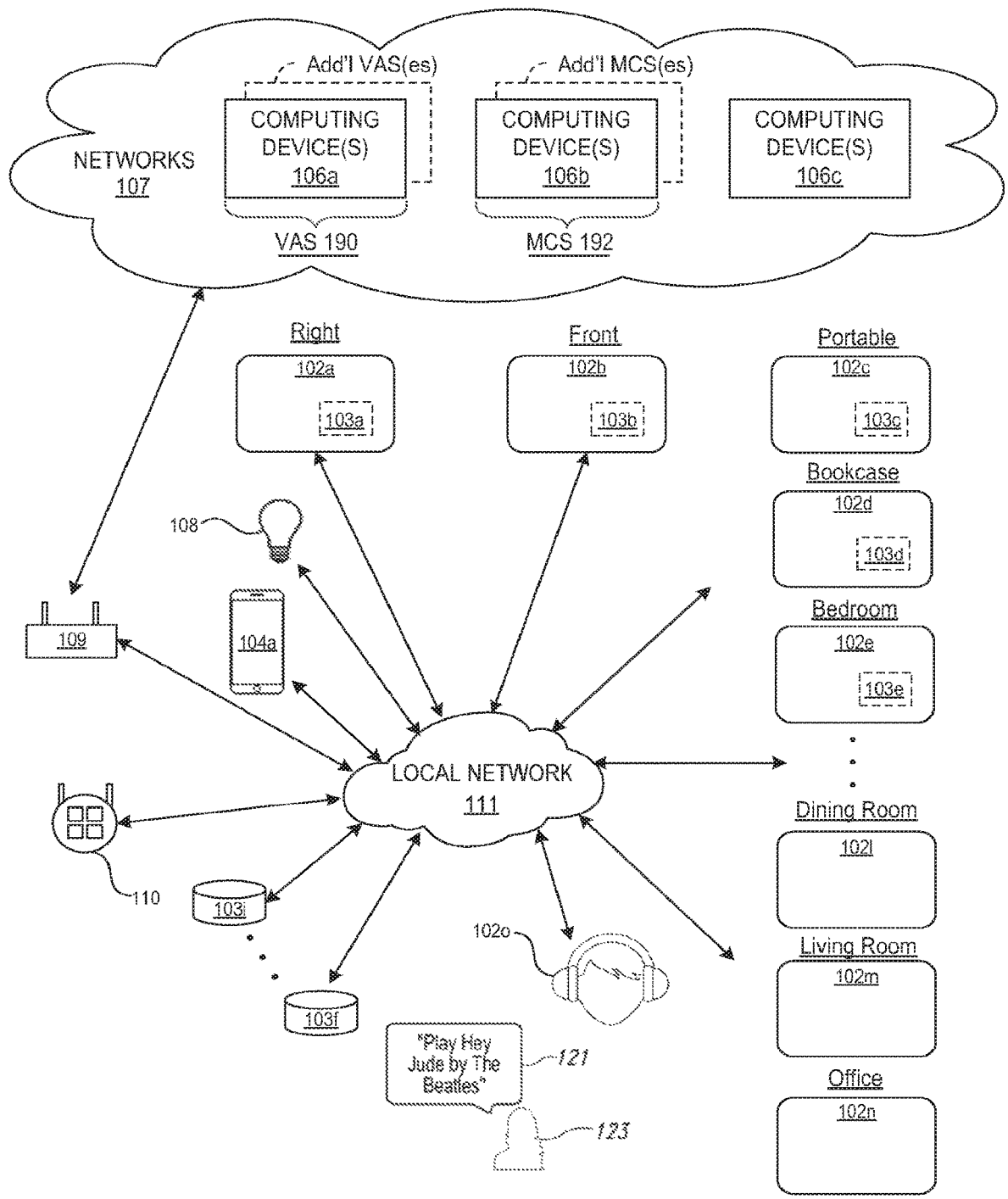
FIG. 1B is a schematic diagram of the media playback system of FIG. 1A and one or more networks.

FIGS. 1A and 1B illustrate an example configuration of a media playback system 100 (or "MPS 100") in which one or more embodiments disclosed herein may be implemented. Referring first to FIG. 1A, the MPS 100 as shown is associated with an example home environment having a plurality of rooms and spaces, which may be collectively referred to as a "home environment," "smart home," or "environment 101." The environment 101 comprises a household having several rooms, spaces, and/or playback zones, including a master bathroom 101a, a master bedroom 101b (referred to herein as "Nick's Room"), a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the MPS 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

Within these rooms and spaces, the MPS 100 includes one or more computing devices. Referring to FIGS. 1A and 1B together, such computing devices can include playback devices 102 (identified individually as playback devices 102a-102o), network microphone devices 103 (identified individually as "NMDs" 103a-102i), and controller devices 104a and 104b (collectively "controller devices 104"). Referring to FIG. 1B, the home environment may include additional and/or other computing devices, including local network devices, such as one or more smart illumination devices 108 (FIG. 1B), a smart thermostat 110, and a local computing device 105 (FIG. 1A). In embodiments described below, one or more of the various playback devices 102 may be configured as portable playback devices, while others may be configured as stationary playback devices. For example, the headphones 102o (FIG. 1B) are a portable playback device, while the playback device 102d on the bookcase may be a stationary device. As another example, the playback device 102c on the Patio may be a battery-powered device, which may allow it to be transported to various areas within the environment 101, and outside of the environment 101, when it is not plugged in to a wall outlet or the like.

With reference still to FIG. 1B, the various playback, network microphone, and controller devices 102-104 and/or other network devices of the MPS 100 may be coupled to one another via point-to-point connections and/or over other connections, which may be wired and/or wireless, via a local network 111 that may include a network router 109. For example, the playback device 102j in the Den 101d (FIG. 1A), which may be designated as the "Left" device, may have a point-to-point connection with the playback device 102a, which is also in the Den 101d and may be designated as the "Right" device. In a related embodiment, the Left playback device 102j may communicate with other network devices, such as the playback device 102b, which may be designated as the "Front" device, via a point-to-point connection and/or other connections via the local network 111. The local network 111 may be, for example, a network that interconnects one or more devices within a limited area (e.g., a residence, an office building, a car, an individual's workspace, etc.). The local network 111 may include, for example, one or more local area network (LANs) such as wireless local area networks (WLANs) (e.g., WIFI networks, Z-WAVE networks, etc.) and/or one or more personal area networks (PANs) such as BLUETOOTH networks, wireless USB networks, ZIGBEE networks, and IRDA networks.

As further shown in FIG. 1B, the MPS 100 may be coupled to one or more remote computing devices 106 via a wide area network ("WAN") 107. In some embodiments, each remote computing device 106 may take the form of one or more cloud servers. The remote computing devices 106 may be configured to interact with computing devices in the environment 101 in various ways. For example, the remote computing devices 106 may be configured to facilitate streaming and/or controlling playback of media content, such as audio, in the home environment 101.

In some implementations, the various playback devices, NMDs, and/or controller devices 102-104 may be communicatively coupled to at least one remote computing device associated with a voice assistant service ("VAS") and at least one remote computing device associated with a media content service ("MCS"). For instance, in the illustrated example of FIG. 1B, remote computing devices 106a are associated with a VAS 190 and remote computing devices 106b are associated with an MCS 192. Although only a single VAS 190 and a single MCS 192 are shown in the example of FIG. 1B for purposes of clarity, the MPS 100 may be coupled to multiple, different VASes and/or MCSes. In some implementations, VASes may be operated by one or more of AMAZON, GOOGLE, APPLE, MICROSOFT, NUANCE, SONOS or other voice assistant providers. In some implementations, MCSes may be operated by one or more of SPOTIFY, PANDORA, AMAZON MUSIC, or other media content services.

As further shown in FIG. 1B, the remote computing devices 106 further include remote computing device 106c configured to perform certain operations, such as remotely facilitating media playback functions, managing device and system status information, directing communications between the devices of the MPS 100 and one or multiple VASes and/or MCSes, among other operations. In one example, the remote computing devices 106c provide cloud servers for one or more SONOS Wireless HiFi Systems.

In various implementations, one or more of the playback devices 102 may take the form of or include an on-board (e.g., integrated) network microphone device. For example, the playback devices 102a-e include or are otherwise equipped with corresponding NMDs 103a-e, respectively. A playback device that includes or is equipped with an NMD may be referred to herein interchangeably as a playback device or an NMD unless indicated otherwise in the description. In some cases, one or more of the NMDs 103 may be a stand-alone device. For example, the NMDs 103f and 103g may be stand-alone devices. A stand-alone NMD may omit components and/or functionality that is typically included in a playback device, such as a speaker or related electronics. For instance, in such cases, a stand-alone NMD may not produce audio output or may produce limited audio output (e.g., relatively low-quality audio output).

The various playback and network microphone devices 102 and 103 of the MPS 100 may each be associated with a unique name, which may be assigned to the respective devices by a user, such as during setup of one or more of these devices. For instance, as shown in the illustrated example of FIG. 1B, a user may assign the name "Bookcase" to playback device 102d because it is physically situated on a bookcase. Similarly, the NMD 103f may be assigned the named "Island" because it is physically situated on an island countertop in the Kitchen 101h (FIG. 1A). Some playback devices may be assigned names according to a zone or room, such as the playback devices 102e, 102l, 102m, and 102n, which are named "Bedroom," "Dining Room," "Living Room," and "Office," respectively. Further, certain playback devices may have functionally descriptive names. For example, the playback devices 102a and 102b are assigned the names "Right" and "Front," respectively, because these two devices are configured to provide specific audio channels during media playback in the zone of the Den 101d (FIG. 1A). The playback device 102c in the Patio may be named portable because it is battery-powered and/or readily transportable to different areas of the environment 101. Other naming conventions are possible.

As discussed above, an NMD may detect and process sound from its environment, such as sound that includes background noise mixed with speech spoken by a person in the NMD's vicinity. For example, as sounds are detected by the NMD in the environment, the NMD may process the detected sound to determine if the sound includes speech that contains voice input intended for the NMD and ultimately a particular VAS. For example, the NMD may identify whether speech includes a wake word associated with a particular VAS.

In the illustrated example of FIG. 1B, the NMDs 103 are configured to interact with the VAS 190 over the local network 111 and/or the router 109. Interactions with the VAS 190 may be initiated, for example, when an NMD identifies in the detected sound a potential wake word. The identification causes a wake-word event, which in turn causes the NMD to begin transmitting detected-sound data to the VAS 190. In some implementations, the various local network devices 102-105 (FIG. 1A) and/or remote computing devices 106c of the MPS 100 may exchange various feedback, information, instructions, and/or related data with the remote computing devices associated with the selected VAS. Such exchanges may be related to or independent of transmitted messages containing voice inputs. In some embodiments, the remote computing device(s) and the media playback system 100 may exchange data via communication paths as described herein and/or using a metadata exchange channel as described in U.S. Patent Publication No. 2017-0242653 published Aug. 24, 2017, and titled "Voice Control of a Media Playback System," which is herein incorporated by reference in its entirety.

Upon receiving the stream of sound data, the VAS 190 determines if there is voice input in the streamed data from the NMD, and if so the VAS 190 will also determine an underlying intent in the voice input. The VAS 190 may next transmit a response back to the MPS 100, which can include transmitting the response directly to the NMD that caused the wake-word event. The response is typically based on the intent that the VAS 190 determined was present in the voice input. As an example, in response to the VAS 190 receiving a voice input with an utterance to "Play Hey Jude by The Beatles," the VAS 190 may determine that the underlying intent of the voice input is to initiate playback and further determine that intent of the voice input is to play the particular song "Hey Jude." After these determinations, the VAS 190 may transmit a command to a particular MCS 192 to retrieve content (i.e., the song "Hey Jude"), and that MCS 192, in turn, provides (e.g., streams) this content directly to the MPS 100 or indirectly via the VAS 190. In some implementations, the VAS 190 may transmit to the MPS 100 a command that causes the MPS 100 itself to retrieve the content from the MCS 192.

In certain implementations, NMDs may facilitate arbitration amongst one another when voice input is identified in speech detected by two or more NMDs located within proximity of one another. For example, the NMD-equipped playback device 102d in the environment 101 (FIG. 1A) is in relatively close proximity to the NMD-equipped Living Room playback device 102m, and both devices 102d and 102m may at least sometimes detect the same sound. In such cases, this may require arbitration as to which device is ultimately responsible for providing detected-sound data to the remote VAS. Examples of arbitrating between NMDs may be found, for example, in previously referenced U.S. Patent Publication No. 2017-0242653.

In certain implementations, an NMD may be assigned to, or otherwise associated with, a designated or default playback device that may not include an NMD. For example, the Island NMD 103f in the Kitchen 101h (FIG. 1A) may be assigned to the Dining Room playback device 102l, which is in relatively close proximity to the Island NMD 103f. In practice, an NMD may direct an assigned playback device to play audio in response to a remote VAS receiving a voice input from the NMD to play the audio, which the NMD might have sent to the VAS in response to a user speaking a command to play a certain song, album, playlist, etc. Additional details regarding assigning NMDs and playback devices as designated or default devices may be found, for example, in previously referenced U.S. Patent Publication No. 2017-0242653.

Further aspects relating to the different components of the example MPS 100 and how the different components may interact to provide a user with a media experience may be found in the following sections. While discussions herein may generally refer to the example MPS 100, technologies described herein are not limited to applications within, among other things, the home environment described above. For instance, the technologies described herein may be useful in other home environment configurations comprising more or fewer of any of the playback, network microphone, and/or controller devices 102-104. For example, the technologies herein may be utilized within an environment having a single playback device 102 and/or a single NMD 103. In some examples of such cases, the local network 111 (FIG. 1B) may be eliminated and the single playback device 102 and/or the single NMD 103 may communicate directly with the remote computing devices 106a-d. In some embodiments, a telecommunication network (e.g., an LTE network, a 5G network, etc.) may communicate with the various playback, network microphone, and/or controller devices 102-104 independent of the local network 111.

While specific implementations of MPS's have been described above with respect to FIGS. 1A and 1B, there are numerous configurations of MPS's, including, but not limited to, those that do not interact with remote services, systems that do not include controllers, and/or any other configuration as appropriate to the requirements of a given application.

a. Example Playback & Network Microphone Devices

Figure 2A:
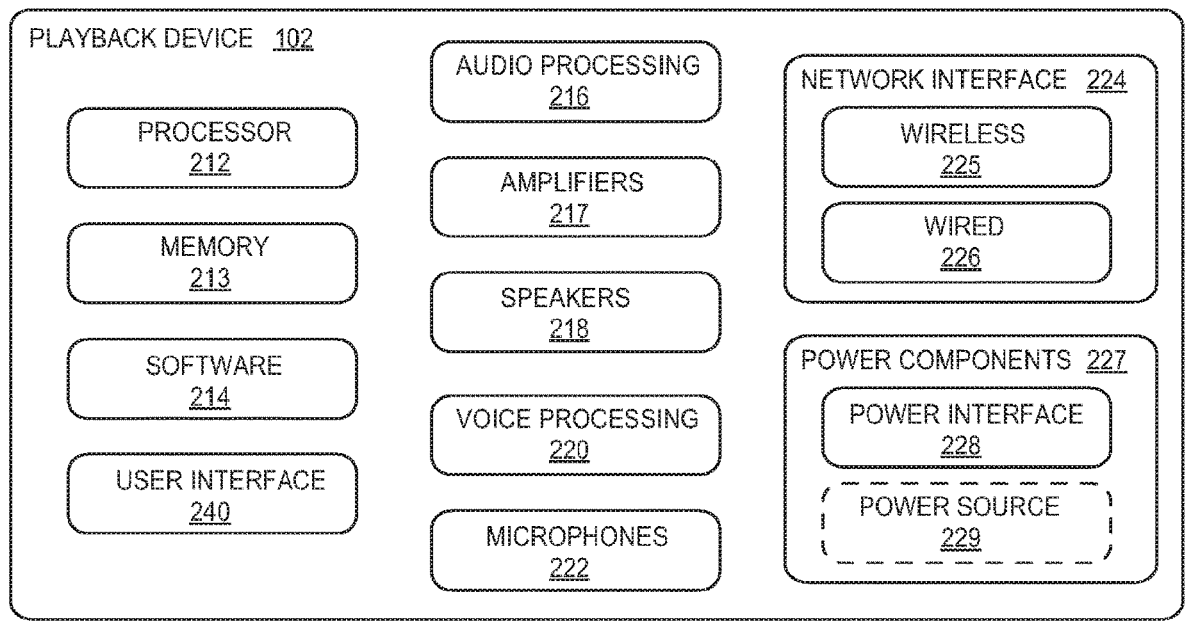
FIG. 2A is a functional block diagram of an example playback device.

FIG. 2A is a functional block diagram illustrating certain aspects of one of the playback devices 102 of the MPS 100 of FIGS. 1A and 1B. As shown, the playback device 102 includes various components, each of which is discussed in further detail below, and the various components of the playback device 102 may be operably coupled to one another via a system bus, communication network, or some other connection mechanism. In the illustrated example of FIG. 2A, the playback device 102 may be referred to as an "NMD-equipped" playback device because it includes components that support the functionality of an NMD, such as one of the NMDs 103 shown in FIG. 1A.

As shown, the playback device 102 includes at least one processor 212, which may be a clock-driven computing component configured to process input data according to instructions stored in memory 213. The memory 213 may be a tangible, non-transitory, computer-readable medium configured to store instructions that are executable by the processor 212. For example, the memory 213 may be data storage that can be loaded with software code 214 that is executable by the processor 212 to achieve certain functions.

In one example, these functions may involve the playback device 102 retrieving audio data from an audio source, which may be another playback device. In another example, the functions may involve the playback device 102 sending audio data, detected-sound data (e.g., corresponding to a voice input), and/or other information to another device on a network via at least one network interface 224. In yet another example, the functions may involve the playback device 102 causing one or more other playback devices to synchronously playback audio with the playback device 102. In yet a further example, the functions may involve the playback device 102 facilitating being paired or otherwise bonded with one or more other playback devices to create a multi-channel audio environment. Numerous other example functions are possible, some of which are discussed below.

As just mentioned, certain functions may involve the playback device 102 synchronizing playback of audio content with one or more other playback devices. During synchronous playback, a listener may not perceive time-delay differences between playback of the audio content by the synchronized playback devices. U.S. Pat. No. 8,234,395 filed on Apr. 4, 2004, and titled "System and method for synchronizing operations among a plurality of independently clocked digital data processing devices," which is hereby incorporated by reference in its entirety, provides in more detail some examples for audio playback synchronization among playback devices.

To facilitate audio playback, the playback device 102 includes audio processing components 216 that are generally configured to process audio prior to the playback device 102 rendering the audio. In this respect, the audio processing components 216 may include one or more digital-to-analog converters ("DAC"), one or more audio preprocessing components, one or more audio enhancement components, one or more digital signal processors ("DSPs"), and so on. In some implementations, one or more of the audio processing components 216 may be a subcomponent of the processor 212. In operation, the audio processing components 216 receive analog and/or digital audio and process and/or otherwise intentionally alter the audio to produce audio signals for playback.

The produced audio signals may then be provided to one or more audio amplifiers 217 for amplification and playback through one or more speakers 218 operably coupled to the amplifiers 217. The audio amplifiers 217 may include components configured to amplify audio signals to a level for driving one or more of the speakers 218.

Each of the speakers 218 may include an individual transducer (e.g., a "driver") or the speakers 218 may include a complete speaker system involving an enclosure with one or more drivers. A particular driver of a speaker 218 may include, for example, a subwoofer (e.g., for low frequencies), a mid-range driver (e.g., for middle frequencies), and/or a tweeter (e.g., for high frequencies). In some cases, a transducer may be driven by an individual corresponding audio amplifier of the audio amplifiers 217. In some implementations, a playback device may not include the speakers 218, but instead may include a speaker interface for connecting the playback device to external speakers. In certain embodiments, a playback device may include neither the speakers 218 nor the audio amplifiers 217, but instead may include an audio interface (not shown) for connecting the playback device to an external audio amplifier or audio-visual receiver.

In addition to producing audio signals for playback by the playback device 102, the audio processing components 216 may be configured to process audio to be sent to one or more other playback devices, via the network interface 224, for playback. In example scenarios, audio content to be processed and/or played back by the playback device 102 may be received from an external source, such as via an audio line-in interface (e.g., an auto-detecting 3.5 mm audio line-in connection) of the playback device 102 (not shown) or via the network interface 224, as described below.

As shown, the at least one network interface 224, may take the form of one or more wireless interfaces 225 and/or one or more wired interfaces 226. A wireless interface may provide network interface functions for the playback device 102 to wirelessly communicate with other devices (e.g., other playback device(s), NMD(s), and/or controller device(s)) in accordance with a communication protocol (e.g., any wireless standard including IEEE 802.11a, 802.11b, 802.11g, 802.11n, 802.11ac, 802.11ad, 802.11af, 802.11ah, 802.11ai, 802.11aj, 802.11aq, 802.11ax, 802.11ay, 802.15, BLUETOOTH, 4G mobile communication standard, 5G mobile communication standard, and so on). A wired interface may provide network interface functions for the playback device 102 to communicate over a wired connection with other devices in accordance with a communication protocol (e.g., IEEE 802.3). While the network interface 224 shown in FIG. 2A includes both wired and wireless interfaces, the playback device 102 may in some implementations include only wireless interface(s) or only wired interface(s).

In general, the network interface 224 facilitates data flow between the playback device 102 and one or more other devices on a data network. For instance, the playback device 102 may be configured to receive audio content over the data network from one or more other playback devices, network devices within a LAN, and/or audio content sources over a WAN, such as the Internet. In one example, the audio content and other signals transmitted and received by the playback device 102 may be transmitted in the form of digital packet data comprising an Internet Protocol (IP)-based source address and IP-based destination addresses. In such a case, the network interface 224 may be configured to parse the digital packet data such that the data destined for the playback device 102 is properly received and processed by the playback device 102.

As shown in FIG. 2A, the playback device 102 also includes voice processing components 220 that are operably coupled to one or more microphones 222. The microphones 222 are configured to detect sound (i.e., acoustic waves) in the environment of the playback device 102, which is then provided to the voice processing components 220. More specifically, each microphone 222 is configured to detect sound and convert the sound into a digital or analog signal representative of the detected sound, which can then cause the voice processing component 220 to perform various functions based on the detected sound, as described in greater detail below. In one implementation, the microphones 222 are arranged as an array of microphones (e.g., an array of six microphones). In some implementations, the playback device 102 includes more than six microphones (e.g., eight microphones or twelve microphones) or fewer than six microphones (e.g., four microphones, two microphones, or a single microphones).

In operation, the voice-processing components 220 are generally configured to detect and process sound received via the microphones 222, identify potential voice input in the detected sound, and extract detected-sound data to enable a VAS, such as the VAS 190 (FIG. 1B), to process voice input identified in the detected-sound data. The voice processing components 220 may include one or more analog-to-digital converters, an acoustic echo canceller ("AEC"), a spatial processor (e.g., one or more multi-channel Wiener filters, one or more other filters, and/or one or more beam former components), one or more buffers (e.g., one or more circular buffers), one or more wake-word engines, one or more voice extractors, and/or one or more speech processing components (e.g., components configured to recognize a voice of a particular user or a particular set of users associated with a household), among other example voice processing components. In example implementations, the voice processing components 220 may include or otherwise take the form of one or more DSPs or one or more modules of a DSP. In this respect, certain voice processing components 220 may be configured with particular parameters (e.g., gain and/or spectral parameters) that may be modified or otherwise tuned to achieve particular functions. In some implementations, one or more of the voice processing components 220 may be a subcomponent of the processor 212.

In some implementations, the voice-processing components 220 may detect and store a user's voice profile, which may be associated with a user account of the MPS 100. For example, voice profiles may be stored as and/or compared to variables stored in a set of command information or data table. The voice profile may include aspects of the tone or frequency of a user's voice and/or other unique aspects of the user's voice, such as those described in previously-referenced U.S. Patent Publication No. 2017-0242653.

As further shown in FIG. 2A, the playback device 102 also includes power components 227. The power components 227 may include at least an external power source interface 228, which may be coupled to a power source (not shown) via a power cable or the like that physically connects the playback device 102 to an electrical outlet or some other external power source. Other power components may include, for example, transformers, converters, and like components configured to format electrical power.

In some implementations, the power components 227 of the playback device 102 may additionally include an internal power source 229 (e.g., one or more batteries) configured to power the playback device 102 without a physical connection to an external power source. When equipped with the internal power source 229, the playback device 102 may operate independent of an external power source. In some such implementations, the external power source interface 228 may be configured to facilitate charging the internal power source 229. As discussed before, a playback device comprising an internal power source may be referred to herein as a "portable playback device." Those portable playback devices that weigh no more than fifty ounces (e.g., between three ounces and fifty ounces, between five ounces and fifty ounces, between ten ounces and fifty ounces, between ten ounces and twenty-five ounces, etc.) may be referred to herein as an "ultra-portable playback device." Those playback devices that operate using an external power source instead of an internal power source may be referred to herein as a "stationary playback device," although such a device may in fact be moved around a home or other environment.

The playback device 102 may further include a user interface 240 that may facilitate user interactions independent of or in conjunction with user interactions facilitated by one or more of the controller devices 104. In various embodiments, the user interface 240 includes one or more physical buttons and/or supports graphical interfaces provided on touch sensitive screen(s) and/or surface(s), among other possibilities, for a user to directly provide input. The user interface 240 may further include one or more of lights (e.g., LEDs) and the speakers to provide visual and/or audio feedback to a user.

Figure 2B:
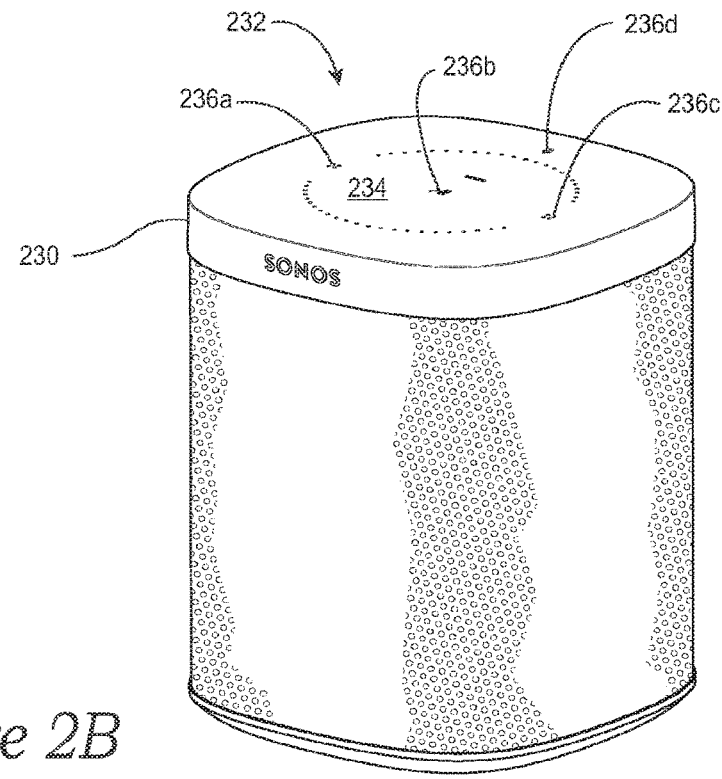
FIG. 2B is an isometric diagram of an example housing of the playback device of FIG. 2A.

As an illustrative example, FIG. 2B shows an example housing 230 of the playback device 102 that includes a user interface in the form of a control area 232 at a top portion 234 of the housing 230. The control area 232 includes buttons 236a-c for controlling audio playback, volume level, and other functions. The control area 232 also includes a button 236d for toggling the microphones 222 to either an on state or an off state.

As further shown in FIG. 2B, the control area 232 is at least partially surrounded by apertures formed in the top portion 234 of the housing 230 through which the microphones 222 (not visible in FIG. 2B) receive the sound in the environment of the playback device 102. The microphones 222 may be arranged in various positions along and/or within the top portion 234 or other areas of the housing 230 so as to detect sound from one or more directions relative to the playback device 102.

Figure 2C:
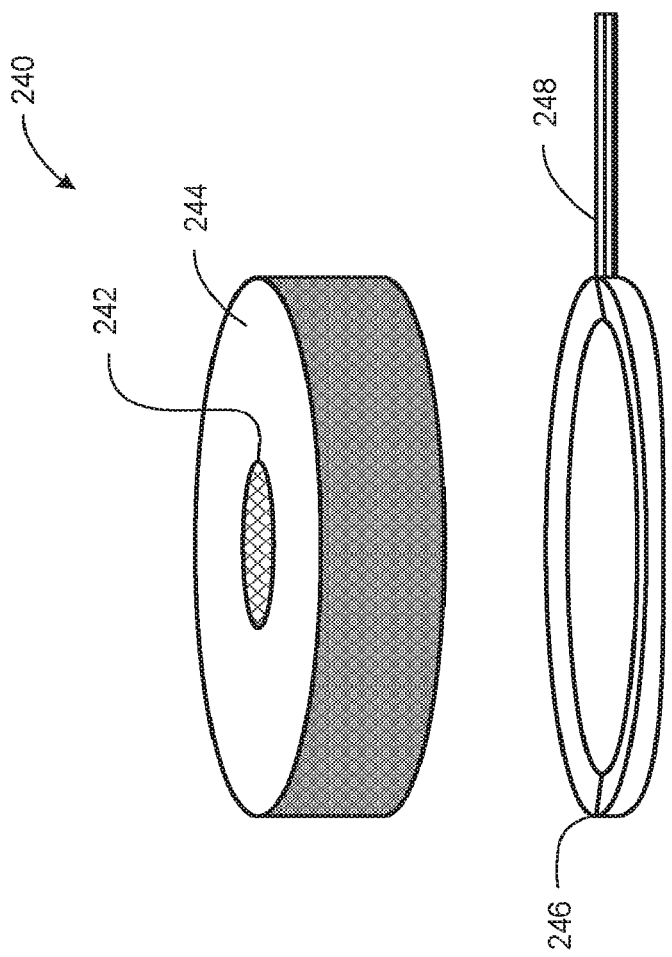
FIG. 2C is a diagram of another example housing for the playback device of FIG. 2A.

As mentioned above, the playback device 102 may be constructed as a portable playback device, such as an ultra-portable playback device, that comprises an internal power source. FIG. 2C shows an example housing 240 for such a portable playback device. As shown, the housing 240 of the portable playback device includes a user interface in the form of a control area 242 at a top portion 244 of the housing 240. The control area 242 may include a capacitive touch sensor for controlling audio playback, volume level, and other functions. The housing 240 of the portable playback device may be configured to engage with a charging dock 246 that is connected to an external power source via cable 248. The charging dock 246 may be configured to provide power to the portable playback device to recharge an internal battery. In some embodiments, the charging dock 246 may comprise a set of one or more conductive contacts (not shown) positioned on the top of the charging dock 246 that engage with conductive contacts on the bottom of the housing 240 (not shown). In other embodiments, the charging dock 246 may provide power from the cable 248 to the portable playback device without the use of conductive contacts. For example, the charging dock 246 may wirelessly charge the portable playback device via one or more inductive coils integrated into each of the charging dock 246 and the portable playback device.

Figure 2D:
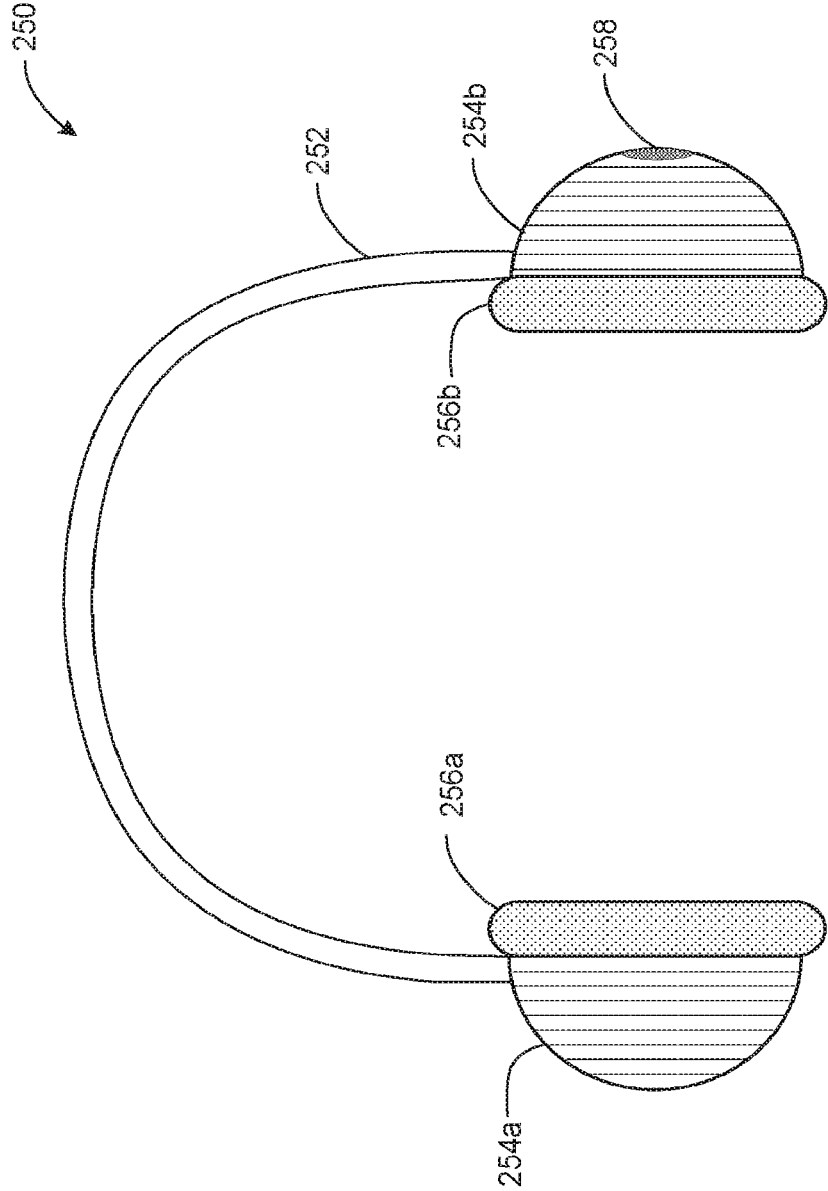
FIG. 2D is a diagram of another example housing for the playback device of FIG. 2A.

In some embodiments, the playback device 102 may take the form of a wired and/or wireless headphone (e.g., an over-ear headphone, an on-ear headphone, or an in-ear headphone). For instance, FIG. 2D shows an example housing 250 for such an implementation of the playback device 102. As shown, the housing 250 includes a headband 252 that couples a first earpiece 254a to a second earpiece 254b. Each of the earpieces 254a and 254b may house any portion of the electronic components in the playback device, such as one or more speakers. Further, one or more of the earpieces 254a and 254b may include a control area 258 configured to receive a user control indication for controlling audio playback, volume level, and other functions. The control area 258 may comprise any combination of the following: a capacitive touch sensor, a button, a switch, and a dial. As shown in FIG. 2D, the housing 250 may further include ear cushions 256a and 256b that are coupled to earpieces 254a and 254b, respectively. The ear cushions 256a and 256b may provide a soft barrier between the head of a user and the earpieces 254a and 254b, respectively, to improve user comfort and/or provide acoustic isolation from the ambient (e.g., passive noise reduction (PNR)). In some implementations, the wired and/or wireless headphones may be ultra-portable playback devices that are powered by an internal energy source and weigh less than fifty ounces.

In some instances, the headphone device may take the form of a hearable device. Hearable devices may include those headphone devices (e.g., ear-level devices) that are configured to provide a hearing enhancement function while also supporting playback of media content (e.g., streaming media content from a user device over a PAN, streaming media content from a streaming music service provider over a WLAN and/or a cellular network connection, etc.). In some instances, a hearable device may be implemented as an in-ear headphone device that is configured to playback an amplified version of at least some sounds detected from an external environment (e.g., all sound, select sounds such as human speech, etc.).

It should be appreciated that the playback device 102 may take the form of other wearable devices separate and apart from a headphone. Wearable devices may include those devices configured to be worn about a portion of a subject (e.g., an ear, a head, a neck, a torso, an arm, a wrist, a finger, a leg, an ankle, etc.). For example, the playback device 102 may take the form of a pair of glasses including a frame front (e.g., configured to hold one or more lenses), a first temple rotatably coupled to the frame front, and a second temple rotatable coupled to the frame front. In this example, the pair of glasses may comprise one or more transducers integrated into at least one of the first and second temples and configured to project sound towards an ear of the subject. While specific implementations of playback and network microphone devices have been described above with respect to FIGS. 2A, 2B, 2C, and 2D, there are numerous configurations of devices, including, but not limited to, those having no UI, microphones in different locations, multiple microphone arrays positioned in different arrangements, and/or any other configuration as appropriate to the requirements of a given application. For example, UIs and/or microphone arrays can be implemented in other playback devices and/or computing devices rather than those described herein. Further, although a specific example of playback device 102 is described with reference to MPS 100, one skilled in the art will recognize that playback devices as described herein can be used in a variety of different environments, including (but not limited to) environments with more and/or fewer elements, without departing from this invention. Likewise, MPS's as described herein can be used with various different playback devices.

By way of illustration, SONOS, Inc. presently offers (or has offered) for sale certain playback devices that may implement certain of the embodiments disclosed herein, including a "SONOS ONE," "PLAY:1," "PLAY:3," "PLAY: 5," "PLAYBAR," "AMP," "CONNECT:AMP," "PLAYBASE," "BEAM," "CONNECT," and "SUB." Any other past, present, and/or future playback devices may additionally or alternatively be used to implement the playback devices of example embodiments disclosed herein. Additionally, it should be understood that a playback device is not limited to the examples illustrated in FIG. 2A, 2B, 2C, or 2D or to the SONOS product offerings. For example, a playback device may be integral to another device or component such as a television, a lighting fixture, or some other device for indoor or outdoor use.

b. Example Playback Device Configurations

Figure 3B:
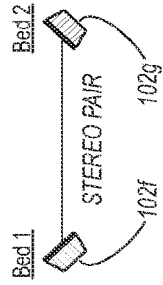
FIGS. 3A-3E are diagrams showing example playback device configurations in accordance with aspects of the disclosure.
Figure 3C:
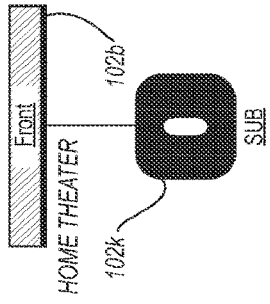
Figure 3D:
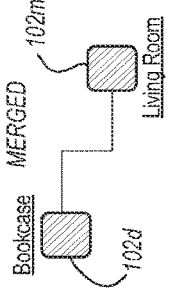
Figure 3E:
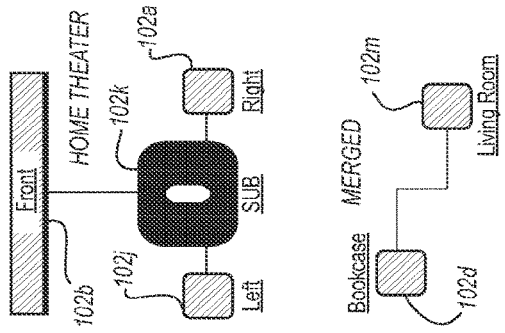
Figure 3A:
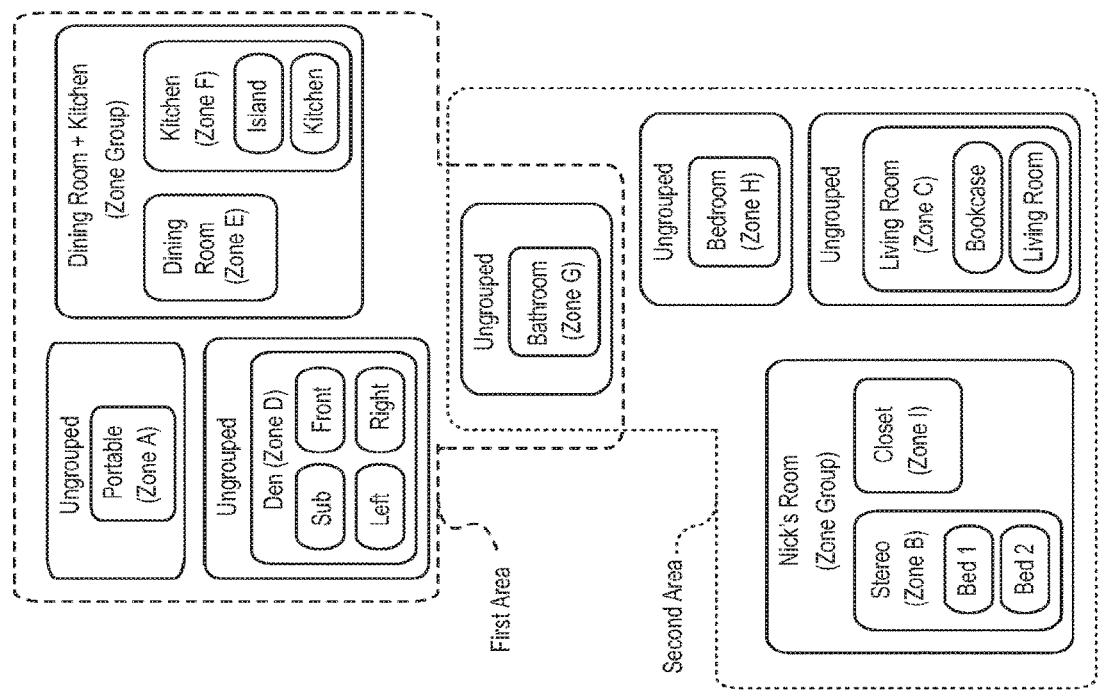

FIGS. 3A-3E show example configurations of playback devices. Referring first to FIG. 3A, in some example instances, a single playback device may belong to a zone. For example, the playback device 102c (FIG. 1A) on the Patio may belong to Zone A. In some implementations described below, multiple playback devices may be "bonded" to form a "bonded pair," which together form a single zone. For example, the playback device 102f (FIG. 1A) named "Bed 1" in FIG. 3A may be bonded to the playback device 102g (FIG. 1A) named "Bed 2" in FIG. 3A to form Zone B. Bonded playback devices may have different playback responsibilities (e.g., channel responsibilities). In another implementation described below, multiple playback devices may be merged to form a single zone. For example, the playback device 102d named "Bookcase" may be merged with the playback device 102*m* named "Living Room" to form a single Zone C. The merged playback devices 102*d* and 102*m* may not be specifically assigned different playback responsibilities. That is, the merged playback devices 102*d* and 102*m* may, aside from playing audio content in synchrony, each play audio content as they would if they were not merged.

For purposes of control, each zone in the MPS 100 may be represented as a single user interface ("UI") entity. For example, as displayed by the controller devices 104, Zone A may be provided as a single entity named "Portable," Zone B may be provided as a single entity named "Stereo," and Zone C may be provided as a single entity named "Living Room."

In various embodiments, a zone may take on the name of one of the playback devices belonging to the zone. For example, Zone C may take on the name of the Living Room device 102*m* (as shown). In another example, Zone C may instead take on the name of the Bookcase device 102*d*. In a further example, Zone C may take on a name that is some combination of the Bookcase device 102*d* and Living Room device 102*m*. The name that is chosen may be selected by a user via inputs at a controller device 104. In some embodiments, a zone may be given a name that is different than the device(s) belonging to the zone. For example, Zone B in FIG. 3A is named "Stereo" but none of the devices in Zone B have this name. In one aspect, Zone B is a single UI entity representing a single device named "Stereo," composed of constituent devices "Bed 1" and "Bed 2." In one implementation, the Bed 1 device may be playback device 102*f* in the master bedroom 101*h* (FIG. 1A) and the Bed 2 device may be the playback device 102*g* also in the master bedroom 101*h* (FIG. 1A).

As noted above, playback devices that are bonded may have different playback responsibilities, such as playback responsibilities for certain audio channels. For example, as shown in FIG. 3B, the Bed 1 and Bed 2 devices 102*f* and 102*g* may be bonded so as to produce or enhance a stereo effect of audio content. In this example, the Bed 1 playback device 102*f* may be configured to play a left channel audio component, while the Bed 2 playback device 102*g* may be configured to play a right channel audio component. In some implementations, such stereo bonding may be referred to as "pairing."

Additionally, playback devices that are configured to be bonded may have additional and/or different respective speaker drivers. As shown in FIG. 3C, the playback device 102*b* named "Front" may be bonded with the playback device 102*k* named "SUB." The Front device 102*b* may render a range of mid to high frequencies, and the SUB device 102*k* may render low frequencies as, for example, a subwoofer. When unbonded, the Front device 102*b* may be configured to render a full range of frequencies. As another example, FIG. 3D shows the Front and SUB devices 102*b* and 102*k* further bonded with Right and Left playback devices 102*a* and 102*j*, respectively. In some implementations, the Right and Left devices 102*a* and 102*j* may form surround or "satellite" channels of a home theater system. The bonded playback devices 102*a*, 102*b*, 102*j*, and 102*k* may form a single Zone D (FIG. 3A).

In some implementations, playback devices may also be "merged." In contrast to certain bonded playback devices, playback devices that are merged may not have assigned playback responsibilities, but may each render the full range of audio content that each respective playback device is capable of. Nevertheless, merged devices may be represented as a single UI entity (i.e., a zone, as discussed above).

For instance, FIG. 3E shows the playback devices 102*d* and 102*m* in the Living Room merged, which would result in these devices being represented by the single UI entity of Zone C. In one embodiment, the playback devices 102*d* and 102*m* may playback audio in synchrony, during which each outputs the full range of audio content that each respective playback device 102*d* and 102*m* is capable of rendering.

In some embodiments, a stand-alone NMD may be in a zone by itself. For example, the NMD 103*h* from FIG. 1A is named "Closet" and forms Zone I in FIG. 3A. An NMD may also be bonded or merged with another device so as to form a zone. For example, the NMD device 103*f* named "Island" may be bonded with the playback device 102*i* Kitchen, which together form Zone F, which is also named "Kitchen." Additional details regarding assigning NMDs and playback devices as designated or default devices may be found, for example, in previously referenced U.S. Patent Publication No. 2017-0242653. In some embodiments, a stand-alone NMD may not be assigned to a zone.

Zones of individual, bonded, and/or merged devices may be arranged to form a set of playback devices that playback audio in synchrony. Such a set of playback devices may be referred to as a "group," "zone group," "synchrony group," or "playback group." In response to inputs provided via a controller device 104, playback devices may be dynamically grouped and ungrouped to form new or different groups that synchronously play back audio content. For example, referring to FIG. 3A, Zone A may be grouped with Zone B to form a zone group that includes the playback devices of the two zones. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234,395. Grouped and bonded devices are example types of associations between portable and stationary playback devices that may be caused in response to a trigger event, as discussed above and described in greater detail below.

In various implementations, the zones in an environment may be assigned a particular name, which may be the default name of a zone within a zone group or a combination of the names of the zones within a zone group, such as "Dining Room+Kitchen," as shown in FIG. 3A. In some embodiments, a zone group may be given a unique name selected by a user, such as "Nick's Room," as also shown in FIG. 3A. The name "Nick's Room" may be a name chosen by a user over a prior name for the zone group, such as the room name "Master Bedroom."

Referring back to FIG. 2A, certain data may be stored in the memory 213 as one or more state variables that are periodically updated and used to describe the state of a playback zone, the playback device(s), and/or a zone group associated therewith. The memory 213 may also include the data associated with the state of the other devices of the media playback system 100, which may be shared from time to time among the devices so that one or more of the devices have the most recent data associated with the system.

In some embodiments, the memory 213 of the playback device 102 may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, in FIG. 1A, identifiers associated with the Patio may indicate that the Patio is the only playback device of a particular zone and not in a zone group. Identifiers associated with the Living Room may indicate that the Living Room is not grouped with other zones but includes bonded playback devices 102a, 102b, 102j, and 102k. Identifiers associated with the Dining Room may indicate that the Dining Room is part of Dining Room+Kitchen group and that devices 103f and 102i are bonded. Identifiers associated with the Kitchen may indicate the same or similar information by virtue of the Kitchen being part of the Dining Room+Kitchen zone group. Other example zone variables and identifiers are described below.

In yet another example, the MPS 100 may include variables or identifiers representing other associations of zones and zone groups, such as identifiers associated with Areas, as shown in FIG. 3A. An Area may involve a cluster of zone groups and/or zones not within a zone group. For instance, FIG. 3A shows a first area named "First Area" and a second area named "Second Area." The First Area includes zones and zone groups of the Patio, Den, Dining Room, Kitchen, and Bathroom. The Second Area includes zones and zone groups of the Bathroom, Nick's Room, Bedroom, and Living Room. In one aspect, an Area may be used to invoke a cluster of zone groups and/or zones that share one or more zones and/or zone groups of another cluster. In this respect, such an Area differs from a zone group, which does not share a zone with another zone group. Further examples of techniques for implementing Areas may be found, for example, in U.S. Patent Publication No. 2018-0107446 published Apr. 19, 2018 and titled "Room Association Based on Name," and U.S. Pat. No. 8,483,853 filed Sep. 11, 2007, and titled "Controlling and manipulating groupings in a multi-zone media system," each of which is incorporated herein by reference in its entirety. In some embodiments, the MPS 100 may not implement Areas, in which case the system may not store variables associated with Areas.

The memory 213 may be further configured to store other data. Such data may pertain to audio sources accessible by the playback device 102 or a playback queue that the playback device (or some other playback device(s)) may be associated with. In embodiments described below, the memory 213 is configured to store a set of command data for selecting a particular VAS when processing voice inputs.

During operation, one or more playback zones in the environment of FIG. 1A may each be playing different audio content. For instance, the user may be grilling in the Patio zone and listening to hip hop music being played by the playback device 102c, while another user may be preparing food in the Kitchen zone and listening to classical music being played by the playback device 102i. In another example, a playback zone may play the same audio content in synchrony with another playback zone. For instance, the user may be in the Office zone where the playback device 102n is playing the same hip-hop music that is being playing by playback device 102c in the Patio zone. In such a case, playback devices 102c and 102n may be playing the hip-hop in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the MPS 100 may be dynamically modified. As such, the MPS 100 may support numerous configurations. For example, if a user physically moves one or more playback devices to or from a zone, the MPS 100 may be reconfigured to accommodate the change(s). For instance, if the user physically moves the playback device 102c from the Patio zone to the Office zone, the Office zone may now include both the playback devices 102c and 102n. In some cases, the user may pair or group the moved playback device 102c with the Office zone and/or rename the players in the Office zone using, for example, one of the controller devices 104 and/or voice input. As another example, if one or more playback devices 102 are moved to a particular space in the home environment that is not already a playback zone, the moved playback device(s) may be renamed or associated with a playback zone for the particular space.

Further, different playback zones of the MPS 100 may be dynamically combined into zone groups or split up into individual playback zones. For example, the Dining Room zone and the Kitchen zone may be combined into a zone group for a dinner party such that playback devices 102i and 102l may render audio content in synchrony. As another example, bonded playback devices in the Den zone may be split into (i) a television zone and (ii) a separate listening zone. The television zone may include the Front playback device 102b. The listening zone may include the Right, Left, and SUB playback devices 102a, 102j, and 102k, which may be grouped, paired, or merged, as described above. Splitting the Den zone in such a manner may allow one user to listen to music in the listening zone in one area of the living room space, and another user to watch the television in another area of the living room space. In a related example, a user may utilize either of the NMD 103a or 103b (FIG. 1B) to control the Den zone before it is separated into the television zone and the listening zone. Once separated, the listening zone may be controlled, for example, by a user in the vicinity of the NMD 103a, and the television zone may be controlled, for example, by a user in the vicinity of the NMD 103b. As described above, however, any of the NMDs 103 may be configured to control the various playback and other devices of the MPS 100.

c. Example Controller Devices

FIG. 4A is a functional block diagram illustrating certain aspects of a selected one of the controller devices 104 of the MPS 100 of FIG. 1A. Controller devices in accordance with several embodiments of the invention can be used in various systems, such as (but not limited to) an MPS as described in FIG. 1A. Such controller devices may also be referred to herein as a "control device" or "controller." The controller device shown in FIG. 4A may include components that are generally similar to certain components of the network devices described above, such as a processor 412, memory 413 storing program software 414, at least one network interface 424, and one or more microphones 422. In one example, a controller device may be a dedicated controller for the MPS 100. In another example, a controller device may be a network device on which media playback system controller application software may be installed, such as for example, an iPhone™, iPad™ or any other smart phone, tablet, or network device (e.g., a networked computer such as a PC or Mac™).

The memory 413 of the controller device 104 may be configured to store controller application software and other data associated with the MPS 100 and/or a user of the system 100. The memory 413 may be loaded with instructions in software 414 that are executable by the processor 412 to achieve certain functions, such as facilitating user access, control, and/or configuration of the MPS 100. The controller device 104 may be configured to communicate with other network devices via the network interface 424, which may take the form of a wireless interface, as described above.

In one example, system information (e.g., such as a state variable) may be communicated between the controller device 104 and other devices via the network interface 424. For instance, the controller device 104 may receive playback zone and zone group configurations in the MPS 100 from a playback device, an NMD, or another network device. Likewise, the controller device 104 may transmit such system information to a playback device or another network device via the network interface 424. In some cases, the other network device may be another controller device.

The controller device 104 may also communicate playback device control commands, such as volume control and audio playback control, to a playback device via the network interface 424. As suggested above, changes to configurations of the MPS 100 may also be performed by a user using the controller device 104. The configuration changes may include adding/removing one or more playback devices to/from a zone, adding/removing one or more zones to/from a zone group, forming a bonded or merged player, separating one or more playback devices from a bonded or merged player, among others.

As shown in FIG. 4A, the controller device 104 may also include a user interface 440 that is generally configured to facilitate user access and control of the MPS 100. The user interface 440 may include a touch-screen display or other physical interface configured to provide various graphical controller interfaces, such as the controller interfaces 440a and 440b shown in FIGS. 4B and 4C. Referring to FIGS. 4B and 4C together, the controller interfaces 440a and 440b include a playback control region 442, a playback zone region 443, a playback status region 444, a playback queue region 446, and a sources region 448. The user interface as shown is just one example of an interface that may be provided on a network device, such as the controller device shown in FIG. 4A, and accessed by users to control a media playback system, such as the MPS 100. Other user interfaces of varying formats, styles, and interactive sequences may alternatively be implemented on one or more network devices to provide comparable control access to a media playback system.

The playback control region 442 (FIG. 4B) may include selectable icons (e.g., by way of touch or by using a cursor) that, when selected, cause playback devices in a selected playback zone or zone group to play or pause, fast forward, rewind, skip to next, skip to previous, enter/exit shuffle mode, enter/exit repeat mode, enter/exit cross fade mode, etc. The playback control region 442 may also include selectable icons that, when selected, modify equalization settings and/or playback volume, among other possibilities.

The playback zone region 443 (FIG. 4C) may include representations of playback zones within the MPS 100. The playback zones regions 443 may also include a representation of zone groups, such as the Dining Room+Kitchen zone group, as shown. In some embodiments, the graphical representations of playback zones may be selectable to bring up additional selectable icons to manage or configure the playback zones in the MPS 100, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the MPS 100 to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface are also possible. The representations of playback zones in the playback zone region 443 (FIG. 4C) may be dynamically updated as playback zone or zone group configurations are modified.

The playback status region 444 (FIG. 4B) may include graphical representations of audio content that is presently being played, previously played, or scheduled to play next in the selected playback zone or zone group. The selected playback zone or zone group may be visually distinguished on a controller interface, such as within the playback zone region 443 and/or the playback status region 444. The graphical representations may include track title, artist name, album name, album year, track length, and/or other relevant information that may be useful for the user to know when controlling the MPS 100 via a controller interface.

The playback queue region 446 may include graphical representations of audio content in a playback queue associated with the selected playback zone or zone group. In some embodiments, each playback zone or zone group may be associated with a playback queue comprising information corresponding to zero or more audio items for playback by the playback zone or zone group. For instance, each audio item in the playback queue may comprise a uniform resource identifier (URI), a uniform resource locator (URL), or some other identifier that may be used by a playback device in the playback zone or zone group to find and/or retrieve the audio item from a local audio content source or a networked audio content source, which may then be played back by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streamed audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue or may be associated with a new playback queue that is empty or contains audio items from the playback queue associated with the established zone group before the established zone group was ungrouped. Similarly, the resulting second playback zone may be re-associated with the previous second playback queue or may be associated with a new playback queue that is empty or contains audio items from the playback queue associated with the established zone group before the established zone group was ungrouped. Other examples are also possible.

With reference still to FIGS. 4B and 4C, the graphical representations of audio content in the playback queue region 446 (FIG. 4B) may include track titles, artist names, track lengths, and/or other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device. Playback of such a playback queue may involve one or more playback devices playing back media items of the queue, perhaps in sequential or random order.

The sources region 448 may include graphical representations of selectable audio content sources and/or selectable voice assistants associated with a corresponding VAS. The VASes may be selectively assigned. In some examples, multiple VASes, such as AMAZON's Alexa, MICROSOFT's Cortana, etc., may be invokable by the same NMD. In some embodiments, a user may assign a VAS exclusively to one or more NMDs. For example, a user may assign a first VAS to one or both of the NMDs 102*a* and 102*b* in the Living Room shown in FIG. 1A, and a second VAS to the NMD 103*f* in the Kitchen. Other examples are possible.

d. Example Audio Content Sources

The audio sources in the sources region 448 may be audio content sources from which audio content may be retrieved and played by the selected playback zone or zone group. One or more playback devices in a zone or zone group may be configured to retrieve for playback audio content (e.g., according to a corresponding URI or URL for the audio content) from a variety of available audio content sources. In one example, audio content may be retrieved by a playback device directly from a corresponding audio content source (e.g., via a line-in connection). In another example, audio content may be provided to a playback device over a network via one or more other playback devices or network devices. As described in greater detail below, in some embodiments, audio content may be provided by one or more media content services.

Example audio content sources may include a memory of one or more playback devices in a media playback system such as the MPS 100 of FIG. 1, local music libraries on one or more network devices (e.g., a controller device, a network-enabled personal computer, or a networked-attached storage ("NAS")), streaming audio services providing audio content via the Internet (e.g., cloud-based music services), or audio sources connected to the media playback system via a line-in input connection on a playback device or network device, among other possibilities.

In some embodiments, audio content sources may be added or removed from a media playback system such as the MPS 100 of FIG. 1A. In one example, an indexing of audio items may be performed whenever one or more audio content sources are added, removed, or updated. Indexing of audio items may involve scanning for identifiable audio items in all folders/directories shared over a network accessible by playback devices in the media playback system and generating or updating an audio content database comprising metadata (e.g., title, artist, album, track length, among others) and other associated information, such as a URI or URL for each identifiable audio item found. Other examples for managing and maintaining audio content sources may also be possible.

III. Example Distributed Processing Architectures

Figure 5:
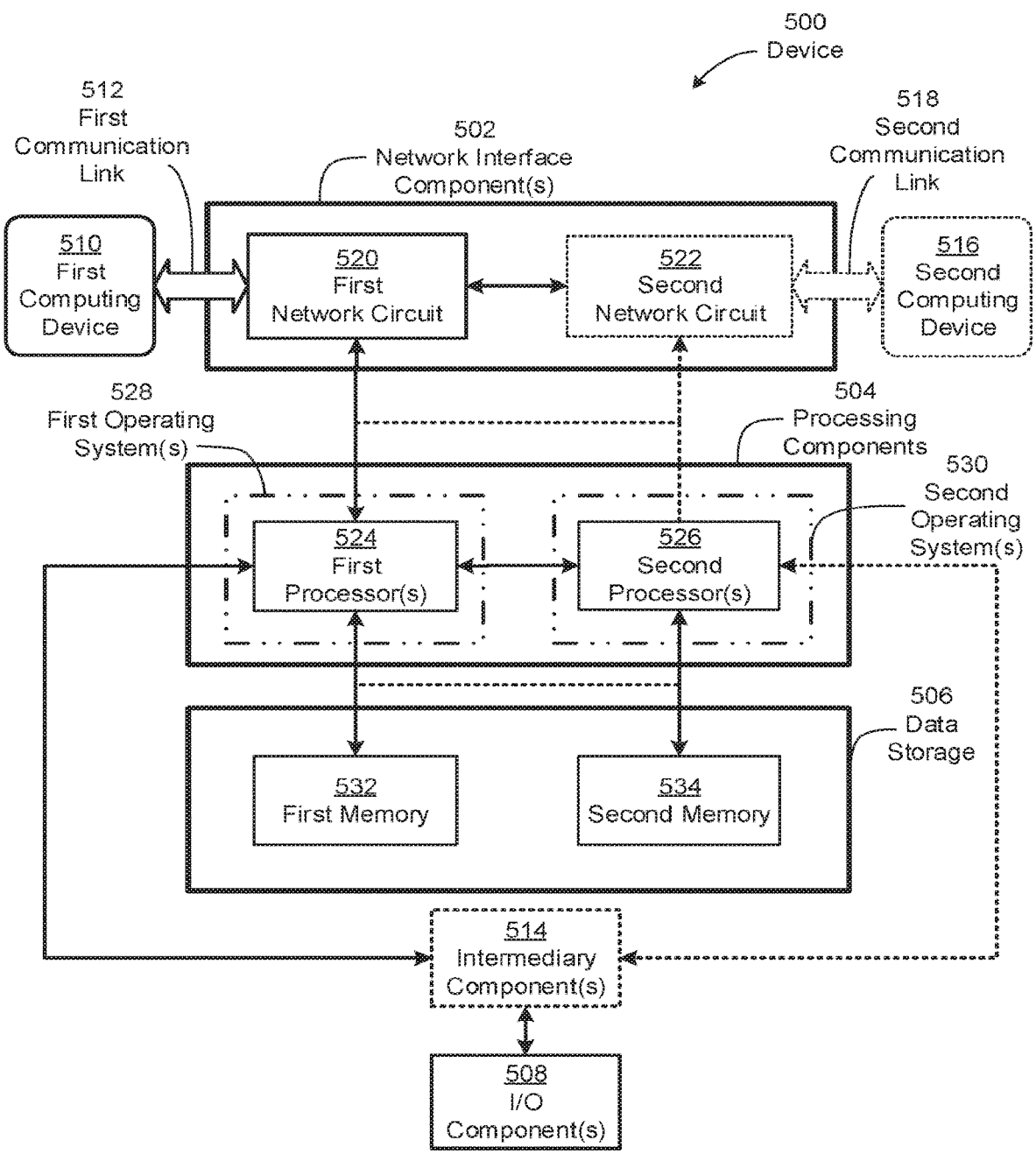
FIG. 5 is a functional block diagram of certain components of an example device employing a distributed processing architecture in accordance with aspects of the disclosure.

As discussed above, a distributed processor architecture may be employed in devices, such as playback devices or other IoT devices, to significantly reduce power consumption. For example, a high-power processor that executes a GPOS may be employed, in at least some respects, as a co-processor to a less powerful (and less power hungry) processor executing an SPOS. As a result, the high-power processor can be completely powered off in situations where the functionality of the high-power processor is not needed without interrupting other operations, such as reading one or more capacitive touch sensors to detect audio playback commands, obtaining audio content via BLUETOOTH, and/or playing back the audio content. An example of a device employing such a distributed processing architecture is shown in FIG. 5 by device 500. The device 500 may be implemented as any of a variety of devices including any of the devices described herein (e.g., playback devices, NMDs, IoT devices, etc.).

As shown in FIG. 5, the device 500 comprises network interface component(s) 502 to facilitate communication with external devices. The network interface component(s) 502 include a first network circuit 520 to facilitate communication with a first computing device 510 over a first communication link 512 and may further include a second network circuit 522 to facilitate communication with a second computing device 516 over a second communication link 518. The device 500 further includes processing components 504 that are coupled to the network interface component(s) 502. The processing components 504 include first processor(s) 524 that execute first operating system(s) 528 and second processor(s) 526 that execute second operating system(s) 530. The processing components 504 may execute instructions stored in data storage 506 that may comprise a first memory 532 and a second memory 534. The processing components 504 may communicate with (and/or control) electronic component(s) 508 directly or via intermediary component(s) 514.

The network interface component(s) 502 may facilitate wireless communication to one or more external devices shown as the first computing device 510 and the second computing device 516. The network interface component(s) 502 may comprise the first network circuit 520 that enables communication over the first communication link 512 using a first communication protocol and a second network circuit 522 that enables communication over the second communication link 518 using a second, different communication protocol. For example, the first network circuit 520 may enable communication using an IEEE 802 protocol and/or a cellular network protocol while the second network circuit 522 may enable communication using another protocol, such as a BLUETOOTH protocol. Thus, the network interface component(s) 502 may enable communication (e.g., simultaneous communication) with multiple computing devices using different communication protocols.

In some embodiments, the first network circuit 520 may be implemented as a WIFI circuit (e.g., comprising a WIFI transceiver) that is configured to communicate with the first computing device 510 over a WIFI network. In these embodiments, the first computing device 510 may be, for example, a network router and/or a computing device that is accessible over the Internet (e.g., a cloud server). Additionally (or alternatively), the second network circuit 522 may be implemented as a BLUETOOTH circuit (e.g., comprising a BLUETOOTH transceiver) that is configured to communicate with the second computing device 516 using a BLUETOOTH connection. In such instances, the second computing device 516 may be, for example, a portable computing device such as a smartphone or a tablet.

The network circuits 520 and 522 may comprise one or more network processors that execute instructions stored in a memory that cause the network circuits 520 and 522 to perform various operations. For example, the network circuits 520 and 522 may each comprise a read-only memory (ROM) that stores firmware that may be executed by the one or more network processors. Examples of ROM include programmable read-only memory (PROM), erasable programmable read-only memory (EPROM), and electrically erasable programmable read-only memory (EEPROM). Additionally (or alternatively), the network circuits 520 and 522 may comprise a read-write memory (e.g., a memory that is both readable and writable) that stores instructions that may be executed by the one or more network processors.

It should be appreciated that the network interface component(s) 502 may be implemented as one or more circuit dies. For example, the network interface component(s) 502 may be implemented as a single circuit die. In another example, the first network circuit 510 may be implemented as a first circuit die and the second network circuit 522 may be implemented as a second circuit die. Further, the network interface component(s) 502 may comprise more (or fewer) network circuits that facilitate communication over more (or fewer) communication protocols. For example, the network interface component(s) 502 may comprise three network circuits including a first network circuit configured to facilitate communication over at least one WLAN (e.g., a WIFI network), a second network circuit configured to facilitate communication over at least one PAN (e.g., a BLUETOOTH network), and a third network circuit configured to facilitate communication over a cellular network (e.g., a 4G network, an LTE network, and/or a 5G network). Thus, the network interface component(s) 502 may be implemented in any of a variety of ways.

The processing components 504 may be coupled to the network interface component(s) 502 and configured to control one or more aspects of the operation of the device 500. The processing components 504 may comprise first processor(s) 524 and second processor(s) 526. The first processor(s) 524 may have a different construction than the second processor(s) 526. Additionally, the first processor(s) 524 may execute first operating system(s) 528 while the second processors 526 may execute second operating system(s) 530 that are different from the first operating system(s) 528.

In some embodiments, the first processor(s) 501 may not be configured to support virtualized memory and the first operating system(s) 528 may comprise an operating system that does not require support for virtualized memory, such as a RTOS or other SPOS. For example, the first processor(s) 524 may not comprise a memory management unit (MMU) configured to translate virtual memory addresses to physical addresses. In these embodiments, the first processor(s) 524 may comprise a general-purpose processor (GPP), such as a reduced instruction set computer (RISC) processor, and/or a single-purpose processor (SPP), such as a DSP, a graphics processing unit (GPU), or a neural processing unit (NPU). For example, the first processor(s) 524 may comprise a RISC processor and a DSP. Example GPPs that do not support virtualized memory include ARM CORTEX-M series processors (e.g., CORTEX-M0, CORTEX-M0+, CORTEX-M1, CORTEX-M3, CORTEX-M4, CORTEX-M7, CORTEX-M23, CORTEX-M33, and CORTEX-M35P processors). Example SPPs that do not support virtualized memory include TENSILICA HIFI DSPs (e.g., HIFI MINI, HIFI 3, HIFI 3z, HIFI 4, and HIFI 5 DSPs).

In some embodiments, the second processor(s) 526 may be configured to support virtualized memory and the second operating system(s) 530 may comprise an operating system that at least partially employs virtualized memory, such as a GPOS. For example, the second processor(s) 526 may comprise a memory management unit (MMU) configured to translate virtual memory addresses to physical addresses. In these embodiments, the second processor(s) 526 may comprise a GPP. Example GPPs that support virtualized memory include application processors such as ARM CORTEX-A series processors (e.g., CORTEX-A5, CORTEX-A7, CORTEX-A8, CORTEX-A9, CORTEX-A12, CORTEX-A15, CORTEX-A17, CORTEX-A32, CORTEX-A35, CORTEX-A53, CORTEX-A57, CORTEX-A72. CORTEX-A73, CORTEX-A75, CORTEX-A76 processors).

One or more of the processors in the plurality of processing components 504 (e.g., first processor(s) 524 and/or second processor(s) 526) may have a plurality of power states including an awake state and one or more low-power states (e.g., one or more sleep states such as a light sleep state and a deep sleep state). In an awake state, the processor may be capable of executing instructions, power may be maintained to the processor caches (e.g., L1, L2, and/or L3 caches), and the clocks may be on (e.g., core clock, bus clock, etc.). In light sleep states, the power consumption may be reduced relative to the awake states by, for example, turning off (or lowering the frequency of) one or more clocks while maintaining power to the processor caches. Thus, light sleep states may offer some power consumption reduction relative to awake states while still being able to transition to awake states expeditiously. In deep sleep states, the power consumption may be reduced relative to the light sleep states by, for example, both turning off one or more clocks and powering down one or more processor caches. Deep sleep states may include those states where the processor is entirely powered off. Thus, deep sleep states may offer an additional power consumption reduction relative to light sleep states and require additional time to transition to awake states relative to light sleep states.

Given that the first processor(s) 524 may have a different construction that the second processor(s) 526, the first processor(s) 524 may have a different peak power consumption (e.g., power consumption under full load) than the second processor(s) 526. For example, the first processor(s) 524 may have a lower peak power consumption than the second processor(s) 526. The difference in power consumption may arise at least in part from the increased complexity of the second processor(s) 526 to provide, for example, virtual memory support. Thus, in some embodiments, operations are distributed between the first processor(s) 524 and the second processor(s) 526 such that only those operations that cannot be practically performed by the first processor(s) 524 are performed by the second processor(s) 526. In these embodiments, the first processor(s) 524 may cause the second processor(s) 526 to remain in a low-power state until a particular operation needs to be performed that requires the second processor(s) 526. As a result, the second processor(s) 526 may, in at least some respects (and/or situations), function as one or more co-processors to the first processor(s) 524.

The data storage 506 may comprise, for example, one or more tangible, non-transitory, computer-readable media configured to store instructions that are executable by the processing components 504. The data storage 506 may comprise any combination of volatile memory (e.g., a memory that only maintains data while powered) and non-volatile memory (e.g., a memory that maintains data even after being power cycled). Examples of volatile memory include random-access memory (RAM) such as static random-access memory (SRAM) and dynamic random-access memory (DRAM). Examples of non-volatile memory include flash memory, such as NOR flash memory and NAND flash memory, disk drives, and magnetic tape.

The data storage 506 may comprise a first memory 532 and a second memory 534. In some embodiments, the first memory 532 may be only directly accessible by the first processor(s) 524 (and thus not be directly accessible by the second processor(s) 526) and the second memory 534 may be only directly accessible by the second processor(s) 526 (and thus not be directly accessible by the first processor(s) 524). In these embodiments, the first and second processor(s) 524 and 526, respectively, may share information via one or more communication buses, such as a SPI bus. In other embodiments, at least one of the first memory 532 and the second memory 534 may be a shared memory that is directly accessible by both the first processor(s) 524 and the second processor(s) 526. In these embodiments, the first and second processor(s) 524 and 526, respectively, may share information by storing the information to be shared in the shared memory. Additionally (or alternatively), the first and second processor(s) 524 and 526, respectively, may share information via one or more communication buses.

It should be appreciated that the processing components 504 and the data storage 506 may be implemented in any of a variety of ways. In some embodiments, each of the first processor(s) 524 are separate and distinct from the second processor(s) 526. For example, the first processor(s) 524 may combined with at least part of the first memory 532 in a first system-on-chip (SoC) and the second processor(s) 526 may be combined with at least part of the second memory 534 in a second SoC that is separate from the first SoC. In other embodiments, the first processor(s) 524 may be combined with the second processor(s) 526 in a single circuit die. For example, the first processor(s) 524, the one or more circuit processors 526, at least part of the first memory 532, and at least part of the second memory 534 may be integrated into a single SoC. Thus, the processing components 504 and the data storage 506 may be implemented in any number of circuit dies.

The electronic component(s) 508 may comprise any of a variety of components that the processing components 504 may control or otherwise communicate with. Examples of such components include: a display, an electric motor, a heating element, a switch, a speaker, a light, and a sensor (e.g., a microphone, a capacitive touch sensor, an infrared light sensor, etc.). The implementation of the electronic component(s) 508 may vary based on the particular function of the device 500. For example, the device 500 may be a playback device and the electronic component(s) 508 may comprise a speaker for sound reproduction and one or more capacitive touch sensors for detection of audio playback commands (e.g., play/pause, increase volume, decrease volume, etc.).

Some electronic component(s) 508 may not directly interface with the processing components 504. Instead, these electronic component(s) 508 may interface with the processing components 504 via intermediary component(s) 514. For example, the electronic component(s) 508 may comprise a capacitive touch sensor that the processing components 504 may not be able to directly read. In this example, the intermediary component(s) 514 may comprise a programmable SoC (PSoC) that is configured to read the capacitive touch sensor and provide an output over a communication bus (e.g., an I2C bus) that may be received by the processing components 504. Other example intermediary component(s) 514 include audio codecs and amplifiers (e.g., class D audio amplifiers).

In some embodiments, only the first processor(s) 528 communicate (e.g., is communicatively coupled) with the intermediary component(s) 514 and/or the electronic component(s) 508. Thus, the second processor(s) 526 may not directly communication with the intermediary component(s) 514 and/or electronic component(s) 508. By routing all communication with the intermediary component(s) 514 and/or the electronic component(s) 508 through the first processor(s) 524, the second processor(s) 526 may be completely turned off without interfering with such communication. For example, the first processor(s) 528 may communicate with intermediary component(s) 514 over an I2C bus that is not directly accessible by the second processor(s) 526 (e.g., the second processor(s) 526 cannot directly transmit and/or receive data over the I2C bus). In other embodiments, both the first processor(s) 528 and the second processor(s) 526 can communicate (e.g., are communicatively coupled) with the intermediary component(s) 514 and/or the electronic component(s) 508.

In some embodiments, the second processor(s) 526 may be booted before the first processor(s) 524. For example, the second processor(s) 526 may initially boot first and provide code to the first processor(s) 524 over a communication bus, such as a SPI bus, and/or a shared memory, such as a shared RAM. The first processor(s) 524 may boot upon receipt of the code from the second processor(s) 526. Once the first processor(s) 524 have completed booting, the second processor(s) 526 may be put in a low-power state should the second processor(s) 526 no longer be needed. In other embodiments, the first processor(s) 524 may be booted before second processor(s) 526.

It should be appreciated that the first processor(s) 524 may boot at least partially in parallel with the second processor(s) 526. For example, the second processor(s) 526 may start booting first and, during the boot process, cause the first processor(s) 524 to boot (e.g., via at least one trigger signal, by providing code to the first processor(s) 524, or any combination thereof). In this example, the second processor(s) 526 may complete the remainder of the boot process at least partially in parallel with the first processor(s) 524 booting. In another example, the first processor(s) 524 may start booting first and, during the boot process, cause the second processor(s) 526 to boot (e.g., via at least one trigger signal, by providing code to the second processor(s) 526, or any combination thereof). In this example, the first processor(s) 524 may complete the remainder of the boot process at least partially in parallel with the second processor(s) 526 booting.

It should be appreciated that one or more components may be omitted from the device 500 without departing from the scope of the present disclosure. In some embodiments, the device 500 may only communicate using a single protocol (or set of protocols), such as IEEE 802 protocols, and the second network circuit 522 that enables communication with the second computing device 516 may be omitted. Additionally (or alternatively), the electronic component(s) 508 in the device 500 may not need any of the intermediary component(s) 514. For example, the electronic component(s) 508 may only include components that may directly interface with the processing components 504. Thus, the intermediary component(s) 514 may be omitted.

In some embodiments, aspects of the distributed architecture shown in FIG. 5 may be distributed between two playback devices. In these embodiments, a first subset of the components shown in FIG. 5 may be integrated into a first playback device and a second subset of the components shown in FIG. 5 (which may or may not overlap with the components of the first subset) may be integrated into a second playback device (e.g., that may be communicatively coupled via a PAN, WLAN, or other connection to the first playback device). For example, a first playback device (e.g., a wearable device such as a headphone device and/or a hearable device) may comprise the first processor(s) 524 while a second playback device (e.g., a stationary playback device such as a soundbar) may comprise the second processor(s) 526. In this example, the first playback device may offload those intensive operations that may not be suitable for the first processor(s) 524 to the second playback device to be performed using the second processor(s) 526. By employing such an architecture, the power consumption of the first playback device may be advantageously kept very low (e.g., to maximize battery life) while still supporting complex operations when connected to the a common data network as the second playback device. Accordingly, the techniques described herein may be readily employed in a system of two or more devices (e.g., playback devices).

Figure 6:
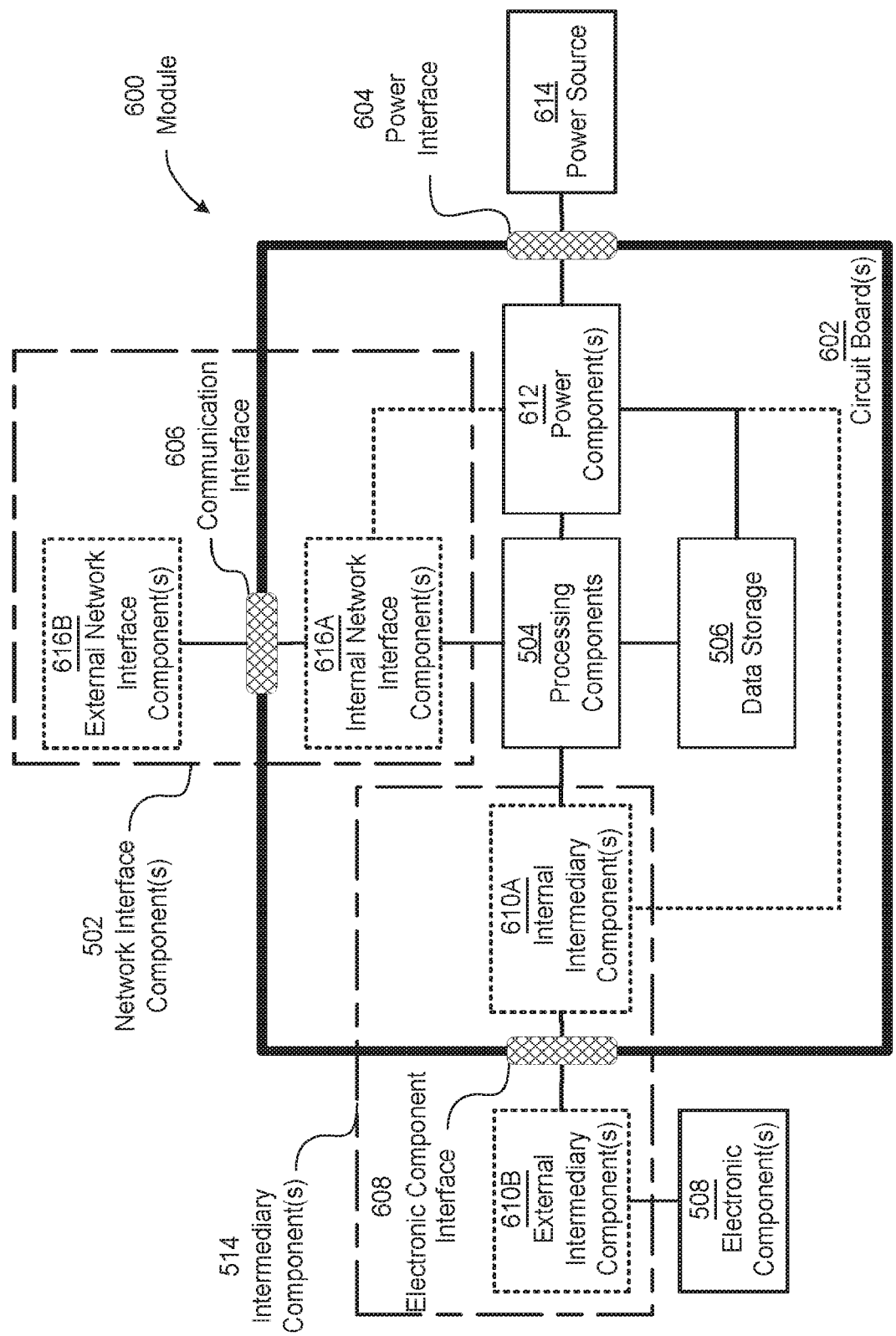
FIG. 6 is a functional block diagram of a module in accordance with aspects of the disclosure.

In some embodiments, aspects of the distributed architecture shown in FIG. 5 may be integrated into a module (e.g., a circuit board assembly such as a system-on-a-module (SoM)) for easy integration into a device. An example of such a module implementation is shown in FIG. 6 by module 600. As shown, the module 600 comprises circuit board(s) 602 onto which various components may be attached including processing components 504, data storage 506, and power component(s) 612. The network interface component(s) 502 may be partially integrated into the module 600. For example, internal network interface component(s) 616A may be mounted to the circuit board(s) 602 and communicate via communication interface 604 with external network interface component(s) 616B that are not attached to the circuit board(s) 602. Similarly, the intermediate components 514 may be partially integrated into the module 600. For example, internal intermediary components 610A may be mounted to the circuit board(s) 602 and communicate via electronic component interface 607 with external intermediary component(s) 616B that are not attached to the circuit board(s) 602.

The circuit board(s) 602 may comprise a substrate (e.g., an insulative substrate) and a plurality of conductive elements (e.g., circuit traces, pads, vias, etc.). The substrate may provide mechanical support for the components mounted to the circuit board(s) 602. The substrate may be a rigid substrate (e.g., to form a rigid circuit board) or a flexible substrate (e.g., to form a flexible circuit board). The plurality of conductive elements may be disposed on and/or integrated with the substrate to couple (e.g., electrically couple) components attached to the circuit board(s) 602.

The power component(s) 612 may distribute power to one or more other components of the module 600 (e.g., other components attached to the circuit board(s) 602). The power component(s) 614 may perform, for example, any combination of the following operations: (1) DC/DC conversion, (2) battery charging, and (3) power sequencing. The power component(s) 614 may be implemented as, for example, a power management integrated circuit (PMIC). The power component(s) 612 may receive power from a power source 614 via a power interface 604. The power source 614 may comprise an internal power source, such as a battery, and/or an external power source, such as a wall outlet. The power interface 604 may comprise one or more ports (e.g., one or more electrical connectors attached to the circuit board(s) 602) where the module 600 may be coupled (e.g., electrically coupled) to the power source 614.

The processing components 504 and the data storage 506 may be attached to the circuit 602 in a variety of ways depending on, for example, how the processing components 504 and the data storage 506 are constructed. In some embodiments, the processing components 504 and the data storage 506 may be integrated into a single system-on-a-chip (SoC) that may be attached to the circuit board(s) 602. In other embodiments, the processing components 504 and the data storage 506 may be integrated into separate circuit dies that may be separately attached to the circuit board(s) 602 (e.g., and electrically coupled using circuit traces). For example, first processor(s) (e.g., first processor(s) 524) and a first portion of the data storage 506 (e.g., a volatile memory accessible by the first processor(s)) may be integrated into a first SoC, the second processor(s) (e.g., second processor(s) 526) and a second portion of the data storage 506 (e.g., a volatile memory accessible by the second processor(s)) may be integrated into a second SoC, and a remainder of the data storage 506 (e.g., a non-volatile memory accessible by the first and/or second processors) may be integrated into a separate memory integrated circuit (IC). In this example, each of the first SoC, the second SoC, and the memory IC may be attached to the circuit board(s) 602. Thus, the processing components 504 and the data storage 506 may be distributed between any number of ICs that may be attached to the circuit board(s) 602.

The network interface component(s) 502 may be distributed between the internal network interface component(s) 616A that may be attached to the circuit board(s) 602 and the external network interface component(s) 616B that may be external to the module 600. The internal network interface component(s) 616A may be coupled to the external network interface component(s) 616B via a communication interface 606. The communication interface 606 may comprise one or more ports (e.g., one or more electrical connectors attached to the circuit board(s) 602) where the module 600 may be coupled (e.g., electrically coupled) to the external network interface component(s) 616B. The particular way in which the network interface component(s) 502 are distributed may vary based on the particular implementation. In some embodiments, the internal network interface component(s) 616A may comprise one or more ICs to generate wireless signals including, for example, one or more wireless transceiver ICs (e.g., a WIFI transceiver IC, a BLUETOOTH transceiver IC, or a WIFI and BLUETOOTH transceiver IC, a cellular transceiver IC, etc.) while the external network interface component(s) 616B may comprise one or more components that radiate the wireless signal (e.g., one or more antennas). In other embodiments, all of the network interface component(s) 502 may be integrated into the internal network interface component(s) 616A and the communication interface 606 may be removed. In still yet other embodiments, all of the network interface component(s) 502 may integrated into the external network interface component(s) 616B and the communication interface 606 may couple the processing components to the external network interface component(s) 616B.

The intermediary component(s) 514 may be distributed between the internal intermediary component(s) 610A that may be attached to the circuit board(s) 602 and the external intermediary component 610B that may be external to the module 600. The internal intermediary component(s) 610A may be coupled to the external intermediary component 610B via an electronic component interface 608. The electronic component interface 608 may comprise one or more ports (e.g., one or more electrical connectors attached to the circuit board(s) 602) where the module 600 may be coupled (e.g., electrically coupled) to the external intermediary component(s) 610B. The particular way in which the intermediary component(s) 514 are distributed may vary based on the particular implementation. In some embodiments, all of the intermediary component(s) 514 may be integrated into the internal network interface component(s) 616A. For example, the internal intermediary component(s) 610A may comprise one or more audio amplifiers that are coupled (via the electronic component interface 608) to electronic component(s) 508, such as one or more speakers. In other embodiments, each of the internal intermediary component(s) 610A and the external intermediary component(s) 610B may comprise at least one component. In still yet other embodiments, all of the intermediary component(s) 514 may be integrated into the external network interface component(s) 616B.

It should be appreciated that the module 600 shown in FIG. 6 may be modified without departing from the scope of the present disclosure. In some embodiments, the power components 612 may be made external to the module 600. In this example, the power interface 604 may couple the external power components 612 to one or more components attached to the circuit board(s) 602 (e.g., the processing component 504 and/or the data storage 506).

IV. Example Power Management Techniques

Figure 7:
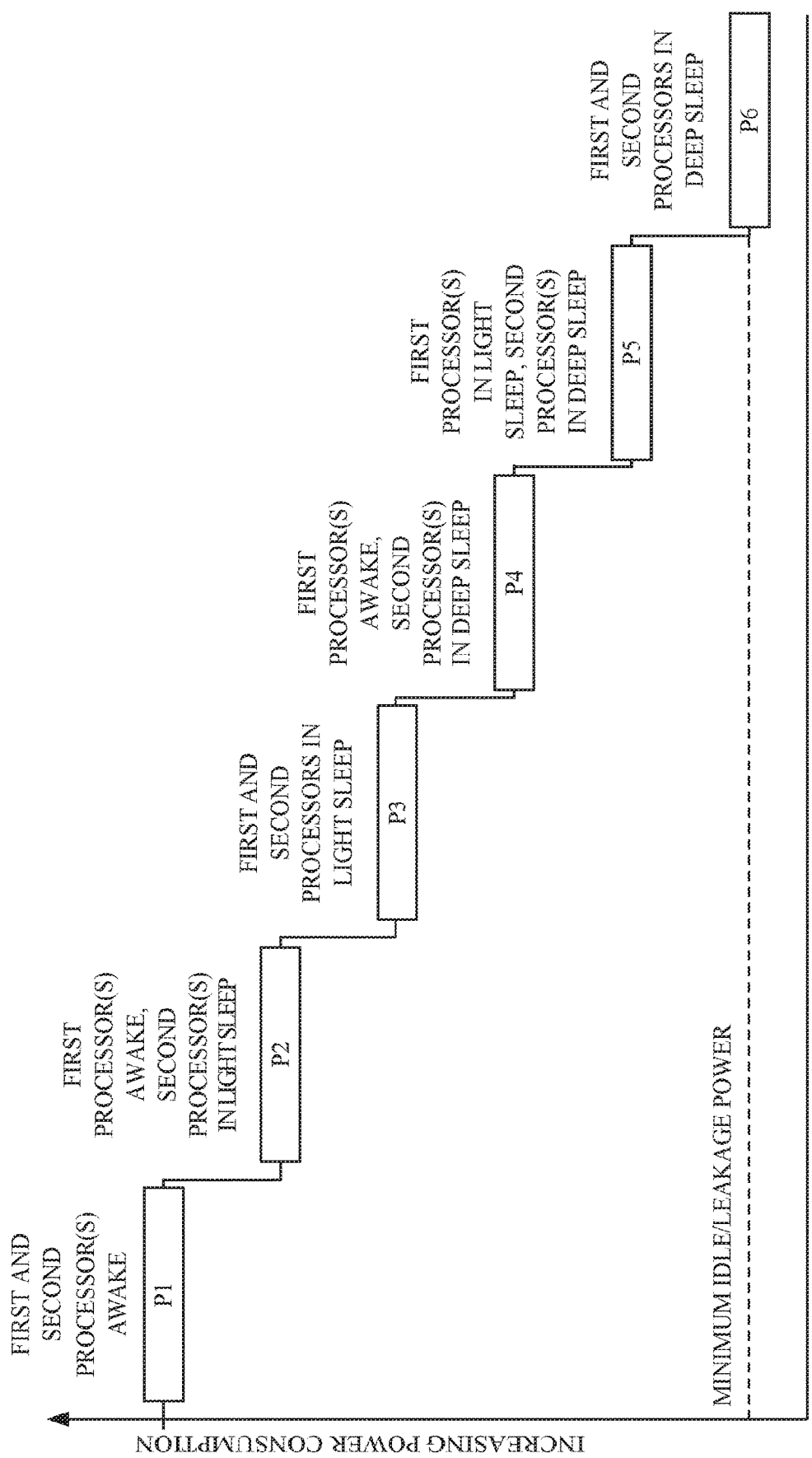
FIG. 7 illustrates power states through which the playback device transitions to facilitate lowering power consumption in accordance with aspects of the disclosure.

FIG. 7 illustrates examples of power states through which a playback device (e.g., employing at least some of the components shown in device 500 such as the plurality of processing components 504) may transition to facilitate lowering power consumption while still enabling support for complex features, such as audio streaming over WIFI. As described above, certain components (e.g., a sophisticated processor, such as an application processor) can be put in a low-power state (including being turned off) in situations where complex operations that may necessitate those components are unlikely to be performed (and/or not supported for use in the given situation). For example, a battery-powered playback device, such as portable and/or wearable playback devices, can transition between various power states in concert with detected changes in the operating environment (and/or a current operating mode) of the playback device to facilitate maximizing run time/battery life.

As shown, the set of power states includes first through sixth states, denoted as P1 through P6. The position of a particular power state along the vertical axis is indicative of the power consumed by the playback device while in that power state. For example, P1 corresponds to the highest power state, followed by P2, and P6 corresponds to the lowest power state.

In the P1 state, the plurality of processing components 504 (e.g., first processor(s) 524 and second processor(s) 526) are in an awake state. As noted above, in the awake state, the processors may be capable of executing instructions, power may be maintained to the processor caches (e.g., L1, L2, and/or L3 caches), and the clocks may be on (e.g., core clock, bus clock, etc.).

In the P2 state, the second processor(s) 526 are in a light sleep state. For example, as noted above, clocks of the second processor(s) 526 may be turned off or lowered in frequency (e.g., to a minimum frequency). The first processor(s) 524 may be in the awake state. That is, the power and clocks of the first processor(s) 524 may be configured to facilitate the performance of operations by the first processor(s) 524.

In the P3 state, the second processor(s) 526 and the first processor(s) 524 may both be in the light sleep states. That is, one or more clocks of the second processor(s) 526 and the first processor(s) 524 may be turned off or lowered in frequency (e.g., to a minimum frequency).

In the P4 state, the second processor(s) 526 may be in a deep sleep state. For example, a voltage supplied to the second processor(s) 526 can be reduced (e.g., to zero or near zero) and one or more clocks of the second processor(s) 526 may be turned off. In the P4 state, the first processor(s) 524 may be in an awake state.

In the P5 state, the second processor(s) 526 may be in a deep sleep state. For example, a voltage supplied to the second processor(s) 526 can be reduced (e.g., to zero or near zero) and one or more clocks of the second processor(s) 526 may be turned off. In the P5 state, the first processor(s) 524 may be in the light sleep state.

In the P6 state, the second processor(s) 526 and the first processor(s) 524 may both be the may be in a deep sleep state. For example, voltage supplied to both the second processor(s) 526 and the first processor(s) 524 can be reduced (e.g., to zero or near zero) and one or more clocks of the second processor(s) 526 and the first processor(s) 524 may be turned off. In P6 state, the current drawn by the playback device may be reduced to, for example, leakage current associated with, among other things, power supply circuitry of the playback device.

While six power states are illustrated it is understood, that there can be a different number of power states. That is, the amount of power drawn by the playback device can fall within a different number of discrete states (e.g., greater or fewer than six states). For example, while the processor(s) described above are specified as being capable of transitioning between awake, light sleep, and deep sleep states, there can be any number of sub-power states within these power states. As an example, a particular portion of the second processor(s) 526 can be de-powered or de-clocked to minimize power consumption associated with that portion. At the same time, the second processor(s) 526 can be actively performing operations that do not require that portion. Therefore, even though awake, the power consumed by the second processor(s) 526 will be less than the power otherwise consumed by the second processor(s) 526 when all the portions are active. Portions of the first processor(s) 524 can be similarly de-powered or de-clocked to minimize power consumption associated with these portions.

Figure 15:
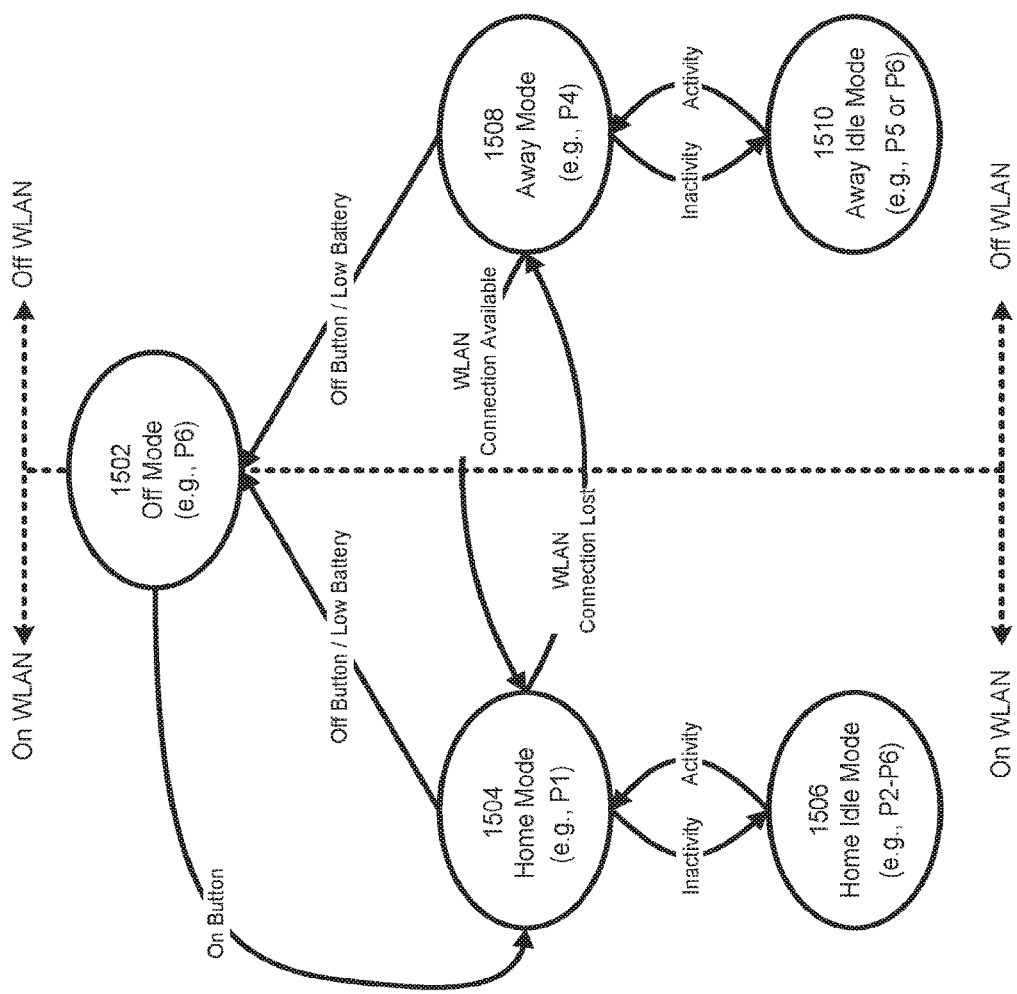
FIG. 15 illustrates an example state diagram of various operating modes for a playback device in accordance with aspects of the disclosure.

In some embodiments, a playback device (e.g., implementing one or more components of device 500 such as processing components 504) may transition between various power states (e.g., power states P1-P6 above) based on a current mode of operation of the playback device. For example, the playback device may have a plurality of modes of operation that each have different processing needs (e.g., some modes may support complex operations while other modes may not). Thus, processor(s) (or other components) that are not needed to support the particular operations associated with a given mode of operation may be put in a low-power state (e.g., a sleep state such as a light sleep or deep sleep state). In some instances, the playback device may employ a set of one or more criteria that cause the playback device to transition between certain modes of operation (e.g., trigger events). FIG. 15 illustrates an example state diagram including a plurality of modes of operation of a playback device, associated trigger events that may cause transitions between the plurality of modes of operation, and example power states (referencing FIG. 7) in which the playback device may be in while operating in each mode. Upon entry into at least some of the plurality of modes, the playback device may transition between power states (e.g., transition between one or more of power states P1-P6). As shown, the plurality of operation modes includes an off mode 1502, a home mode 1504, a home idle mode 1506, an away mode 1508, and an away idle mode 1510.

In the off mode 1502, the playback device may be powered off. For example, the playback device 1502 may be incapable of performing most (if not all) functionality associated with the playback device in the off mode 1502. The playback device 1502 may put most (if not all) of the components of the playback device 1502 in a low power mode (including turning them off). For example, the playback device 1502 may be in the power state P6. The power consumption of the playback device may be at a minimum when operating in the off mode.

Upon detecting a trigger event, the playback device may transition from the off mode 1502 to the home mode 1504. As shown, the trigger event that causes the playback device to transition from the off mode 1502 to the home mode 1504 may include, for example, detecting activation of an on button or other element of an interface on the playback device. In the home mode 1504, the playback device may be expected to be in an environment where a WLAN is likely available (e.g., inside a home associated with a user (e.g., a home of the user, a home of a friend of the user, etc.), nearby a home of a user (e.g., outside in a backyard), in a hotel room associated with the user (e.g., a hotel room of the user, a hotel room of a friend of the user, etc.), at a workplace associated with the user (e.g., a workplace of the user, a workplace of a friend of the user, etc.)) and there may (or may not) be a connection over a PAN to a user device. Given the environment of the playback device when in home mode 1504, the playback device may be expected to (and capable of) perform most (if not all) of the functionality associated with the playback device. For example, the playback device may support one or more of the following functions: (1) playback of audio streamed from an audio service provider over a WLAN (e.g., when connected to a WLAN); (2) playback of audio from another device (e.g., another playback device, such as a soundbar) on a WLAN (e.g., when connected to a WLAN); (3) playback of audio streamed from a user device over a PAN (e.g., when connected to a PAN); (4) voice commands associated with a VAS provider where the captured voice utterance is sent to a remote server over a WLAN (e.g., when connected to a WLAN); and/or (5) call handling (e.g., playback audio from the call and output detected voice utterances on the call) for calls received over a PAN via a user device (e.g., when connected to a PAN).

Given the high-level of functionality that may be invoked by a user when the playback device is in the home mode 1504, the playback device may put most (if not all) of the components of the playback device in a high power state (e.g., an awake state) to support the wide range of functionality that may be invoked by the user. For example, the playback device may be in the power state P1 when in home mode 1504. The power consumption of the playback device may be at a maximum when operating in the home mode.

Upon detecting a trigger event, the playback device may transition from the home mode 1504 to the away mode 1508. As shown, the trigger event that causes the playback device to transition from the home mode 1504 to the away mode 1508 may include, for example, detecting a loss of a connection to the WLAN (e.g., one or more performance metrics associated with the connection (e.g., RSSI, packet loss rate, etc.) fall below a threshold (e.g., remain below the threshold for a minimum period of time)). In the away mode 1508, the playback device may be expected to be in an environment where a WLAN is not available (e.g., on a commute to/from work, outside walking on a street, on a hike, etc.) and there may (or may not) be a connection over a PAN to a user device. Given the loss of the connection to the WLAN, the playback device may support fewer functions (and/or different functions) in away mode 1508 than are supported in home mode 1504. For example, in the away mode 1508, the playback device may support one or more of the following operations: (1) playback of audio streamed from a user device over a PAN (e.g., when connected to a PAN); and/or (2) call handling (e.g., playback audio from the call and output detected voice utterances on the call) for calls received over a PAN via a user device (e.g., when connected to a PAN). Further, in the away mode 1508, the playback may not support one or more of the following operations: (1) playback of audio streamed from an audio service provider over a WLAN; (2) playback of audio from another device (e.g., another playback device, such as a soundbar) on a WLAN; and/or (3) voice commands associated with a VAS provider where the captured voice utterance is sent to a remote server over a WLAN.

Given the difference in supported functions between the home mode 1504 and the away mode 1508, one or more components of the playback device (e.g., at least one of the application processor(s) in the playback device) may be put into a low power state to reduce the power consumption of the playback device. For example, the playback device may be in the power state P4 when in away mode 1508. The power consumption of the playback device may be at a level that is lower than when operating in home mode 1504. Upon detection of a trigger event, such as a WLAN connection becoming available (e.g., the presence of a WLAN connection being detected by the playback device), the playback device may transition from the away mode 1508 to the home mode 1504.

In some instances, the plurality of operating modes may comprise one or more idle modes (and/or idle variations of other modes) where the power consumption of the playback device may be further reduced after some trigger event associated with inactivity. As shown in FIG. 15, the playback device may transition from a home mode 1504 to a home idle mode 1506 after detecting some trigger event associated with inactivity. The event associated with inactivity may include, for example, one or more of the following: (1) detecting a period of no user input for a minimum period of time; (2) detecting that the environment in which the playback device is operating is dark (e.g., the playback device is in a backpack and unlikely to be used); and (3) detecting that the playback device is not positioned for use (e.g., a headphone that is doffed or otherwise not being worn). In the home idle mode 1506, the playback device may consume less power than in the home mode 1504 by putting one or more components in a low power state while still retaining the ability to expeditiously transition back to the home mode 1504 when needed. For example, the playback device may be in one of power states P2-P6 while in home idle mode 1506. Conversely, the playback device may transition from the home idle mode 1506 to the home mode 1504 upon detection of a trigger event associated with activity. The event associated with activity may include, for example, one or more of the following: (1) detecting a user command (e.g., detecting activation of a user interface element, detecting a command from a user device over a PAN and/or a WLAN, etc.); (2) detecting that the environment in which the playback device is operating is bright (e.g., the playback device has been removed from a backpack and is in a well illuminated room); and (3) detecting that the playback device is positioned for use (e.g., a headphone that is donned or otherwise being worn).

Additionally (or alternatively), the playback device may transition from the away mode 1508 to an away idle mode 1510 after detecting some event associated with inactivity. In the away idle mode 1510, the playback device may consume less power than in the away mode 1508 by putting one or more components in a low power state. For example, the playback device may be in one of power states P5 or P6 while in away idle mode 1510. Conversely, the playback device may transition from the away idle mode 1510 to the away mode 1510 upon detection of some activity (including any of the events associated with activity described herein).

It should be appreciated that the playback device may have more (or fewer) operating modes than are shown in FIG. 15. For example, the set of operating modes may further include a charging mode where the playback device receives power from an external source (e.g., receives power via a cable and/or a wireless charging base) and uses at least some of the power received from the external source to charge an energy storage device (e.g., a battery). The trigger event for entering charging mode (e.g., from any starting mode) may include, for example, detecting that the playback device is receiving power from an external source. Conversely, the trigger event for exiting the charging mode (e.g., and entering home mode 1504) may include, for example, detecting that the playback device is no longer receiving power from an external source.

In some instances, it may be desirable to prohibit a user from performing one or more operations while the playback device is operating in the charging mode (e.g., is being charged). For example, the playback device may be a headphone and the temperature of the headphone may become too warm while charging to be safely worn by a user. In this example, the playback device may discourage as user from wearing the headphone while in the charging mode by disabling one or more functions of the playback device such as one or more of the following functions: (1) playback of audio streamed from an audio service provider over a WLAN (e.g., when connected to a WLAN); (2) playback of audio from another device (e.g., another playback device, such as a soundbar) on a WLAN (e.g., when connected to a WLAN); (3) playback of audio streamed from a user device over a PAN (e.g., when connected to a PAN); (4) voice commands associated with a VAS provider where the captured voice utterance is sent to a remote server over a WLAN (e.g., when connected to a WLAN); and/or (5) call handling (e.g., playback audio from the call and output detected voice utterances on the call) for calls received over a PAN via a user device (e.g., when connected to a PAN). While the playback device is in the charging mode, the playback device may put most (if not all) of the components of the playback device in a high power state (e.g., an awake state). For example, the playback device may be in power state P1 while operating in a charging mode. By putting most (if not all) of the components of the playback in a high power state while in the charging mode (e.g., instead of turning off most of the components of the playback device), the playback device may still perform one or more background operations (e.g., including one or more power intensive background operations that may be undesirable to perform while not receiving power). For example, the playback device may perform one or more background operations to maintain a connection to one or more servers associated with one or more service providers (e.g., a voice assistant service provider and/or a streaming service provider) while in the charging mode. By maintaining the connection to the one or more servers associated with the one or more service providers while in the charging mode, the playback device may advantageously be able to transition from the charging mode to another mode, such as the home mode 1504, faster than had the connection been stopped and needed to be reestablished.

In some implementations, the triggering events for transitioning between various operating modes (and/or power states) may be tailored to user behavior over time. For example, the playback device may employ one or more sensors (e.g., clocks, infrared sensors, microphones, wireless radios, etc.) that may be employed to monitor the state of playback device (e.g., last used 2 hours ago at 10:00 pm) and/or the environment in which the playback device is in (e.g., in a dark area like a backpack). In this example, the playback device may identify patterns of user behavior based on such information and use those identified patterns to intelligently modify the trigger events to match the identified patterns of user behavior. For example, the playback device may identify that the playback device is infrequently used after 10:00 pm in the evening when in home mode 1504 and modify trigger event associated with a transition from home mode 1504 to a home idle mode 1506 such that the playback device automatically transitions from the home mode 1504 to the home idle mode 1506 at 10:00 pm (if the playback device is not already in the home idle mode 1506).

It should be appreciated that the playback device may employ any of a variety of signal processing techniques to adjust the trigger events based on monitored user behavior. In some instances, the playback device may employ one or more filtering techniques (e.g., employing a digital moving average filter) to modify the trigger events. For example, the playback device may monitor the time at which user inputs (e.g., indicating that the user is requesting the playback device to perform an operation) are detected throughout the day and identify the last interaction of the day (e.g., to identify a time after which the user has likely started to sleep and is unlikely to use the playback device until the next morning). In this example, the playback device may compute an average (e.g., a moving average) of the times associated with the last user input of the day and, in turn, use that value to modify a trigger associated with transitioning from home mode 1504 to home idle mode 1506. In other instances, the playback device may employ other signal processing techniques to adjust the triggering events based on monitored user behavior such as machine learning techniques.

Figure 8:
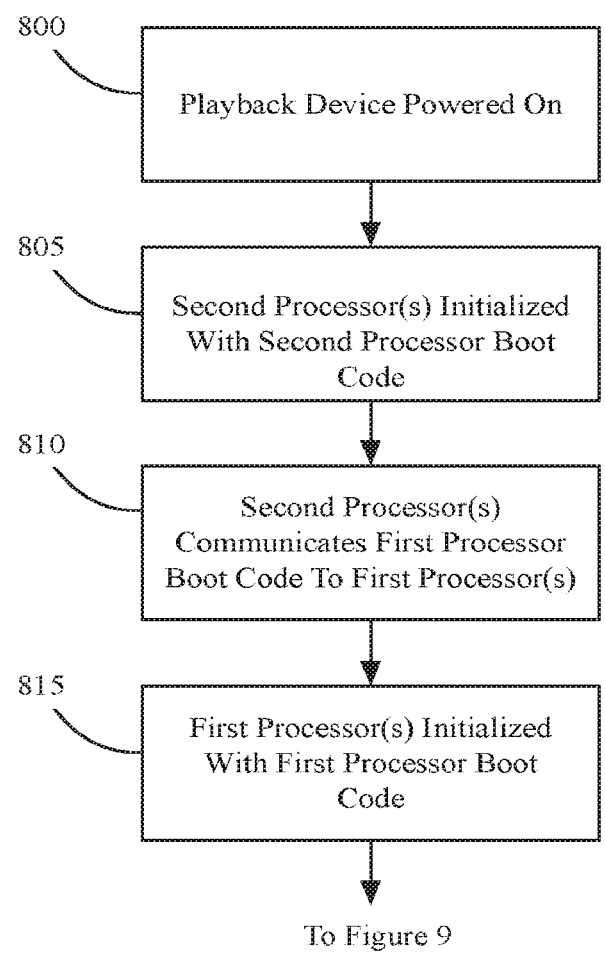
FIG. 8 illustrates operations performed by the playback device during initial power-up or activation of the playback device in accordance with aspects of the disclosure.

FIG. 8 illustrates examples of operations performed by a playback device implementing the components of device 500 (shown in FIG. 5) during initial power-up or activation (e.g., a transition from off mode 1502 to the home mode 1504 in FIG. 15). In an example, after initialization, the first processor(s) 524 and the second processors(s) 526 are in the awake state and the playback device is in the P1 state (and/or home mode 1504) noted above.

At block 800, the playback device is powered on. That is, power may be applied to the components illustrated in FIG. 5. The playback device may be powered on in response to a user interaction with the control area (e.g., control area 258), such as a button press (including a long button press). In another example, removal of the playback device from a charging dock (e.g., charging dock 246) causes the playback device to power on. In yet another example, the playback device may include a motion sensor and the detection of motion by the motion sensor causes the playback device to power on.

At block 805, after power is applied to the components illustrated in FIG. 5, the second processor(s) 526 may load initialization code (i.e., boot code) from non-volatile memory of the data storage 506. An example of initialization involves setting registers of various components of the second processor(s) 526. Another example further involves initializing network code that facilitates network communication via the first communication link 512. For example, an 802.11 stack may be initialized.

At block 810, in some examples, the second processor(s) 526 communicates initialization code (i.e., boot code) to the first processor(s) 524. For example, the boot code loaded from the non-volatile memory of the data storage 506 may include a code segment that corresponds to the boot code for the first processor(s) 524. This code segment can be communicated to the first processor(s) 524 via an interface of the second processor(s) 526 such as a SPI bus.

In another example, the first processor(s) 524 loads the boot code directly from the non-volatile memory of the data storage 506 or from a different non-volatile memory dedicated to the first processor(s) 524.

At block 815, the first processor(s) 524 initializes. An example of initialization involves setting registers of various components of the first processor(s) 524. Another example further involves initializing network code that facilitates network communication via the second communication link. For example, a BLUETOOTH stack may be initialized.

After initialization of the second processor(s) 526 and the first processor(s) 524, the playback device may be in the P1 state (e.g., and/or home mode 1504). As noted above, in P1 state, the power consumed by the playback device may be relatively high.

Figure 9:
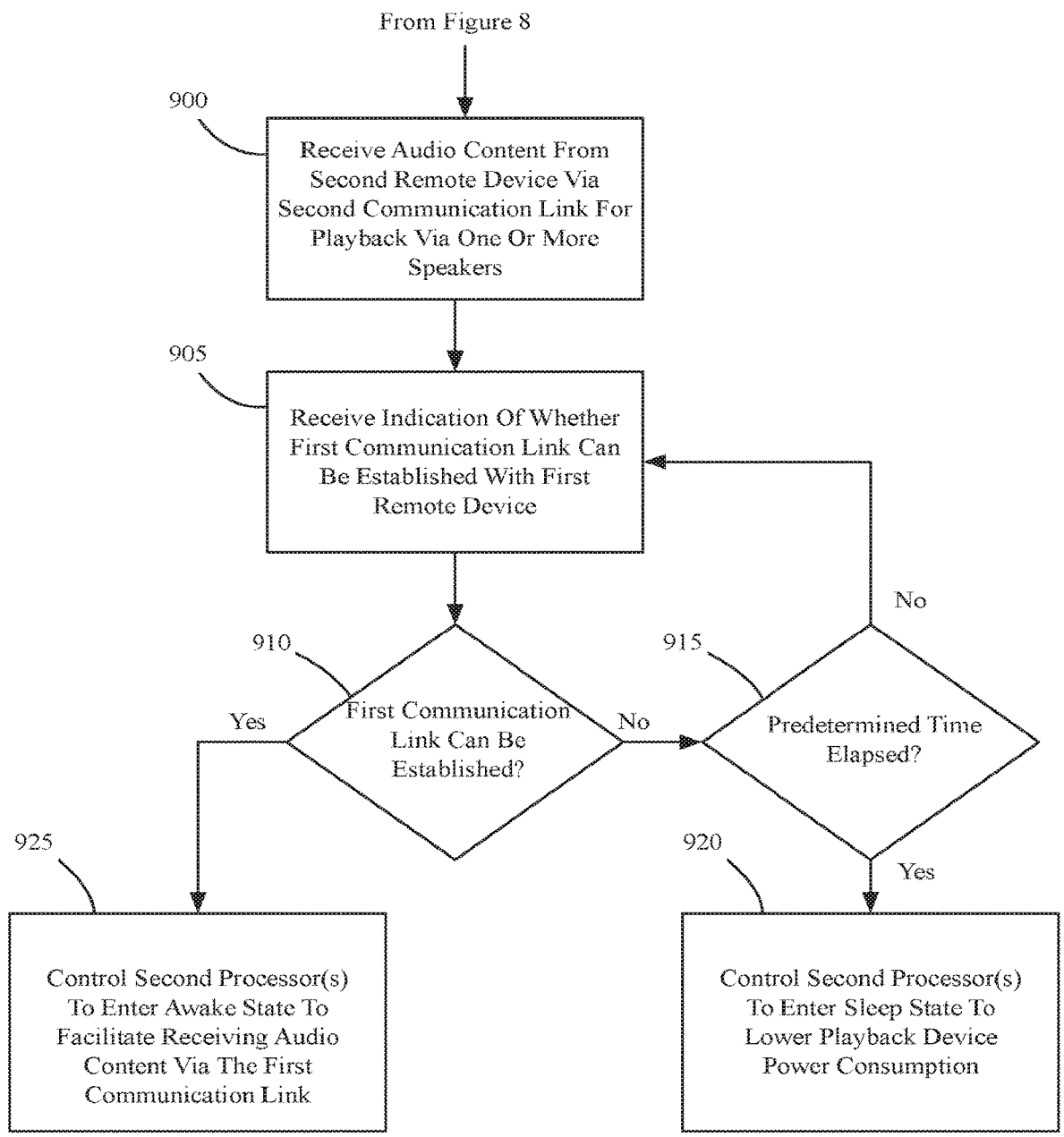
FIG. 9 illustrates operations performed by the playback device after a first processor(s) and a second processer(s) of the playback device have been initialized in accordance with aspects of the disclosure.

FIG. 9 illustrates examples of operations performed by a playback device (implementing the components of device 500) after the second processor(s) 526 and the second processor(s) 526 have been initialized and the playback device is in, for example, the P1 state (e.g., and/or home mode 1504). At block 900, the playback device receives audio content from a second remote device (e.g., second computing device 516) via the second communication link 518. The audio content may be played back via speakers (e.g., speakers 218) of the playback device. For example, the second communication link 518 can correspond to a BLUETOOTH link and a BLUETOOTH connection can be established between the playback device and, for example, a user device (e.g., a smartphone, a tablet computer, a laptop, a desktop, etc.). The user device may stream audio content via the BLUETOOTH connection to the playback device. The BLUETOOTH processing performed by the playback device may be primarily (and/or entirely) implemented by the first processor(s) 524. In an example, the second processor(s) 526 is not involved in the processing of the audio content received from the user device.

At block 905, an indication may be received as to whether a first communication link 512 can be established between the playback device 102 and a first remote device (e.g., first computing device 510). For example, the first processor(s) 524 may receive an indication from the first network circuit 520 of the network interface component(s) 502 as to whether the first communication link 512 can be established. In one example, the first communication link 512 corresponds to an Institute of Electrical and Electronics Engineers (IEEE) 802.11 based communication link. In an example, the indication that the first communication link 512 can be established is communicated to the first processor(s) 524 when an 802.11 signal is detected by the first network circuit 520 of the network interface component(s) 502 (e.g., the power associated with the signal is above a pre-determined threshold such as −30 dbm). In another example, the indication is communicated to the first processor(s) 524 when a service set identifier (SSID) associated with the first communication link 512 matches a predetermined SSID. For example, the predetermined SSID may correspond to the SSID of the home network of the playback device user. When the playback device 102 is within range of the home network, the indication that the first communication link 512 can be established is communicated from the first network circuit 520 of the network interface component(s) 502. In another example, the indication that the first communication link 512 can be established is communicated to the second processor(s) 526 (e.g., via an interrupt signal). Additional example techniques by which a network circuit can be configured to output a signal when a particular SSID is identified are described in PCT Publication No. WO/2020/150595, published on Jul. 23, 2020, titled "Power Management Techniques for Waking-Up Processors in Media Playback Systems," which is incorporated herein by reference in its entirety.

At block 910, if the first communication link 512 can be established, then at block 925, the second processor(s) 526 is either maintained in the awake state, or transitioned to the awake state to facilitate receiving audio content or other information via the first communication link 512 (e.g., stay in home mode 1504 or transition to home mode 1504 if not in home mode 1504 such as transitioning from away mode 1508 to home mode 1504). For example, if the current power state of the playback device is P1, the second processor(s) 526 is already awake (e.g., clock(s) of the first processor(s) 524 are running). In this case, the second processor(s) 526 can proceed to establish a communication link with one or more remote devices, such as a controller device 104, an audio streaming service provider, and/or a different playback device 102 from which audio content can be streamed.

If the current power state of the playback device corresponds to the P2 state (e.g., second processor(s) 526 are in a light sleep state) or higher (P3-P6), an indication may be communicated from the first processor(s) 524 to the second processor(s) 526 to cause the second processor(s) 526 to transition to the awake state, or as indicated above, the indication can be communicated directly to the second processor(s) 526. For example, an interrupt to the second processor(s) 526 may be generated by the first processor(s) 524 or received directly from the network interface component(s) 502. In response, the clock(s) of the second processor(s) 526 may be activated or the respective frequencies of the clocks may be shifted to a nominal operating frequency that facilitates streaming of audio content by the second processor(s) 526.

If at block 910, the first communication link 512 cannot be established, then at block 920, the second processor(s) 526 is controlled to transition to a lower power state, such as the light sleep state and/or the deep sleep state (e.g., transition from home mode 1504 to a lower power mode such as an away mode 1508). That is, the playback device 102 may transition to, for example, the P4 state. As shown in block 915, in some examples, the second processor(s) 526 is controlled to transition to a lower power state only after a predetermined amount of time has elapsed (e.g., 10 seconds). This can prevent unnecessarily bringing down the stack associated with the first communication link 512 when there is a momentary loss of signal, which can occur when, for example, the user of the playback device 102 moves, momentarily, beyond range of a WIFI router in the home. In some examples, after a second predetermined amount of time has elapsed (e.g., 1 minute), the second processor(s) 526 is controlled to transition to a still yet lower power state (e.g., from a light sleep state to deep sleep state or from a first deep sleep state to a second deep sleep state with a lower power consumption than the first deep sleep state) to save additional power.

Figure 10:
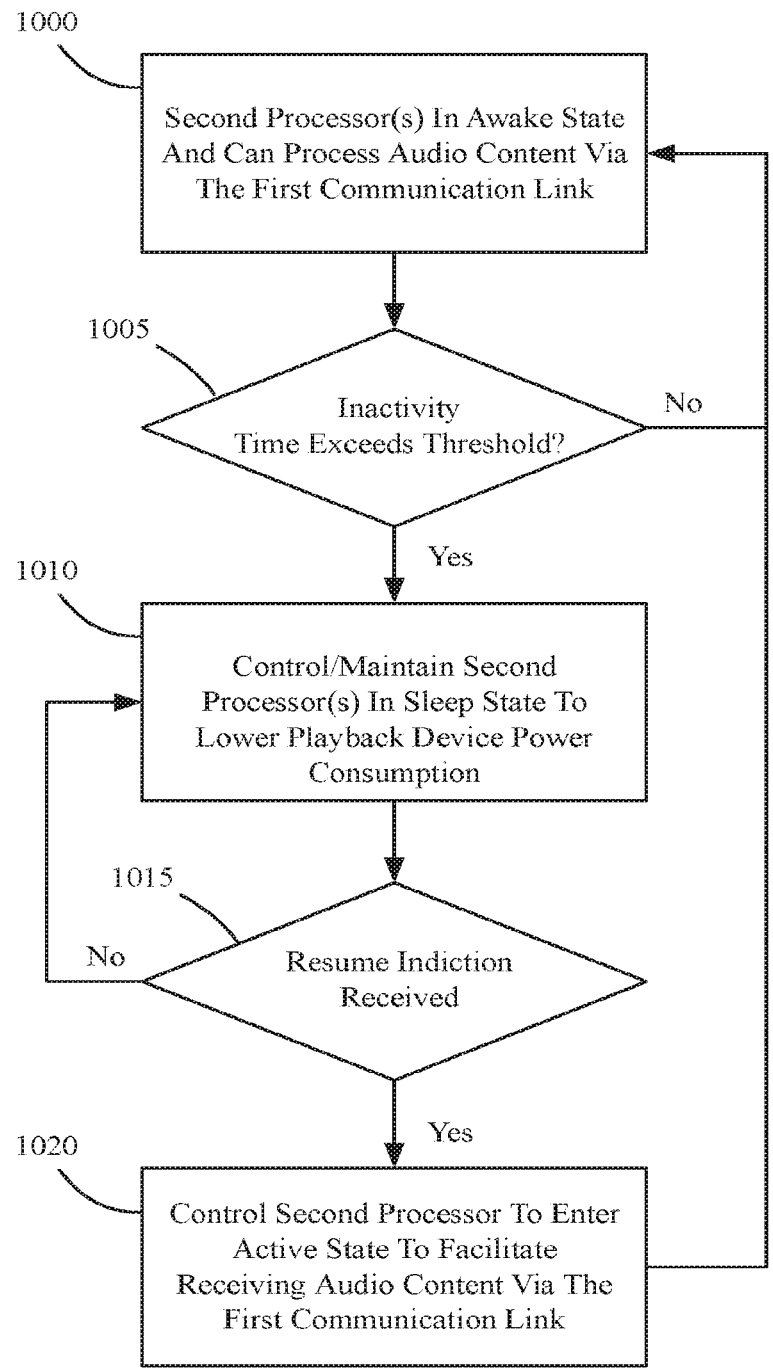
FIG. 10 illustrates operations performed by the playback device when the first processor(s) and the second processer(s) are in an awake state in accordance with aspects of the disclosure.

FIG. 10 illustrates examples of operations performed by a playback device (implementing the components of device 500) when the playback device is in the P1 state (e.g., a home mode 1504).

At block 1000, the second processor(s) 526 and the second processer(s) 526 are in an awake state (e.g., in home mode 1504) and can process, for example, audio content or information received via the first communication link 512 and the second communication link 518, respectively. In some examples, the second processor(s) 526 can process other information communicated via the first communication link 512, such as receiving commands from and reporting information to a controller.

In an example, the first processor(s) 524 forwards information associated with the audio content received via the second communication link 518 to the second processor(s) 526. The second processor(s) 526 then forwards the information via the first communication link 512 to, for example, a controller. For example, information associated with content being played, such as the name and artist associated with a song being played, can be forwarded via the first communication link 512 to the controller. In some examples, an indication of the length of the song and the position within the song associated with the portion of the song being played can be communicated.

In some examples, information received via the first communication link 512 can be used to control audio content being communicated via the second communication link 518. For example, a pause indication, next song indication, previous song indication, etc., can be received from a controller via the first communication link 512, forwarded by the second processor(s) 526 to the first processor(s) 524 (e.g., via the SPI bus) and then forwarded to a remote device (e.g., mobile phone). The remote device can then process the indication communicated from the controller accordingly.

If at block 1005, an amount of inactivity time of the first communication link 512 exceeds a threshold, then at block 1010, the first processor(s) 524 and/or the second processor(s) 526 can be controlled to transition to a sleep state (e.g., a home idle mode 1506). That is, the playback device transitions to, for example, any of states P2-P6. For example, if no audio content or user initiated commands are communicated via the first communication link 512 for a predetermined amount of time (e.g., 10 seconds), the second processor(s) 526 can be controlled to transition to the light sleep state. In some examples, after a second predetermined amount of time has elapsed (e.g., 1 minute), the second processor(s) 526 is controlled to transition to the deep sleep state to save additional power.

In some examples, a timer process operating on the first processer(s) 524 controls the second processor(s) 526 to transition to the light and/or deep sleep states. In other examples, a timer process operates on the first processor(s) 524 and, upon expiry, causes the first processor(s) 524 to send a command (e.g., via a SPI bus) to control the second processor(s) 526 to transition to the light and/or deep sleep states.

In some examples, if an amount of inactivity time of the second communication link 518 exceeds a threshold, the first processor(s) 524 and/or the second processor(s) 526 can be controlled to transition to a sleep state (e.g., any of states P2-P6). For example, if no audio content or user initiated commands are communicated via the second communication link 518 for a predetermined amount of time (e.g., 10 seconds), the first processor(s) 524 can be controlled to transition to the light sleep state. In some examples, after a second predetermined amount of time has elapsed (e.g., 1 minute), the first processor(s) 524 is controlled to transition to the deep sleep state to save additional power. That is, depending on whether the second processor(s) 526 is in the light or deep sleep state, the playback device 102 transitions to either the P5 or P6 states. In some examples, a timer process operating on the second processer(s) 526 controls the first processor(s) 524 to transition to the light and/or deep sleep state.

If at block 1015, a resume indication is received, then at block 1020, the second processor(s) 526 is controlled to transition to an awake state (e.g., transition from a home idle mode 1506 to home mode 1504) to, for example, facilitate communicating information via the first communication link 512. In some examples, both the second processor(s) 526 and the first processor(s) 524 transition to the awake state. That is, the playback device 102 transitions to the P1 state.

In one example, a resume indication occurs when the user of the playback device initiates an action via the control area (e.g., control area 258), such as an action to immediately establish communications with a streaming service, controller, and/or another playback device. In another example, a resume indication occurs when the user removes the playback device from a charging dock (e.g., charging dock 246). In another example, a resume indication can occur at a particular interval (e.g., every 5 minutes).

While several techniques have been described above for managing power consumption, other techniques are contemplated. For example, in another example, user interaction with the playback device can be monitored to determine typical periods of activity and inactivity associated with the playback device. Instruction code operating on the first processor(s) 524 and/or the second processor(s) 526 can implement machine learning logic that can be trained over time to predict these periods of activity and inactivity. During predicted periods of activity, the machine learning logic can, for example, transition the second processor(s) 526 to the awake state to facilitate communicating information to the playback device via the first communication link 512. During predicted periods of inactivity, the machine learning logic can, for example, transition the second processor(s) 526 to the light sleep state to conserve power.

V. Example Distributed Audio Processing Techniques

Figure 11:
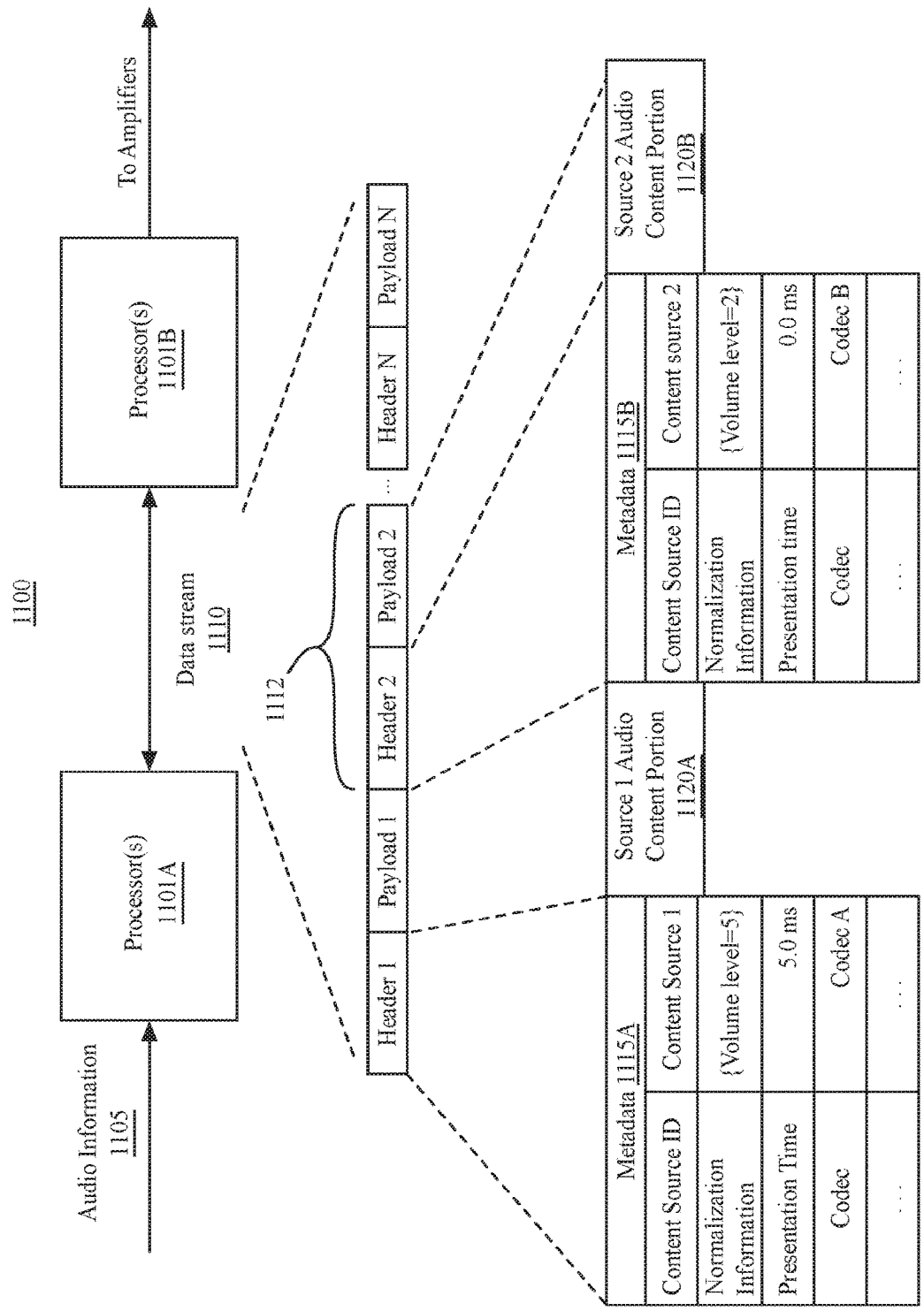
FIG. 11 illustrates a distributed audio processing environment in which processing operations associated with the playback of audio content are distributed among multiple processors in accordance with aspects of the disclosure.

FIG. 11 illustrates an example of a distributed audio processing environment 1100 in which processing operations associated with the playback of audio content are distributed among multiple processors (e.g., within a single playback device and/or between multiple playback devices). In this case, the processing operations are distributed between multiple processors shown as processor(s) 1101A and processor(s) 1101B, which may have different constructions. In some embodiments, the processor(s) 1101A may be implemented as one or more GPPs that support memory virtualization (e.g., as one or more application processors) while the processor(s) 1101B may be implemented as one or more GPPs and/or one or more SPPs that do not support memory virtualization. For example, with respect to FIG. 5, the processor(s) 1101A may correspond to the second processor(s) 526 while the processor(s) 1101B may correspond to the first processor(s) 524. With respect to FIG. 15, the distributed audio processing techniques may be employed by a playback device operating in, for example, home mode 1504 to support one or more functions that involve audio playback (e.g., playback of audio streamed from an audio service provider over a WLAN; playback of audio from another device, such as another playback device, on a WLAN; playback of a response to voice commands associated with a VAS provider, etc.).

In some embodiments, the processing operations may be distributed between a first playback device that comprises the processor(s) 1101A and a second playback device that comprises the processor(s) 1101B. In these embodiments, the first and second playback devices may have different form factors. For example, the first playback device may be implemented as a stationary playback device while the second playback device may be implemented as a wearable device such as a headphone device (including in-ear, on-ear, and/or over-ear headphones) and/or a portable playback device.

As described in further detail below, the processor(s) 1101A are configured to receive audio information 1105 via a first communication link (e.g., first communication link 512). An example of the audio information 1105 includes audio content provided from a variety of content source providers (e.g., music streaming service providers, voice-assistant service providers, etc.). The audio information 1105 may (or may not) contain additional information associated with the audio content such as a playback time to facilitate synchronous playback with at least one other device. The processor(s) 1101A generate audio processing information for the audio content in the audio information and communicate the audio content and the audio processing information to the processor(s) 1101B. In turn, the processor(s) 1101B perform some or all of the audio processing operations and causes the audio content to be played back using the audio processing information. The audio processing information may specify one or more parameters regarding how the audio content should be played back. For example, the audio processing information may comprise normalization information such as a volume at which the audio content should be played. Other examples of the audio processing information include a presentation time that may, for example, be used as a basis for determining an amount delay to apply to the audio content to facilitate playing the audio content in synchrony with other playback devices (e.g., playing back the audio content in lip-synchrony with visual content played back by a television (or other video playback device) and/or playing back the audio content in synchrony with playback of audio content by other playback devices). Yet other examples of the audio processing information includes a codec used by the content source provider to encode audio samples of the audio content.

As noted above, audio information 1105 may comprise audio content received from different audio content source providers. For example, first audio content can correspond to audio streamed from an audio streaming service (e.g., SPOTIFY). Second audio content can correspond to audio from an online assistant such as ALEXA by AMAZON. In an example, the audio information 1105 (or any portion thereof) is communicated directly to the processor(s) 1101A from the various audio content source providers via the first communication link. In other examples, the audio information 1105 (or any portion thereof) is communicated to the processor(s) 1101A from another playback device (e.g., indirectly communicated from the service providers via one or more other playback devices). In another example, a first portion of the audio information 1105 (e.g., first audio content) is communicated directly to the playback device 102 from an audio content source provider and a second portion of the audio information 1105 (e.g., second audio content) is communicated from a different playback device. For example, first audio content associated with an online assistant can be communicated directly to the processor(s) 1101A and second audio content associated with an audio streaming service can be communicated from a different playback device to the processor(s) 1101A.

Some of the audio processing information may be associated with information specified by a user via a user device (e.g., control device 104). For example, a user may, via the user device, select a particular audio streaming service from which audio content should be streamed. In some cases, the user may specify, via the user device, the volume at which the audio content should be played. In some examples, the user can specify equalization information to be applied to the audio content such as the bass and treble levels to be applied to the audio content.

As noted above, in some examples, some or all of the audio processing operations are performed by the processor(s) 1101B. To facilitate performance of the audio processing operations, the processors(s) 1101A communicates the audio content and corresponding audio processing information to the processor(s) 1101B. The corresponding audio processing information may be communicated to the processor(s) 1101B in the form of metadata. The metadata associated with a given portion of audio content may specify the audio processing information associated with that given portion of the audio content. For example, as shown in FIG. 11, the metadata can specify a content source identifier (ID) that facilitates determining the source associated with the audio content. An example of the metadata specifies normalization information such as the volume at which the audio content should be played. An example of the metadata specifies a presentation time that facilitates delaying the audio content to support playback of the audio content in synchrony with other playback devices. An example of the metadata specifies a codec that facilitates selecting a codec for decoding the audio content for playback. Other information may be specified in the metadata.

In an example, the audio content and the corresponding metadata is communicated as a data stream 1110. The data stream 1110 may include packets 1112, and each packet 1112 can include header data and payload data. The header data of the packet 1112 may specify the metadata associated with particular audio content. For example, the header data of a first packet (e.g., Header 1) may specify first metadata 1115A associated with first audio content provided by a first audio content source provider, and the payload data (e.g., Payload 1) of the first packet may specify portions or audio content portion 1120A associated with the first audio content. The header data of a second packet (e.g., Header 2) may specify second metadata 1115B associated with second audio content provided by a second audio content source provider, and the payload data (e.g., Payload 2) of the second packet may specify portions or audio content portion 1120B associated with the second audio content.

In some examples, the data stream 1110 is bi-directional. For example, the packets 1112 can be communicated from the processor(s) 1101A to the processor(s) 1101B to facilitate playback of audio content received by the processors(s) 1101A. Information may also be communicated from the processor(s) 1101B to the processors(s) 1101A. For example, a microphone may be communicative coupled to the processor(s) 1101B that is configured to detect sound including voice utterances by a user associated with a voice command such as a voice command to be directed to an online assistant (e.g., "Hey Alexa"). The voice utterance can be processed by the processors(s) 1101B and communicated to the processor(s) 1101A via any of the techniques described herein. The processor(s) 1101A can forward the voice utterance to an appropriate source provider for processing (e.g., Amazon's Alexa®).

In some examples, the metadata specifies the number of audio content samples specified within the payload data. For example, the metadata can specify that 1, 2, 4, 8, 16, etc., samples are specified in the payload data. In some examples, the metadata specifies a channel associated with the audio samples (e.g., left, right, front, back, center, subwoofer, etc.).

In some examples, the metadata specifies channel information. The channel information specified for a particular packet can specify that the samples within the payload data correspond to particular audio channels and that the samples should be output in synchrony to specific amplifiers for playback. For example, the payload of a particular packet can include two samples, one for a left channel and one for a right channel. The channel information can specify that the first sample corresponds to the left channel and the second sample corresponds to the right channel. The same technique can be adapted to work with a different number of channels.

In some examples, the metadata data specifies target information. The target information can specify a target device(s) or component to which processed audio content or samples should be communicated. For example, the target information can specify that the audio content should be communicated to another device via a second communication link (e.g., communication link 518). The target information can specify that the processed audio content should be communicated via a BLUETOOTH link to a BLUETOOTH speaker. The target information can specify that the processed audio content should be communicated via an 802.11 based link to a different playback device. For example, the processor(s) 1101B can communicate the processed audio content via the first communication link to a different playback device.

It should be understood that the metadata specified within successive packets can be different. This, in turn, facilitates multiplexing audio content communicated from different audio content source providers and communicating the multiplexed audio content to different amplifiers and/or devices. For example, first audio content can be communicated to an amplifier of the playback device and second audio content can be communicated via a BLUETOOTH link to a BLUETOOTH speaker. The content source ID specified in the metadata facilitates assembling related audio content specified in the payload data from disparate/non-sequential packets.

Figure 12:
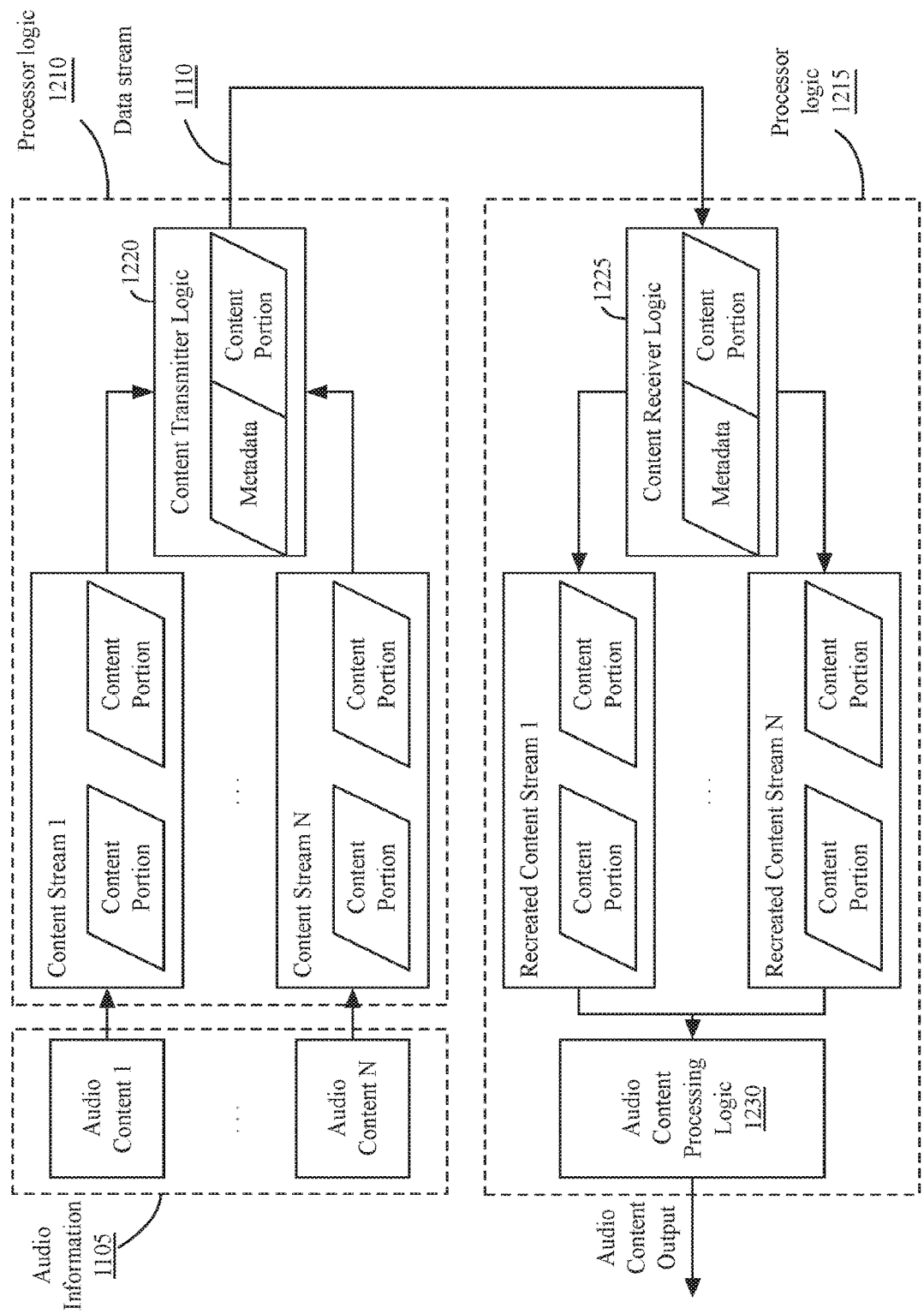
FIG. 12 illustrates a logical representation of processing operations performed by the first processors(s) and the second processor(s) of the playback device in accordance with aspects of the disclosure.

FIG. 12 illustrates a logical representation of example processing operations performed by the processors(s) 1101A and the second processor(s) 1101B to facilitate distributed audio processing. In particular, processor logic 1210 may be implemented using, at least in part, the processor(s) 1101A and the processor logic 1215 may be implemented using, at least in part, the processor(s) 1101B. As shown, audio information 1105 is communicated to processor logic 1210. In an example, the audio information includes 1105 audio content associated with N content source providers, which may be received from a common source or different sources. In an example, the processor logic 1210 represents/maintains the audio content from these content source providers as separate content streams (e.g., Content Stream 1-Content Stream N). Each content stream is partitioned into content portions and metadata may be generated for at least some of the content portions. In some instances, the content portions may correspond to, for example, a particular number of audio content samples (e.g., 1, 2, 4, 8, etc.). The processor logic 1210 includes content transmitter logic 1220 that is configured to associate content portions to be communicated with corresponding metadata, and to output, for example, the data stream 1110 of packets 1112 illustrated in FIG. 11.

In some examples, the processor logic 1210 may (e.g., for encoded audio content) compare the codec needed to decode the audio content with a set of one or more codecs (e.g., in a table stored in memory) that the processor logic 1215 supports. In these examples, the processor logic 1210 may leave the audio content in an encoded state (e.g., for transmission in the data stream 1110) when the codec needed to decode the audio content matched a coded in the set of one or more codecs supported by the processor logic 1215. Otherwise, the processor logic 1210 may, for example, decode the audio content (e.g., to an uncompressed format such as pulse-code modulation (PCM) format) prior to transmission in the data stream 1110. Alternatively, the processor logic 1210 may re-code the audio content in a different format that is supported by the processor logic 1215. As a result, the processor logic 1215 may be capable of rendering audio from a wider range of sources than would otherwise be possible.

The processor logic 1215 includes content receiver logic 1225 configured to receive, for example, the data stream 1110 of packets 1112 and to separate audio content of the data stream 1110 according to the metadata into separate content streams (e.g., Recreated Content Stream 1-Recreated Content Stream N). In some examples, the processor logic 1215 includes a buffer and the buffer is filled with audio samples according to a particular clock rate. This clock rate can be adjusted based on a rate at which the audio content is communicated from the processors(s) 1101A. For example, the clock rate can be dynamically adjusted to prevent a buffer underrun or buffer overflow condition from occurring within the content receiver logic 1225.

In another example, the content receiver logic 1225 can be configured to insert/duplicate samples of audio content in the buffer when the rate at which audio samples arrive from the processor(s) 1101A is below a processing rate of the processor(s) 1101B. In addition, the content receiver logic 1225 can be configured to drop or overwrite samples of audio content in the buffer when the rate at which audio samples arrive from the processor(s) 1101A is above a processing rate of the processor(s) 1101B.

The recreated content streams output from the content receiver logic 1225 are communicated to audio content processing logic 1230 of the processor logic 1215. The audio content processing logic 1230 is configured to process the audio content of a particular recreated content stream according information specified in the metadata associated with that stream (and/or additional information that may be available locally such as user preference information (e.g., indicating a preference as to how content streams are mixed, volume preferences, etc.)). For example, the audio content processor logic 1230 may perform one or more of the following operations: (1) mix audio content from multiple recreated streams; (2) decode the content portions (e.g., using a decoder as specified by the metadata); and/or (3) perform asynchronous sample rate conversion to so as to synchronize playback with another source (e.g., to playback content at the correct rate).

It should be appreciated that the architecture shown in FIGS. 11 and 12 may be extended from a one-to-one relationship (e.g., between processors 1101A/processor logic 1210 and processors 1101B/processor logic 1215) to other types of relationships including: (1) a one-to-many relationship; (2) a many-to-one relationship; and (3) a many-to-many relationship. For example (e.g., in some one-to-many relationships), multiple battery-powered playback devices may each comprise processor(s) 1101B and perform functions associated processor logic 1215 based on data streams from a single stationary playback device (e.g., a soundbar) that comprises processor(s) 1101A that perform functions associated with processor logic 1210. In another example (e.g., in some many-to-one relationships), a single battery-powered playback device may comprise processor(s) 1101B and perform functions associated processor logic 1215 based on multiple data streams from multiple stationary playback devices that each comprise processor(s) 1101A that perform functions associated with processor logic 1210. In this example, a first stationary playback device may generate a first data stream that includes a first content stream and the second stationary playback device may generate a second data stream that includes second content stream. In yet another example (e.g., in some many-to-many relationships), multiple battery-powered playback devices may each comprise processor(s) 1101B and perform functions associated processor logic 1215 based on data streams from multiple stationary playback devices that each comprises processor(s) 1101A that perform functions associated with processor logic 1210. In this example, a first stationary playback device may generate a first data stream for all of the battery-powered playback devices that includes a first content stream and the second stationary playback device may generate a second data stream for all of the battery-powered playback devices that includes a second content stream.

In instances where the processor logic 1215 employs metadata and some additional information (e.g., locally available information) to process the content streams, it should be understood that multiple instances of the processor logic 1215 (e.g., in multiple difference devices) may process the same content stream differently. For example, a first instance of the processor logic 1215 (e.g., in a first playback device) may take into first user preference information associated with a first user and a second instance of the processor logic 1215 (e.g., in a second playback device) may take into second user preference information associated with a second, different user (that is different from the first user preference information). In this example, the first instance of the processor logic 1215 may render the same content stream differently than the second instance of the processor logic 1215 to take into account the differences of user preference between the respective users.

Figure 13:
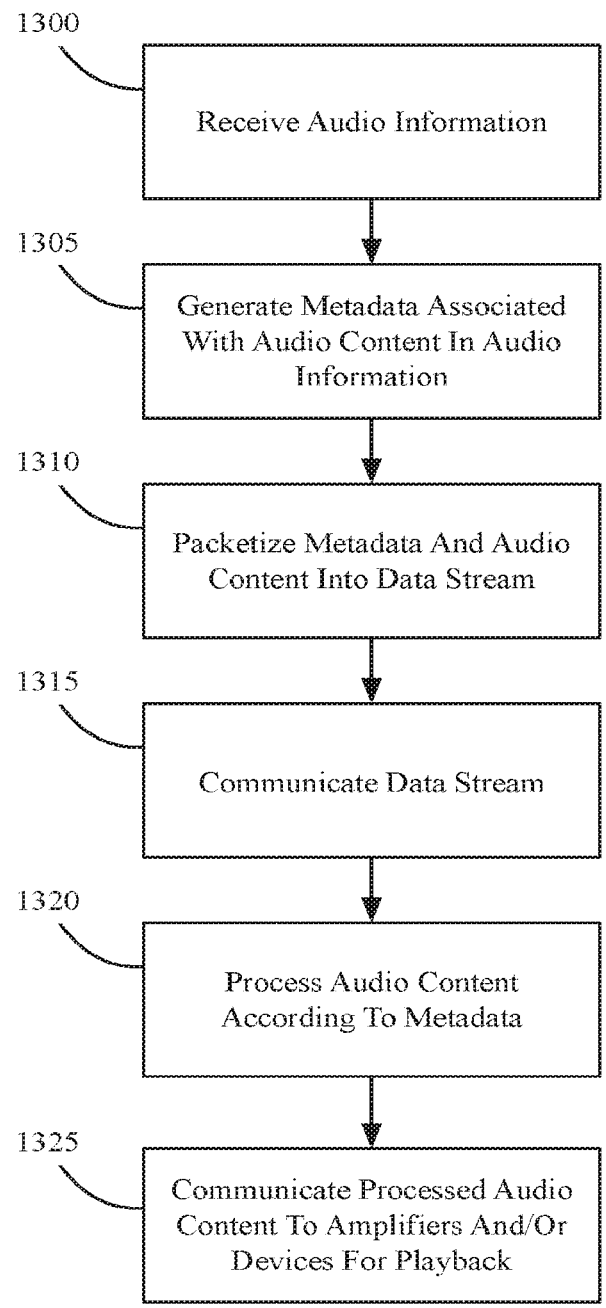
FIG. 13 illustrates operations performed by the playback device to facilitate distributed audio processing in accordance with aspects of the disclosure.

FIG. 13 illustrates examples of operations performed by (e.g., by one or more playback devices) to facilitate distributed audio processing. It should be noted that the operations performed in the figure may be implemented by one or more components of one or more playback devices, such as the first processor(s) 524 and the second processor(s) 526 described above with respect to FIG. 5. In this regard, instruction code can be stored in a memory of the one or more playback devices and executed by the first processor(s) 524 and/or the second processor(s) 526 to cause the first processor(s) 524 and the second processor(s) 526 alone or in combination with other components of the one or more playback devices to perform these operations.

At block 1300, audio information 1105 is received. For example, the second processor(s) 526 may be configured to receive audio information 1105 via the first communication link 512. The audio information 1105 can include audio content provided from, for example, one or more content source providers. The audio information 1105 may comprise additional information such as presentation time to facilitate synchronous playback.

At block 1305, metadata associated with the audio content specified in the audio information 1105 is generated (e.g., using the second processor(s) 526). For example, as noted above, the metadata can specify a content source ID, normalization information, a presentation time, and a codec associated with audio content specified in the audio information 1105. Other examples of the metadata can further specify the number of samples specified in payload data of a data stream, channel information associated with the audio samples, and target information that specifies a target device or component to which processed audio content or samples should be communicated.

In instances where the metadata comprises a presentation time, it should be appreciated that the presentation time may be generated in any of a variety of ways. In some embodiments, the audio information received at block 1305 may comprise a first presentation time. In these embodiments, a second presentation time that is incorporated into the metadata may be derived from the presentation received in the audio information. For example, the second presentation time may be identical to the first presentation time. In other examples, the second presentation time may be generated based on the first presentation time and clock timing information (e.g., a difference in clock times between a clock on the playback device that is to render the audio content and a reference clock used for synchronization). In other embodiments, the audio information received at block 1305 may not comprise a presentation time. In these embodiments, the presentation time incorporated into the metadata may be generated based on, for example, a local clock time (e.g., associated with a physical clock and/or a virtual clock).

At block 1310, the audio content and metadata can be packetized into a data stream 1110 (e.g., using second processor(s) 526). Each packet 1112 may include header data and payload data. The header data of the packet 1112 may specify the metadata associated with particular audio content and the payload data of the packet 1112 may specify portions of audio content samples associated with the audio content.

At block 1315, the data stream 1110 is communicated (e.g., to the first processor(s) 524). For example, the second processor(s) 526 can communicate the data stream 1110 to the first processor(s) 524 via a data bus such as a SPI bus, an I2C bus, etc. In another example, the second processor(s) 526 can communicate the data stream 1110 to the first processor(s) 524 by storing the data stream 1110 in a memory location that is accessible to the first processor(s) 524 (e.g., stored in a shared memory). In instances where the second processor(s) 526 and the first processor(s) 524 are housed in different devices (e.g., different playback devices), the data stream 1110 may be communicated via a communication network, such as a WLAN and/or a PAN, from the second processor(s) 526 to the first processor(s) 524.

At block 1320, the audio content specified in the data stream 1110 is processed according to metadata associated with the audio content (e.g., using the first processor(s) 524). For example, audio content processing logic 1230 of the first processor(s) 526 can decode audio content encoded with a particular codec by corresponding codec logic implemented by the audio content processing logic 1230. In an example, the determination of the codec logic to use in decoding the audio content is based on the codec specified in the metadata. In another example, the audio content processing logic 1230 can normalize the audio content according to normalization information specified in the metadata. In another example, the audio content processing logic 1230 can delay the presentation/outputting of the audio content according to a presentation time specified in the metadata. It should be appreciated that the audio content in the data stream 1110 may also be processed based on additional information such as, for example, user preference information (e.g., specifying preferences as to how content is mixed, volume settings, etc.)

At block 1325, the processed audio content is communicated to the amplifiers for playback (e.g., using the first processor(s) 524). Additionally (or alternatively), in some examples, the processed audio content is communicated to a target component and/or device for playback. The target component and/or device can be specified in the metadata associated with the audio content.

Figure 14:
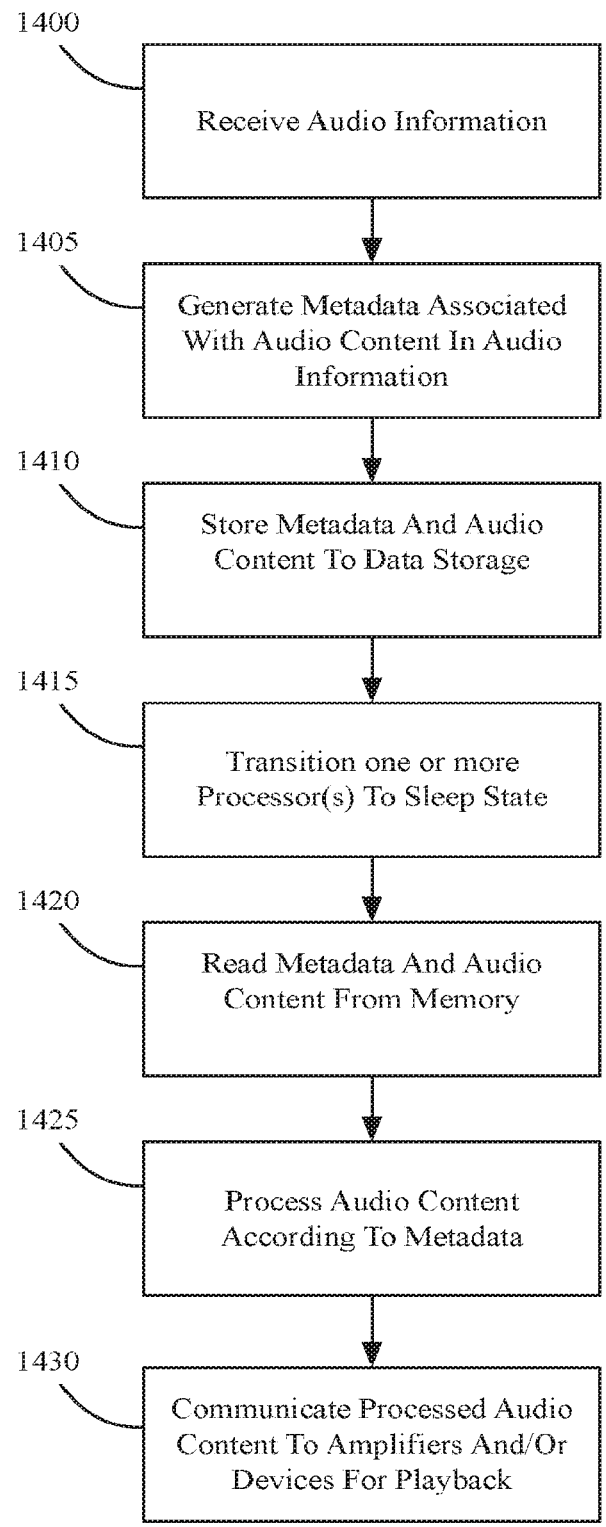
FIG. 14 illustrates further operations performed by the playback device to facilitate distributed audio processing in accordance with aspects of the disclosure.

FIG. 14 illustrates another example of operations performed by one or more playback devices to facilitate distributed audio processing. It should be noted that the operations performed in the figure may be implemented by one or more components of one or more playback devices such as the first processor(s) 524 and the second processor(s) 526. In this regard, instruction code can be stored in a memory of the one or more playback devices and executed by the first processor(s) 524 and/or the second processor(s) 526 to cause the first processor(s) 524 and the second processor(s) 526 alone or in combination with other components of the one or more playback devices to perform these operations.

At block 1400, audio information 1105 is received, and at block 1405, metadata associated with the audio content in the audio information 1105 is generated (e.g., using the second processor(s) 526). Additional details of the operations performed at blocks 1400 and 1405 are described in connection with blocks 1300 and 1305, respectively, of FIG. 13. The additional details are not repeated here for brevity.

At block 1410, the metadata and the audio content are stored (e.g., using the second processor(s) 526) to a data storage (e.g., data storage 506). In one example, the entire duration of audio content and metadata associated with the entire duration of the audio content is stored to the data storage. For example, the audio content and metadata associated with an entire music track can be stored to the data storage. In another example, a portion of the audio content (e.g., five seconds) and metadata associated with the portion of the audio content is stored to the data storage.

At block 1415, one or more processor(s) (e.g., second processor(s) 526) are transitioned to a sleep state. For example, the processor(s) employed to store the metadata and audio content in the data storage (e.g., the second processor(s) 526) may be transitioned to a light sleep state or a deep sleep state after storing the entire length of the audio content or the portion of the audio content. Transitioning of the one or more processor(s) to the sleep state facilitates lowering of the power consumption of the one or more playback devices.

At block 1420, the metadata and the audio content are read from the data storage (e.g., using the first processor(s) 524).

At block 1425, the audio content is processed according to the metadata (e.g., using the first processor(s) 524). At block 1430, the processed audio content is communicated (e.g., using the first processor(s) 524) to the amplifiers, other components, and/or devices. Additional details of the operations performed at blocks 1425 and 1430 are described in connection with blocks 1320 and 1325, respectively.

In examples, where only portions of the audio content are stored (e.g., five seconds worth of audio content), the operations at blocks 1410 through 1430 can be repeated. For example, a one minute track can be broken into 12 five-second portions. After each five-second portion of audio content is stored, the second processors(s) 526 can be transitioned to a sleep state. The first processor(s) 524 can process the five-second portion of audio content as described above. After processing or just before processing is finished, the first processor(s) 524 can send an indication to the second processors(s) 526 to indicate that the first processor(s) 524 are ready to process the next portion of the audio content. The second processor(s) 526 can then transition to the awake state, and store the next five-second portion of audio content. This process can repeat until all the portions of the audio content have been processed. These techniques can be used where data storage is at a premium. That is, where the entire length of audio content cannot be effectively stored in the data storage. These techniques can also be used to minimize the delay between when the audio content is received by the one or more playback devices and when the processed audio content is output from the one or more playback devices.

VI. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

It should be appreciated that references to transmitting information to particular components, devices, and/or systems herein should be understood to include transmitting information (e.g., messages, requests, responses) indirectly or directly to the particular components, devices, and/or systems. Thus, the information being transmitted to the particular components, devices, and/or systems may pass through any number of intermediary components, devices, and/or systems prior to reaching its destination. For example, a control device may transmit information to a playback device by first transmitting the information to a computing system that, in turn, transmits the information to the playback device. Further, modifications may be made to the information by the intermediary components, devices, and/or systems. For example, intermediary components, devices, and/or systems may modify a portion of the information, reformat the information, and/or incorporate additional information.

Similarly, references to receiving information from particular components, devices, and/or systems herein should be understood to include receiving information (e.g., messages, requests, responses) indirectly or directly from the particular components, devices, and/or systems. Thus, the information being received from the particular components, devices, and/or systems may pass through any number of intermediary components, devices, and/or systems prior to being received. For example, a control device may receive information from a playback device indirectly by receiving information from a cloud server that originated from the playback device. Further, modifications may be made to the information by the intermediary components, devices, and/or systems. For example, intermediary components, devices, and/or systems may modify a portion of the information, reformat the information, and/or incorporate additional information.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

VII. Example Features (Feature 1) A playback device comprising: one or more amplifiers configured to drive one or more speakers; one or more network interface components; a plurality of processing components comprising: one or more first processors configured to execute at least one real-time operating system (RTOS); one or more second processors configured to execute at least one general-purpose operating system (GPOS), wherein the one or more second processors have a different construction than the one or more first processors, wherein the one or more second processors have a plurality of power states including a first power state and a second power state, wherein the one or more second processors consume more power in the second power state than in the first power state; data storage having stored therein instructions executable by the plurality of processing components to cause the playback device to perform a method comprising: causing, using the one or more first processors, the one or more second processors to transition from the first power state to the second power state; after causing the one or more second processors to transition from the first power state to the second power state, obtaining, using the one or more second processors, first audio content from at least one remote server over a wide area network (WAN) via the one or more network interface components; providing, using the one or more second processors, the one or more first processors access to the first audio content; and playing, using the one or more first processors, the first audio content via the one or more amplifiers.

(Feature 2) The playback device of feature 1, wherein the method further comprises: causing, using the one or more first processors, the second processor to transition from the second power state to the first power state; obtaining, using the one or more first processors, second audio content from a computing device over a personal area network (PAN) via the one or more network components; and playing, using the one or more first processors, the second audio content via the one or more amplifiers.

(Feature 3) The playback device of any of features 1 and 2, wherein the one or more first processors include a processor not configured to support virtual memory and wherein the one or more second processors include a processor configured to support virtual memory.

(Feature 4) The playback device of any of features 1-3, wherein the one or more first processors include at least one general-purpose processor (GPP) and at least one single-purpose processor (SPP).

(Feature 5) The playback device of feature 4, wherein the at least one GPP comprises a reduced instruction set computer (RISC) processor and the at least one SPP comprises a digital signal processor (DSP).

(Feature 6) The playback device of feature any of features 1-5, wherein the GPOS is an operating system based on a LINUX kernel.

(Feature 7) The playback device of any of features 1-6, wherein the data storage comprises: a first memory only directly accessible by the one or more first processors; and a second memory only directly accessible by the one or more second processors.

(Feature 8) The playback device of feature 7, wherein providing the one or more first processors access to the first audio content comprising: transmitting the first audio content from the one or more second processors to the one or more first processors via a communication bus.

(Feature 9) The playback device of any of features 1-6, wherein the data storage comprises a shared memory that is directly accessible by the one or more first processors and the one or more second processors.

(Feature 10) The playback device of feature 9, wherein providing the one or more first processors access to the first audio content comprises: storing, using the one or more second processors, the first audio content in the shared memory.

(Feature 11) The playback device of any of features 1-10, further comprising a rechargeable battery.

(Feature 12) The playback device of any of features 1-11, further comprising a housing configured to be worn about a portion of a subject.

(Feature 13) An Internet-of-Things (IoT) device comprising: an electronic component; one or more network interface components; a plurality of processing components comprising: one or more first processors configured to execute at least one real-time operating system (RTOS); one or more second processors configured to execute at least one general-purpose operating system (GPOS), wherein the one or more second processors have a different construction than the one or more first processors, wherein the one or more second processors have a plurality of power states including a first power state and a second power state, wherein the one or more second processors consume more power in the second power state than in the first power state; data storage having stored therein instructions executable by the plurality of processing components to cause the playback device to perform a method comprising: causing, using the one or more first processors, the one or more second processors to transition from the first power state to the second power state; after causing the one or more second processors to transition from the first power state to the second power state, obtaining, using the one or more second processors, information from at least one server over a wide area network (WAN) via the one or more network interface components; and controlling, using the one or more first processors, operation of the electronic component based on the retrieved information.

(Feature 14) The IoT device of feature 13, wherein the electronic component comprises at least one of: a display, an electric motor, a heating element, a switch, a speaker, a light, or a sensor.

(Feature 15) The IoT device of feature 14, wherein the electronic component is the speaker, wherein the information comprises audio content, and wherein controlling operation of the electronic component comprises driving the speaker to reproduce the audio content.

(Feature 16) The IoT device of feature 14, wherein the electronic component is the sensor and wherein controlling operation of the electronic component based on the information comprises reading at least one sensor value from the sensor.

(Feature 17) A module (e.g., a circuit board assembly) for a playback device, the module comprising: at least one circuit board; one or more internal network interface components attached to the at least one circuit board; a plurality of processing components attached to the at least one circuit board, wherein the plurality of processing components comprises: one or more first processors configured to execute at least one real-time operating system (RTOS); one or more second processors configured to execute at least one general-purpose operating system (GPOS), wherein the one or more second processors have a different construction than the one or more first processors, wherein the one or more second processors have a plurality of power states including a first power state and a second power state, wherein the one or more second processors consume more power in the second power state than in the first power state; data storage attached to the at least one circuit board and having stored therein instructions executable by the plurality of processing components to cause the playback device to perform a method comprising: causing, using the one or more first processors, the one or more second processors to transition from the first power state to the second power state; after causing the one or more second processors to transition from the first power state to the second power state, obtaining, using the one or more second processors, first audio content from at least one remote server over a wide area network (WAN) via the one or more network interface components; providing, using the one or more second processors, the one or more first processors access to the first audio content; and playing, using the one or more first processors, the first audio content via one or more amplifiers configured to drive one or more speakers.

(Feature 18) The module of feature 17, wherein the method further comprises: causing, using the one or more first processors, the second processor to transition from the second power state to the first power state; obtaining, using the one or more first processors, second audio content from a computing device over a personal area network (PAN) via the one or more network components; and playing, using the one or more first processors, the second audio content via the one or more amplifiers.

(Feature 19) The module of any of features 17 and 18, further comprising the one or more amplifiers and wherein the one or more amplifiers are attached to the at least one circuit board.

(Feature 20) The module of any of features 17-19, further comprising one or more power components attached to the at least one circuit board, wherein the one or more power components are configured to receive power from a power source and distribute power to at least the plurality of processing components.

(Feature 21) The module of any of features 17-20, wherein the one or more first processors are integrated into a first circuit die that is attached to the at least one circuit board and wherein the one or more second processors are integrated into a second circuit die that is separate from the first circuit die and attached to the at least one circuit board.

(Feature 22) The module of any of features 17-20, wherein the one or more first processors and the one or more second processors are integrated into a single circuit die that is attached to the at least one circuit board the at least one circuit board.

(Feature 23) A headphone device comprising: at least one earpiece; one or more amplifiers configured to drive one or more speakers; one or more network interface components configured to facilitate communication over at least one data network; at least one processor; at least one non-transitory computer-readable medium comprising program instructions that are executable by the at least one processor such that the headphone assembly is configured to: receive, using the one or more network interface components, first audio content and first metadata associated with the first audio content from at least one playback device; receive, using the one or more network interface components, second audio content and second metadata associated with the second audio content from the at least one playback device; based on at least one of the first metadata or the second metadata, generate, using the at least one processor, mixed audio content that comprises at least some of the first audio content and at least some of the second audio content; and play back, using the one or more first processors and the one or more audio amplifiers, the mixed audio content.

(Feature 24) The headphone device of feature 23, wherein the first audio content and the first metadata associated with the first audio content is received from a first playback device and wherein the second audio content and the second metadata associated with the second audio content is received from a second playback device that is different from the first playback device.

(Feature 25) The headphone device of features 23, wherein the first audio content, the first metadata associated with the first audio content, the second audio content, and the second metadata associated with the second audio content are all received from a single playback device.

(Feature 26) The headphone device of any of features 23-25, wherein the at least one processor does not comprise an application processor (e.g., a processor capable of executing a general-purpose operating system (GPOS) that supports memory virtualization).

(Feature 27) The headphone device of any of features 23-26, wherein the at least one processors comprises a digital signal processor (DSP).

(Feature 28) The headphone device of any of feature 23-27, wherein the headphone device comprises at least one microphone and wherein the headphone device is a hearable device configured to play back an amplified version of at least some sound detected using the at least one microphone.

(Feature 29) A playback device comprising: one or more amplifiers configured to drive one or more speakers; one or more network interface components configured to facilitate communication over at least one data network; at least one processor; and at least one non-transitory computer-readable medium comprising program instructions that are executable by the at least one processor such that the headphone assembly is configured to: receive, using the one or more network interface components, first audio content from at least one cloud server via at least one first network (e.g., a WLAN); generate first metadata associated with the first audio content based on the first audio content; and transmit, using the one or more network interface components, the first audio content and the first metadata associated with the first audio content to at least one first playback device via at least one second network (e.g., a PAN) that is different from the at least one first network.

(Feature 30) The playback device of feature 29, wherein the first audio content and the first metadata associated with the first audio content are transmitted without the playback device playing back the first audio content.

(Feature 31) The playback device of any of features 29-30, wherein the program instructions that are executable by the at least one processor such that the playback device is configured to: generate second metadata associated with the first audio content (e.g., that may be different from the first metadata); and transmit the first audio content and the second metadata associated with the first audio content to at least one second playback device via the at least one first network.

(Feature 32) The playback device of feature 31, wherein the at least one first playback device comprises a headphone device and wherein the at least one second playback device comprises a stationary playback device.

(Feature 33) The playback device of any of features 29 and 31-32, wherein the program instructions that are executable by the at least one processor such that the playback device is configured to playback the first audio content in synchrony with the at least one first playback device.

(Feature 34) A playback device comprising: one or more amplifiers configured to drive one or more speakers; one or more network interface components configured to facilitate communication over at least one data network; a plurality of processing components comprising: one or more first processors; and one or more second processors having a different construction than the one or more first processors, wherein the one or more second processors have a plurality of power states including a first power state (e.g., an awake state) and a second power state (e.g., a sleep state such as a light sleep state or a deep sleep state), wherein the one or more second processors consume more power in the first power state than in the second power state; at least one non-transitory computer-readable medium comprising program instructions that are executable by the plurality of processing components such that the playback device is configured to: while the one or more second processors are in the second power state, (i) receive, using the one or more network interface components, audio content from a user device via a first network, (ii) play back, using the one or more first processors and the one or more amplifiers, the audio content, and (iii) detect that a connection to a second network can be established; after detection that the connection to the second network can be established, (i) cause the one or more second processors to transition from the second power state to the first power state, and (ii) establish a connection to the second network; and while the one or more second processors are in the first power state and the playback device is connected to the second network, (i) receive, using the one or more network interface components, second audio content from at least one remote computing device, and (ii) play back, using the one or more second processors and the one or more amplifiers, the second audio content.

(Feature 35) The playback device according to feature 34, wherein the second network corresponds to an Institute of Electrical and Electronics Engineers (IEEE) 802.11 based network, and wherein the program instructions that are executable by the plurality of processing components such that the playback device is configured to detect that a connection to the second network can be established comprises program instructions that are executable by the plurality of processing components such that the playback device is configured to: detect a service set identifier (SSID) associated with the second network matches a predetermined SSID.

(Feature 36) The playback device according to any one of features 34-35, wherein the at least one non-transitory computer-readable medium further comprises program instructions that are executable by the plurality of processing components such that the playback device is configured to: detect that the connection to the second network has been lost; and after detection that the connection to the second network has been lost, cause the one or more second processors to transition from the first power state to the second power state.

(Feature 37) The playback device according to any one of features 34-36, wherein the at least one non-transitory computer-readable medium further comprises program instructions that are executable by the plurality of processing components such that the playback device is configured to: before receipt of the audio content from the user device, (i) initialize the one or more second processors and (ii) communicate, using the one or more second processors, initialization instruction code to the one or more first processors to facilitate initialization of the one or more first processors.

(Feature 38) The playback device according to any one of features 34-37, wherein the at least one non-transitory computer-readable medium further comprises program instructions that are executable by the plurality of processing components such that the playback device is configured to: cause the one or more second processors to transition to the second power state after a predetermined amount of time of inactivity.

(Feature 39) The playback device according to any one of features 34-38, wherein the at least one non-transitory computer-readable medium further comprises program instructions that are executable by the plurality of processing components such that the playback device is configured to:

after the one or more second processors transition to the second power state, cause the one or more first processors to transition to a low power state after a predetermined amount of time of inactivity.

(Feature 40) The playback device according to any one of features 34-39, wherein the first network corresponds to a BLUETOOTH network.

(Feature 41) The playback device according to any one of features 34-40, wherein the program instructions that are executable by the plurality of processing components such that the playback device is configured to play back the second audio content comprises program instructions that are executable by the plurality of processing components such that the playback device is configured to: play back the second audio content using the one or more first processors, the one or more second processors, and the one or more amplifiers.

(Feature 42) The playback device according to any one of features 34-41, wherein the playback device includes a rechargeable battery, and wherein the at least one non-transitory computer-readable medium further comprises program instructions that are executable by the plurality of processing components such that the playback device is configured to: while the rechargeable battery is being recharged, cause the one or more second processors to transition to the second power state.

(Feature 43) The playback device according to any one of features 34-42, wherein the playback device comprises a control area configured to receive a user control indication, and wherein the at least one non-transitory computer-readable medium further comprises program instructions that are executable by the plurality of processing components such that the playback device is configured to: after receipt of a user control indication, cause the one or more second processors to transition to the first power state.

(Feature 44) The playback device according to any one of features 34-43, wherein the playback device is a headphone device and further comprises at least one earpiece.

(Feature 45) The playback device according to feature 44, wherein the headphone device comprises at least one microphone and wherein the headphone device is a hearable device configured to play back an amplified version of at least some sound detected using the at least one microphone.

(Feature 46) The playback device according to any one of feature 34-45, wherein the playback device is a screenless playback device that does not comprise a display screen.

(Feature 47) The playback device according to any one of features 34-46, wherein the one or more second processors comprise an application processor and/or wherein the one or more first processors do not comprise an application processor.

(Feature 48) A playback device comprising: one or more amplifiers configured to drive one or more speakers; one or more network interface components configured to facilitate communication over at least one data network; a plurality of processing components comprising: one or more first processors; and one or more second processors having a different construction than the one or more first processors; at least one non-transitory computer-readable medium comprising program instructions that are executable by the plurality of processing components such that the playback device is configured to: receive, using the one or more network interface components, audio information that comprises at least first audio content; generate, using the one or more second processors, at least first metadata associated with the first audio content; communicate, using the one or more second processors, the first audio content and the first metadata to the one or more first processors; and play back, using the one or more first processors and the one or more audio amplifiers, the first audio content based on the first metadata.

(Feature 49) The playback device according to feature 48, wherein the first metadata specifies one or more of: normalization information or a codec associated with the first audio content.

(Feature 50) The playback device according to feature 49, wherein the first metadata specified the codec associated with the first audio content, and wherein the program instructions that are executable by the plurality of processing components such that the playback device is configured to play back the first audio content based on the first metadata comprises program instructions that are executable by the plurality of processing components such that the playback device is configured to: decode the first audio content using the codec identified in the first metadata associated with the first audio content.

(Feature 51) The playback device according to any one of features 48-50, wherein the first metadata specifies a presentation time at which the first audio content is to be played back by the playback device to facilitate playing the first audio content in synchrony with other playback devices.

(Feature 52) The playback device according to any one of features 48-51, wherein the program instructions that are executable by the plurality of processing components such that the playback device is configured to communicate the first audio content and the first metadata to the one or more first processors comprises program instructions that are executable by the plurality of processing components such that the playback device is configured to: store, using the one or more second processors, portions of the first audio content and first metadata associated with the portions of the first audio content to data storage of the playback device; and read, using the one or more first processors, the portions of the first audio content and the first metadata associated with the portions of the first audio content from the data storage for playback via the one or more amplifiers.

(Feature 53) The playback device according to any one of features 48-52, wherein the program instructions that are executable by the plurality of processing components such that the playback device is configured to communicate the first audio content and the first metadata to the one or more first processors comprises program instructions that are executable by the plurality of processing components such that the playback device is configured to: store, using the one or more second processors, an entire length of audio content associated with the first audio content and first metadata associated with the entire length of the first audio content to data storage of the playback device; transition the one or more second processors to a low power state; and read (e.g., at least in part while the one or more second processors are in the low power state), using the one or more first processors, the entire length of the first audio content and corresponding first metadata associated with the first audio content from the data storage for playback via the one or more amplifiers.

(Feature 54) The playback device according to any one of features 48-53, wherein the audio information comprises second audio content, and wherein the at least one non-transitory computer-readable medium further comprises program instructions that are executable by the plurality of processing components such that the playback device is configured to: generate, by the one or more second processors, second metadata associated with the second audio content; combine the first audio content, the first metadata, the second audio content, and the second metadata into a data stream; wherein in communicating the first audio content and the first metadata to the one or more first processors, the instructions are executable by the plurality of processing components to cause the playback device to: communicate, using the one or more second processors, the data stream to the one or more first processors.

(Feature 55) The playback device according to feature 54, wherein the data stream comprises a plurality of packets of information, wherein header data for each packet specifies one of the first metadata or the second metadata, and payload data of each packet specifies one of a portion of the first audio content or a portion of the second audio content that corresponds to the first metadata or the second metadata specified in the header data.

(Feature 56) The playback device according to feature 55, wherein the at least one non-transitory computer-readable medium further comprises program instructions that are executable by the plurality of processing components such that the playback device is configured to: process, by the one or more first processors, audio content specified in the payload of each packet according to metadata specified in the header of the packet.

(Feature 57) The playback device according to feature 54, wherein the second audio content is communicated to the playback device in response to a voice command, and wherein the at least one non-transitory computer-readable medium further comprises program instructions that are executable by the plurality of processing components such that the playback device is configured to: receive, by the one or more first processors and via a microphone associated with the playback device, third audio content associated with the voice command; communicate, by the one or more first processors, the third audio content to the one or more second processors; and communicate, by the one or more second processors, the third audio content to a server for processing a command associated with the third audio content.

(Feature 58) The playback device according to any one of features 48-57, wherein the at least one non-transitory computer-readable medium further comprises program instructions that are executable by the plurality of processing components such that the playback device is configured to: adjust, by the one or more first processors, a clock rate associated with processing of the first audio content based on a rate at which the first audio content is communicated to the one or more first processors by the one or more second processors.

(Feature 59) The playback device according to any one of features 48-58, wherein the playback device is a headphone device and further comprises at least one earpiece.

(Feature 60) The playback device according to any one of features 48-59, wherein the headphone device comprises at least one microphone and wherein the headphone device is a hearable device configured to play back an amplified version of at least some sound detected using the at least one microphone.

(Feature 61) The playback device according to any one of features 48-60, wherein the playback device is a screenless playback device that does not comprise a display screen.

(Feature 62) The playback device according to any one of features 48-61, wherein the one or more second processors comprise an application processor and/or wherein the one or more first processors do not comprise an application processor.

(Feature 63) A method performed by a playback device comprising a plurality of processing components including one or more first processors and one or more second processors that have a different construction than the one or more first processors, the method comprising: receiving audio information that comprises at least first audio content; generating, using the one or more second processors, first metadata associated with the first audio content; communicating, using the one or more second processors, the first audio content and the first metadata to the one or more first processors; and playing back, using the one or more first processors, the first audio content based on the first metadata.

(Feature 64) The method according to feature 63, wherein the first metadata specifies one or more of: normalization information or a codec associated with the first audio content.

(Feature 65) The method according to feature 64, wherein the first metadata specified the codec associated with the first audio content, and wherein playing back the first audio content based on the first metadata comprises: decoding the first audio content using the codec specified in the first metadata.

(Feature 66) The method according to any one of features 63-65, wherein the first metadata specifies a presentation time at which the first audio content is to be played back by the playback device to facilitate playback of the first audio content in synchrony with at least one other playback device.

(Feature 67) The method according to any one of features 63-66, wherein communicating the first audio content and the first metadata to the one or more first processors comprises: storing, using the one or more second processors, portions of the first audio content and first metadata associated with the portions of the first audio content to data storage of the playback device; and reading, using the one or more first processors, the portions of the first audio content and the first metadata associated with the portions of the first audio content from the data storage for playback via the one or more amplifiers.

(Feature 68) The method according to any one of features 63-67, wherein communicating the first audio content and the first metadata to the one or more first processors comprises: storing, using the one or more second processors, an entire length of audio content associated with the first audio content and first metadata associated with the entire length of the first audio content to data storage of the playback device; transitioning the one or more second processors to a low power state; and reading, using the one or more first processors, the entire length of the first audio content and corresponding first metadata associated with the first audio content from the data storage for playback via the one or more amplifiers.

(Feature 69) The method according to any one of features 63-68, wherein the audio information comprises second audio content, and wherein the method further comprises: generating, by the one or more second processors, second metadata associated with the second audio content; and combining the first audio content, the first metadata, the second audio content, and the second metadata into a data stream.

(Feature 70) The method according to feature 69, wherein communicating the first audio content and the first metadata to the one or more first processors comprises: communicating, using the one or more second processors, the data stream to the one or more first processors.

(Feature 71) The method according to feature 70, wherein the data stream comprises a plurality of packets of information, wherein header data for each packet specifies one of the first metadata or the second metadata, and payload data of each packet specifies one of a portion of the first audio content or a portion of the second audio content that corresponds to the first metadata or the second metadata specified in the header data.

(Feature 72) The method according to feature 71, further comprising: processing, by the one or more first processors, audio content specified in the payload of each packet according to metadata specified in the header of the packet.

(Feature 73) The method according to feature 69, wherein the second audio content is communicated to the playback device in response to a voice command, and wherein the method further comprises: receiving, by the one or more first processors and via a microphone associated with the playback device, third audio content associated with the voice command; communicating, by the one or more first processors, the third audio content to the one or more second processors; and communicating, by the one or more second processors, the third audio content to a server for processing a command associated with the third audio content.

(Feature 74) The method according to any one of features 63-73, further comprising: adjusting, by the one or more first processors, a clock rate associated with processing of the first audio content based on a rate at which the first audio content is communicated to the one or more first processors by the one or more second processors.

(Feature 75) The method according to any one of features 63-74, wherein the playback device is a headphone device.

(Feature 76) The method according to feature 75, wherein the headphone device is a hearable device and wherein the method further comprises: detecting external sound using at least one microphone; and playing back an amplified version of at least some of the detected external sound.

(Feature 77) The method according to any one of features 63-76, wherein the one or more second processors have a plurality of power states including a first power state and a second power state, wherein the one or more second processors consume more power in the first power state than in the second power state and wherein the method further comprises: while the one or more second processors are in the second power state, (i) receive audio content from a user device, (ii) play back, using the one or more first processors, the audio content, and (iii) detect that a connection to a wireless local area network (WLAN) can be established.

(Feature 78) The method according to feature 77, further comprising: after detection that the connection to the WLAN can be established, (i) cause the one or more second processors to transition from the second power state to the first power state, and (ii) establish a connection to the WLAN.

(Feature 79) The method according to feature 78, further comprising: while the one or more second processors are in the first power state and the playback device is connected to the WLAN, (i) receive second audio content from at least one remote computing device, and (ii) play back, using the one or more second processors and the one or more amplifiers, the second audio content.

(Feature 80) The method according to feature 79, further comprising: detecting that the connection to the WLAN has been lost; and after detecting that the connection to the WLAN has been lost, causing the one or more second processors to transition from the first power state to the second power state.

(Feature 81) One or more non-transitory computer-readable media comprising program instructions that are executable by a plurality of processing components such that a playback device is configured to perform the method of any of features 63-80.

(Feature 82) A playback device comprising: one or more amplifiers configured to drive one or more speakers; one or more network interface components configured to facilitate communication over at least one data network; a plurality of processing components comprising: one or more first processors; and one or more second processors having a different construction than the one or more first processors; and at least one non-transitory computer-readable medium according to feature 81.

(Feature 83) The playback device of feature 82, wherein the one or more second processors comprise an application processor and wherein the one or more first processors do not comprise an application processor.

(Feature 84) A circuit board assembly for a playback device, the circuit board assembly comprising: one or more circuit boards; one or more amplifiers attached to the one or more circuit board, wherein the one or more amplifiers are configured to drive one or more speakers; one or more network interface components configured to facilitate communication over at least one data network; a plurality of processing components attached to the one or more circuit boards, wherein the plurality of processing components comprises: one or more first processors; and one or more second processors having a different construction than the one or more first processors; and at least one non-transitory computer-readable medium according to feature 81.

The invention claimed is:

1. A playback device comprising:
one or more speakers;
one or more amplifiers configured to drive the one or more speakers;
a network interface configured to communicate data over at least one network;
a plurality of processors comprising
one or more first processors, and
one or more second processors having a different construction than the one or more first processors, the one or more second processors having a plurality of power states including a first power state and a second power state, the one or more second processors being configured to consume more power in the first power state than in the second power state; and
at least one non-transitory computer-readable medium comprising program instructions that are executable by the plurality of processors such that the playback device is configured to
while the one or more second processors are in the second power state,
receive, using the network interface, first audio content from a user device via a first network,
play back, using the one or more first processors and the one or more amplifiers, the first audio content, and
detect that a connection to a second network can be established,
after detection that the connection to the second network can be established,
cause the one or more second processors to transition from the second power state to the first power state, and
establish the connection to the second network, and
while the one or more second processors are in the first power state and the playback device is connected to the second network,
receive, using the network interface, second audio content from at least one remote computing device, and play back, using the one or more second processors and the one or more amplifiers, the second audio content.

2. The playback device of claim 1, wherein the first power state comprises an awake state.

3. The playback device of claim 1, wherein the second power state comprises at least one sleep state.

4. The playback device of claim 3, wherein the at least one sleep state comprises one or more of a light sleep state or a deep sleep state.

5. The playback device of claim 1, wherein the network interface comprises a plurality of components.

6. The playback device of claim 1, wherein:
the second network corresponds to an Institute of Electrical and Electronics Engineers (IEEE) 802.11 based network, and
wherein the at least one non-transitory computer-readable medium further comprises program instructions that are executable by the plurality of processors such that the playback device is configured to
detect a service set identifier (SSID) associated with the second network, and
determine that the SSID matches a predetermined SSID.

7. The playback device of claim 1, wherein the at least one non-transitory computer-readable medium further comprises program instructions that are executable by the plurality of processors such that the playback device is configured to:
detect that the connection to the second network is lost; and
after detection that the connection to the second network is lost, cause the one or more second processors to transition from the first power state to the second power state.

8. The playback device of claim 1, wherein the at least one non-transitory computer-readable medium further comprises program instructions that are executable by the plurality of processors such that the playback device is configured to:
before receipt of the first audio content from the user device,
initialize the one or more second processors, and
communicate, using the one or more second processors, initialization instruction code to the one or more first processors to initialize the one or more first processors.

9. The playback device of claim 1, wherein the at least one non-transitory computer-readable medium further comprises program instructions that are executable by the plurality of processors such that the playback device is configured to cause the one or more second processors to transition to the second power state after a predetermined amount of time of inactivity.

10. The playback device of claim 1, wherein the at least one non-transitory computer-readable medium further comprises program instructions that are executable by the plurality of processors such that the playback device is configured to, after the one or more second processors transition to the second power state, cause the one or more first processors to transition to a low power state after a predetermined amount of time of inactivity.

11. The playback device of claim 1, wherein the first network corresponds to a BLUETOOTH network.

12. The playback device of claim 1, wherein the at least one non-transitory computer-readable medium further comprises program instructions that are executable by the plurality of processors such that the playback device is configured to play back the second audio content using the one or more first processors, the one or more second processors, and the one or more amplifiers.

13. The playback device of claim 1, wherein:
the playback device comprises a rechargeable battery, and
the at least one non-transitory computer-readable medium further comprises program instructions that are executable by the plurality of processors such that the playback device is configured to while the rechargeable battery is being recharged, cause the one or more second processors to transition to the second power state.

14. The playback device of claim 1, wherein:
the playback device comprises a control area configured to receive a user control indication, and
the at least one non-transitory computer-readable medium further comprises program instructions that are executable by the plurality of processors such that the playback device is configured to after receipt of a user control indication, cause the one or more second processors to transition to the first power state.

15. The playback device of claim 1, wherein:
the playback device is a headphone device, and
the playback device further comprises at least one earpiece.

16. The playback device of claim 15, wherein:
the headphone device comprises at least one microphone, and
the headphone device is a hearable device configured to play back an amplified version of at least some sound detected using the at least one microphone.

17. The playback device of claim 1, wherein the playback device is a screenless playback device that does not comprise a display screen.

18. The playback device of claim 1, further comprising an application processor disposed within the one or more second processors.

19. The playback device of claim 1, wherein the one or more first processors comprise processors other than an application processor.

20. A method of playing back audio using a playback device, the method comprising:
while one or more second processors of the playback device are in a second power state,
receiving, using a network interface of the playback device, first audio content from a user device via a first network,
playing back, using one or more amplifiers of the playback device and one or more first processors of the playback device distinct from the one or more second processors, the first audio content, and
detecting that a connection to a second network can be established;
after detecting that the connection to the second network can be established,
causing the one or more second processors to transition from the second power state to a first power state in which the one or more second processors consume more power, and
establishing the connection to the second network; and
while the one or more second processors are in the first power state and the playback device is connected to the second network,
receiving, using the network interface, second audio content from at least one remote computing device, and playing back, using the one or more second processors and the one or more amplifiers, the second audio content.

21. A non-transitory computer readable medium storing instructions executable by one or more processors to cause a playback device to play back audio, the instructions comprising instructions to:
- while one or more second processors of the playback device are in a second power state,
  - receive, using a network interface of the playback device, first audio content from a user device via a first network,
  - play back, using one or more amplifiers of the playback device and one or more first processors of the playback device distinct from the one or more second processors, the first audio content, and
  - detect that a connection to a second network can be established;
- after detecting that the connection to the second network can be established,
  - cause the one or more second processors to transition from the second power state to a first power state in which the one or more second processors consume more power, and
  - establish the connection to the second network; and
- while the one or more second processors are in the first power state and the playback device is connected to the second network,
  - receive, using the network interface, second audio content from at least one remote computing device, and
  - play back, using the one or more second processors and the one or more amplifiers, the second audio content.

* * * * *